(12) United States Patent
Sample et al.

(10) Patent No.: US 6,377,912 B1
(45) Date of Patent: *Apr. 23, 2002

(54) EMULATION SYSTEM WITH TIME-MULTIPLEXED INTERCONNECT

(75) Inventors: Stephen P. Sample, Saratoga; Mikhail Bershteyn, Campbell; Michael R. Butts, Portland; Jerry R. Bauer, Cupertino, all of CA (US)

(73) Assignee: Quickturn Design Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/374,444

(22) Filed: Aug. 13, 1999

Related U.S. Application Data

(63) Continuation of application No. 08/865,741, filed on May 30, 1997, now Pat. No. 5,960,191.

(51) Int. Cl.[7] .............................................. G06F 9/455
(52) U.S. Cl. ............................................. 703/28; 716/1
(58) Field of Search .............................. 703/13, 24, 25, 703/26, 27, 28; 716/1, 5, 17

(56) References Cited

U.S. PATENT DOCUMENTS

| | | | |
|---|---|---|---|
| 3,106,698 A | 10/1963 | Unger | 340/172.5 |
| 3,287,702 A | 11/1966 | Borck, Jr. et al. | 340/172.5 |
| 3,287,703 A | 11/1966 | Slotnick | 340/172.5 |
| 3,473,160 A | 10/1969 | Wahlstrom | 340/172.5 |
| 3,928,730 A | 12/1975 | Agaard et al. | 179/18 |
| 4,020,469 A | 4/1977 | Manning | 340/172.5 |
| 4,032,899 A | 6/1977 | Jenny et al. | 364/200 |
| 4,306,286 A | 12/1981 | Cocke et al. | 364/200 |
| 4,315,315 A | 2/1982 | Kossiakoff | 364/300 |
| 4,357,678 A | 11/1982 | Davis | 364/900 |
| 4,386,403 A | 5/1983 | Hsieh et al. | 364/300 |
| 4,404,635 A | 9/1983 | Flaker | 364/481 |
| 4,459,694 A | 7/1984 | Ueno et al. | 371/21 |
| 4,488,354 A | 12/1984 | Chan et al. | 29/830 |
| 4,503,386 A | 3/1985 | DasGupta et al. | 324/73 |
| 4,510,602 A | 4/1985 | Engdahl et al. | 371/21 |
| 4,524,240 A | 6/1985 | Stock et al. | 174/685 |
| 4,525,789 A | 7/1985 | Kemper et al. | 364/481 |
| 4,527,115 A | 7/1985 | Mehrotra et al. | 324/73 |
| 4,539,564 A | 9/1985 | Smithson | 340/825.79 |
| 4,541,071 A | 9/1985 | Ohmori | 364/900 |

(List continued on next page.)

FOREIGN PATENT DOCUMENTS

| | | | | |
|---|---|---|---|---|
| EP | 0217291 A2 | 4/1987 | | G06F/15/60 |
| EP | 0453171 A2 | 10/1991 | | G06F/1/04 |
| GB | 1444084 | 9/1973 | | H03K/19/00 |

(List continued on next page.)

OTHER PUBLICATIONS

Hennessy, "Partitioning Programmable Logic Arrays Summary," Computer Systems Laboratory, Stanford University, undated, pp. 180–181.

(List continued on next page.)

Primary Examiner—Kevin J. Teska
Assistant Examiner—Samuel Broda
(74) Attorney, Agent, or Firm—Lyon & Lyon LLP

(57) ABSTRACT

A hardware emulation system is disclosed which reduces hardware cost by time-multiplexing multiple design signals onto physical logic chip pins and printed circuit board. The reconfigurable logic system of the present invention comprises a plurality of reprogrammable logic devices, and a plurality of reprogrammable interconnect devices. The logic devices and interconnect devices are interconnected together such that multiple design signals share common pins and circuit board traces. A logic analyzer for a hardware emulation system is also disclosed. The logic circuits necessary for executing logic analyzer functions is programmed into the programmable resources in the logic chips of the emulation system.

45 Claims, 30 Drawing Sheets

U.S. PATENT DOCUMENTS

| | | | | |
|---|---|---|---|---|
| 4,577,276 | A | 3/1986 | Dunlop et al. | 364/491 |
| 4,578,761 | A | 3/1986 | Gray | 364/481 |
| 4,593,363 | A | 6/1986 | Burstein et al. | 364/491 |
| 4,600,846 | A | 7/1986 | Burrows | 307/465 |
| 4,612,618 | A | 9/1986 | Pryor et al. | 364/490 |
| 4,613,940 | A | 9/1986 | Shenton et al. | 364/490 |
| 4,621,339 | A | 11/1986 | Wagner et al. | 364/900 |
| 4,642,487 | A | 2/1987 | Carter | 307/465 |
| 4,656,580 | A | 4/1987 | Hitchcock, Sr. et al. | 364/200 |
| 4,656,592 | A | 4/1987 | Spaanenburg et al. | 364/490 |
| 4,674,089 | A | 6/1987 | Poret et al. | 371/25 |
| 4,675,832 | A | 6/1987 | Robinson et al. | 364/521 |
| 4,695,740 | A | 9/1987 | Carter | |
| 4,695,950 | A | 9/1987 | Brandt et al. | 364/200 |
| 4,695,999 | A | 9/1987 | Lebizay | 370/58 |
| 4,697,241 | A | 9/1987 | Lavi | 364/488 |
| 4,700,187 | A | 10/1987 | Furtek | 340/825.83 |
| 4,706,216 | A | 11/1987 | Carter | 365/94 |
| 4,713,557 | A | 12/1987 | Carter | 307/242 |
| 4,722,084 | A | 1/1988 | Morton | 371/9 |
| 4,725,835 | A | 2/1988 | Schreiner et al. | 340/825.83 |
| 4,736,338 | A | 4/1988 | Saxe et al. | 364/900 |
| 4,740,919 | A | 4/1988 | Elmer | 365/104 |
| 4,744,084 | A | 5/1988 | Beck et al. | 371/23 |
| 4,747,102 | A | 5/1988 | Funatsu | 371/23 |
| 4,752,887 | A | 6/1988 | Kuwahara | 364/491 |
| 4,758,745 | A | 7/1988 | El Gamal et al. | 307/465 |
| 4,758,985 | A | 7/1988 | Carter | 365/94 |
| 4,761,768 | A | 8/1988 | Turner et al. | 365/201 |
| 4,766,569 | A | 8/1988 | Turner et al. | 365/185 |
| 4,768,196 | A | 8/1988 | Jou et al. | 371/25 |
| 4,777,606 | A | 10/1988 | Fournier | 364/491 |
| 4,782,440 | A | 11/1988 | Nomizu et al. | 364/200 |
| 4,786,904 | A | 11/1988 | Graham III et al. | 340/825.83 |
| 4,787,061 | A | 11/1988 | Nei et al. | 364/900 |
| 4,787,062 | A | 11/1988 | Nei et al. | 364/900 |
| 4,791,602 | A | 12/1988 | Resnick | 364/900 |
| 4,803,636 | A | 2/1989 | Nishiyama et al. | 364/491 |
| 4,811,214 | A | 3/1989 | Nosenchuck et al. | 364/200 |
| 4,815,003 | A | 3/1989 | Putatunda et al. | 364/491 |
| 4,823,276 | A | 4/1989 | Hiwatashi | 364/491 |
| 4,827,427 | A | 5/1989 | Hyduke | 364/489 |
| 4,829,202 | A | 5/1989 | Austin | 307/465 |
| 4,835,705 | A | 5/1989 | Fujino et al. | 364/491 |
| 4,845,633 | A | 7/1989 | Furtek | 364/490 |
| 4,849,904 | A | 7/1989 | Aipperspach et al. | 364/489 |
| 4,849,928 | A | 7/1989 | Hauck | 364/900 |
| 4,854,039 | A | 8/1989 | Wendt | 29/832 |
| 4,855,669 | A | 8/1989 | Mahoney | 324/73 |
| 4,862,347 | A | 8/1989 | Rudy | 364/200 |
| 4,864,165 | A | 9/1989 | Hoberman et al. | 307/467 |
| 4,868,419 | A | 9/1989 | Austin | 307/440 |
| 4,870,302 | A | 9/1989 | Freeman | 307/465 |
| 4,873,459 | A | 10/1989 | El Gamal et al. | 307/465 |
| 4,876,466 | A | 10/1989 | Kondou et al. | 307/465 |
| 4,882,690 | A | 11/1989 | Shinsha et al. | 364/490 |
| 4,901,259 | A | 2/1990 | Watkins | 364/578 |
| 4,901,260 | A | 2/1990 | Lubachevsky | 364/578 |
| 4,908,772 | A | 3/1990 | Chi | 364/491 |
| 4,914,612 | A | 4/1990 | Beece et al. | 364/578 |
| 4,918,440 | A | 4/1990 | Furtek | 340/825.83 |
| 4,918,594 | A | 4/1990 | Onizuka | 364/208 |
| 4,922,432 | A | 5/1990 | Kobayashi et al. | 364/490 |
| 4,924,429 | A | 5/1990 | Kurashita et al. | 364/578 |
| 4,931,946 | A | 6/1990 | Ravindra et al. | 364/490 |
| 4,935,734 | A | 6/1990 | Austin | 340/825.83 |
| 4,937,827 | A | 6/1990 | Beck et al. | 371/23 |
| 4,942,536 | A | 7/1990 | Watanabe et al. | 364/490 |
| 4,942,615 | A | 7/1990 | Hirose | 364/578 |
| 4,945,503 | A | 7/1990 | Takasaki | 364/578 |
| 4,949,275 | A | 8/1990 | Nonaka | 364/490 |
| 4,951,220 | A | 8/1990 | Ramacher et al. | 364/488 |
| 4,958,324 | A | 9/1990 | Devin | 365/201 |
| 4,965,739 | A | 10/1990 | Ng | 364/491 |
| 4,972,372 | A | 11/1990 | Ueno | 365/201 |
| 5,003,487 | A | 3/1991 | Drumm et al. | 364/489 |
| 5,023,775 | A | 6/1991 | Poret | 364/200 |
| 5,036,473 | A | 7/1991 | Butts et al. | 364/489 |
| 5,041,986 | A | 8/1991 | Tanishita | 364/489 |
| 5,046,017 | A | 9/1991 | Yuyama et al. | 364/491 |
| 5,051,938 | A | 9/1991 | Hyduke | 364/578 |
| 5,053,980 | A | 10/1991 | Kanazawa | 364/578 |
| 5,081,602 | A | 1/1992 | Glover | 364/578 |
| 5,083,083 | A | 1/1992 | El-Ayat et al. | 324/158 |
| 5,084,824 | A | 1/1992 | Lam et al. | 364/490 |
| 5,093,920 | A | 3/1992 | Agrawal et al. | 395/800 |
| 5,109,353 | A | 4/1992 | Sample et al. | 364/578 |
| 5,126,966 | A | 6/1992 | Hafeman et al. | 364/500 |
| 5,128,871 | A | 7/1992 | Schmitz | 364/490 |
| 5,140,526 | A | 8/1992 | McDermith et al. | 364/488 |
| 5,172,011 | A | 12/1992 | Leuthold et al. | 307/272.2 |
| 5,224,055 | A | 6/1993 | Grundy et al. | 364/488 |
| 5,224,056 | A | 6/1993 | Chene et al. | 364/490 |
| 5,231,588 | A | 7/1993 | Agrawal et al. | 364/489 |
| 5,231,589 | A | 7/1993 | Itoh et al. | 364/490 |
| 5,233,539 | A | 8/1993 | Agrawal et al. | 364/489 |
| 5,253,363 | A | 10/1993 | Hyman | 395/800 |
| 5,259,006 | A | 11/1993 | Price et al. | 375/107 |
| 5,329,470 | A | 7/1994 | Sample et al. | 364/578 |
| 5,329,471 | A | 7/1994 | Swoboda et al. | 364/578 |
| 5,339,262 | A | 8/1994 | Rostoker et al. | |
| 5,352,123 | A | 10/1994 | Sample et al. | 439/61 |
| 5,386,550 | A | 1/1995 | Yumioka et al. | 395/575 |
| 5,425,036 | A | 6/1995 | Lui et al. | 371/23 |
| 5,448,496 | A | 9/1995 | Butts et al. | 364/489 |
| 5,448,522 | A | 9/1995 | Huang | 365/189.04 |
| 5,452,231 | A | 9/1995 | Butts et al. | 364/489 |
| 5,452,239 | A | 9/1995 | Dai et al. | 364/578 |
| 5,475,830 | A | 12/1995 | Chen et al. | 395/500 |
| 5,477,475 | A | 12/1995 | Sample et al. | 364/578 |
| 5,483,178 | A | * 1/1996 | Costello et al. | 326/41 |
| 5,544,069 | A | 8/1996 | Mohsen | 364/489 |
| 5,563,829 | A | 10/1996 | Huang | 365/189.04 |
| 5,574,388 | A | 11/1996 | Barbier et al. | 326/41 |
| 5,596,742 | A | 1/1997 | Agrawal et al. | 395/500 |
| 5,612,891 | A | 3/1997 | Butts et al. | 364/489 |
| 5,673,276 | A | * 9/1997 | Jarwala et al. | 714/727 |
| 5,754,827 | A | * 5/1998 | Barbier et al. | 703/14 |
| 5,960,191 | A | * 9/1999 | Sample et al. | 703/28 |

FOREIGN PATENT DOCUMENTS

| | | | | |
|---|---|---|---|---|
| GB | 2180382 A | 3/1987 | | H03K/19/00 |
| GB | 2182220 A | 5/1987 | | H03K/17/687 |
| JP | 58-147236 | 9/1983 | | H03K/19/177 |
| JP | 58-147237 | 9/1983 | | H03K/19/177 |
| JP | 58-205870 | 11/1983 | | G01R/31/28 |
| JP | 59-161839 | 9/1984 | | H01L/21/82 |
| JP | 01-154251 | 6/1989 | | G06F/11/26 |
| WO | WO96/13902 | 5/1996 | | H03K/19/173 |

OTHER PUBLICATIONS

"Plus Logic FPGA 2020 Field Programmable Gate Array," Brochure by Plus Logic, San Jose, CA, undated, pp. 1–13.

Wirbel, "Plus Logic Rethinks PLD Approach," Newspaper Article, undated, one page.

Minnick, "A Programmable Cellular Array," undated, pp. 25–26.

Shoup, "Programmable Cellular Logic," Xerox Corp., Palo Alto Research Center, Palo Alto, CA, undated, pp. 27–28.

Schweikert, et al., "A Proper Model for the Partitioning of Electrical Circuits," Bell Telephone Laboratories, Inc., Murray Hill, New Jersey, undated, pp. 57–62.

Ayres, "Silicon Compilation–A Hierarchical Use of PLAs," Xerox Corp., El Segundo, CA, undated, pp. 314–326.

De Micheli, et al., "Topological Partitioning of Programmable Logic Arrays," Department of Electrical Engineering and Computer Science, University of California at Berkeley, undated, pp. 182–183.

Clos, "A Study of Non–Blocking Switching Networks", The Bell System Technical Journal, vol. XXXII, Mar. 1953, pp. 126–144.

Minnick, "Cutpoint Cellular Logic," IEEE Transactions on Electronic Computers, Dec. 1964, pp. 685–698.

Spandorfer, "Synthesis of Logic Functions on an Array of Integrated Circuits," Contract Report AFCRL–66–298, Univac Division of Sperry Rand Corp., Blue Bell, PA, Oct. 31, 1965.

Minnick, "Survey of Microcellular Research," Stanford Research Institute, Contract Report AFCRL–66–475, Jul. 1966.

Kautz, et al., "Cellular Interconnection Arrays," IEEE Transactions on Computers, vol. C–17, No. 5, May 1968, pp. 443–451.

Kautz, "Cellular Logic–in–Memory Arrays," IEEE Transaction on Computers, vol. C–18, No. 8, Aug. 1969, pp. 719–727.

Shoup, "Programmable Cellular Logic Arrays," Doctoral Thesis, Carnegie–Mellon University, DARPA Contract No. F44620–67–C0058, Mar. 1970.

Manning, "Automatic Test, Configuration, And Repair of Cellular Arrays," Doctoral Thesis MAC TR–151, MIT, Jun. 1975, pp. 1–243.

Horstmann, "Macro Test Circuit Generation," IBM Technical Disclosure Bulletin, vol. 18, No. 12, May 1976, pp. 4023–4029.

Manning, "An Approach to Highly Integrated, Computer-Maintained Cellular Arrays," IEEE Transaction on Computers, vol. C–26, No. 6, Jun. 1977, pp. 536–552.

Masson, et al., "A Sampler of Circuit Switching Networks," Computer, Jun. 1979, pp. 145–161.

Anderson, "Restructurable VLSI Program," Semiannual Technical Summary Report to the Defense Advanced Research Projects Agency, Report No. ESD–TR–80–192, Darpa Contract No. F19628–80–C–0002, Mar. 31, 1980.

Snyder, "Introduction to the Configurable, Highly Parallel Computer," Report CSD–TR–351, Office of Naval Research Contracts N00014–80–K–0816 and N00014–81–K–0360, Nov. 1980.

"Switching Networks and Traffic Concepts," Chapter 36, Reference Data for Radio Engieers, Howard W. Sams & Co., 1981, pp. 36–1 to 36–16.

Payne, "Automated Partitioning of Hierarchically Specificed Digital Systems," May 1981, pp. 1–132.

Preparata, et al., "The Cube–Connected Cycles: A Versatile Network for Parallel Computation," Communications of the ACM, vol. 24, No. 5, May 1981, pp. 300–309.

Feng, "A Survey of Interconnection Networks," Computer, Dec. 1981, pp. 12–27.

Kung, "Why Systolic Architectures?," Computer, Jan. 1982, pp. 37–46.

Pfister, "The Yorktown Simulation Engine: Introduction," $19^{th}$ Design Automation Conference Proceedings, Paper 7.1, Jun. 14–16, 1982, pp. 51–54.

Denneau, "The Yorktown Simulation Engine," $19^{th}$ Design Automation Conference Proceedings, Paper 7.2, Jun. 14–16, 1982, pp. 55–59.

Krondstadt, et al., "Software Support for the Yorktown Simulation Engine," $19^{th}$ Design Automation Conference Proceedings, Paper 7.3, Jun. 14–16, 1982, pp. 60–64.

Abramovici, et al., "A Logic Simulation Machine," $19^{th}$ Design Automation Conference Proceedings, Paper 7.4, Jun. 14–16, 1982, pp. 65–73.

Fiduccia, et al., "A Linear–Time Heuristics for Improving Network Partitions," $19^{th}$ Design Automation Conference Proceedings, Paper 13.1, Jun. 14–16, 1982, pp. 175–181.

Hedlund, "Wafer Scale Integration of Parallel Processors," Doctoral Thesis, Office of Naval Research Contracts N00014–80–K–0816 and N00014–81–K–0360, Dec. 1982, pp. 1–248.

Wagner, "The Boolean Vector Machine (BVM)", ACM Sigarch, 1983, pp. 59–66.

Gentile, et al., "Design of Switches for Self–Reconfiguring VLSI Array Structures," Microprocessing and Microprogramming, North Holland, 1984, pp. 99–108.

Sami, et al., "Reconfigurable Architectures for VLSI Processing Arrays," AFIPS Conference Proceeding, 1983 National Computer Conference, May 16–19, 1983, pp. 565–577.

Palesko, "Logic Partitioning for Minimizing Gate Arrays," IEEE Transactions on Computer–Aided Design of Integrated Circuits and Systems, vol. CAD–2, No. 2, Apr. 1983, pp. 117–121.

Dussault, et al., "A High Level Synthesis Tool for MOS Chip Design," $21^{st}$ Design Automation Conference Proceedings, Paper 20.1, 1984, pp. 308–314.

Hedlund, et al., "Systolic Architecture–A Wafer Scale Approach," IEEE, 1984, pp. 604–610.

Dunlop, et al., "A Procedure for Placement of Stadard–Cell VLSI Circuits," IEEE Transactions on Computer Aided Designs, vol. CAD–4, No. 1, Jan. 1985, pp. 92–98.

Siegel, et al., "The Design of a Logic Simulation Accelerator," VLSI Systems Design, Oct. 1985, pp. 76–80.

Koike, "HAL: A High–Speed Logic Simulation Machine," IEEE Design & Test, Oct. 1985, 61–73.

Mott, et al., "The Utility of Hardware Accelerators in the Design Environment," VLSI Systems Design, vol. 6, No. 10, Oct. 1985, pp. 62–70.

"Partitioning of PLA Logic," IBM Technical Disclosure Bulletin, vol. 28, No. 6, Nov. 1985, pp. 2332–2333.

Goossens, et al., "A Computer–Aided Design Methodology for Mapping DSP–Algorithms onto Custom Multiprocessor Architectures," IEEE, 1986, pp. 924–925.

Choi, et al., "Fault Diagnosis of Switches in Wafer–Scale Arrays," IEEE, 1986, pp. 292–295.

Chen, et al., "Fault–Tolerant Wafer Scale Architectures Using Large Crossbar Switch Arrays," excerpt from Jesshope, et al., Wafer Scale Integration, A. Hilger, 1986, pp. 113–124.

Carter, et al., "A User Programmable Reconfigurable Logic Array," IEEE 1986 Custom Integrated Circuits Conference, pp. 233–235.

"The Programmable Gate Array Design Handbook," Xilinx, First Edition, 1986, pp. 1–1 to 4–33.

Donnell, "Crosspoint Switch: A PLD Approach," Digital Design, Jul. 1986, 40–44.

Wynn, "In–Circuit Emulation for ASIC–Based Design," VLSI Systems Design, Oct. 1986, pp. 38–45.

Beresford, "Hard Facts, Soft ASICs," VLSI Systems Design, Dec. 1986, pp. 8.

"Gate Station Reference Manual," Mentor Graphics, Corp., excerpts, 1987.

"Gate Station User's Manual," Mentor Graphics, Corp., excerpts, 1987.

"The Homogeneous Computational Medium: new Technology for computation," Concurrent Logic, Inc., Jan. 26, 1987, pp. 1–4.

McClure, "PLD Breadboarding of Gate Array Designs," VLSI Systems Desgin, vol. 8, No. 2, Feb. 1987, pp. 36–41.

Chin, et al., "A Dynamically Reconfigurable Interconection Chip," 1987 IEEE International Solid–State Circuits Conference, Digest of Technical Papers, First Edition, Feb. 27, 1987, pp. 276–277, 425.

Trickey, "Flamel: A High–Level Hardware Compiler," IEEE Transaction on Computer–Aided Design, vol. CAD–8, No. 2, Mar. 1987, pp. 259–269.

Shear, "Tools Help You Retain the Advantages of Using Breadboards in Gate–Array Design," EDN, Mar. 18, 1987, pp. 81–88.

Odawara, "Partitioning and Placement Technique for CMOS Gate Arrays," IEEE Transactions on Computer–Aided Design, vol. CAD–6, No. 3, May 1987, pp. 355–363.

Beresford, "An Emulator for CMOS ASICs," VLSI Systems Design, May 4, 1987, pp. 8.

Schmitz, "Emulation of VLSI Devices Using LCAs," VLSI Systems Design, vol. 8, No. 6, May 20, 1987, pp. 54–62.

"Testing Multiple Discrete Software Components by Connecting Real and Simulated Hardware Components," IBM Technical Disclosure Bulletin, vol. 30, No. 4, Sep. 1987, pp. 1844–1845.

McCarthy, "Partitioning Adapts Large State Machines to PLDs," EDN, Sep. 17, 1987, pp. 163–166.

Munoz, et al., "Automatic Partitioning of Programmable Logic Devices," VLSI Systems Design, Oct. 1987, pp. 74–86.

Tham, "Parallel Processing for CAD Applications," IEEE Design & Test of Computers, Oct. 1987, 13–17.

Agrawal, et al., "Mars: A Multiprocessor–Based Programmable Accelerator," IEEE Design & Test of Computers, Oct. 1987, pp. 28–36.

Hou, et al., "A High Level Synthesis Tool for Systolic Designs," IEEE, 1988, pp. 665–673.

"The Programmable Gate Array Data Book," Xilinx, Inc., 1988.

Beece, et al., "The IBM Engineering Verification Engine," $25^{th}$ ACM/IEEE Design Automation Conference, Jun. 12–15, 1988, Paper 17.1, pp. 218–224.

McFarland, et al., "Tutorial on High–Level Synthesis," $25^{th}$ ACM/IEEE Design Automation Conference, Jun. 12–15, 1988, Paper 23.1, pp. 330–336.

Borriello, et al., "High–Level Synthesis: Current Status and Future Directions," $25^{th}$ ACM/IEEE Design Automation Conference, Jun. 12–15, 1988, Paper 32.1, pp. 477–482.

De Micheli, et al., "Hercules–A System for High–Level Synthesis," $25^{th}$ ACM/IEEE Design Automation Conference, Jun. 12–15, 1988, Paper 32.2, pp. 483–488.

Runner, et al., "Synthesizing Ada's Ideal Machine Mate," VLSI Systems Design, Oct. 1988, pp. 30–39.

"ERA60100, Electrically Reconfigurable Array–ERA," Brochure by Plessey Semiconductors, Apr. 1989, pp. 1–16.

Agrawal, et al., "A Hardware Logic Simulation System," IEEE Transactions on Computer–Aided Designs, vol. 9, No. 1, Jan. 1990, pp. 19–29.

Yeh, et al., "A General Purpose Multiple Way Partitioning Algorithm," $28^{th}$ ACM/IEEE Design Automation Conference, Jun. 17–21, 1991, Paper 25.1, pp. 421–426.

Babb, et al., "Virtual Wires: Overcoming Pin Limiations in FPGA–based Logic Emulations," IEEE, 1993, pp. 142–151.

Babb, "Virtual Wires: Overcoming Pin Limitations in FPGA–based Logic Emulations," Masters Thesis, MIT, Department of EEC, Nov. 15, 1993, pp. 142–151; Also available as MIT/LCS Technical Report TR–586.

Dahl, "An Implementation of the Virtual Wires Interconnect Scheme," Masters Thesis, MIT, Department of EEC, Feb. 1994, pp. 1–52; Also available as MIT/LCS Technical Report.

Tessier, et al., "The Virtual Wires Emulation System: A Gate–Efficient ASIC Prototyping Environment," FPGA 1994, $2^{nd}$ International ACM/SIGDA Workshop on Field––Programmable Gate Arrays, Feb. 13–15, 1994.

Dahl, et al., "Emulation of the Sparcle Microprocessor With the MIT Virtual Wires Emulation System," IEEE Workshop on FPGA's for Custom Computing Machines, Apr. 10–13, 1994, pp. 14–22.

Bauer, "The Design of an Efficient Hardware Subroutine Protocol for FPGAs," Masters Thesis, MIT, Department of EEC, May 16, 1994, pp. 1–55; Also available as MIT/LCS Technical Report.

Jones, "A Time–Multiplexed FPGA Architecture for Logic Emulation," Masters Thesis, University of Toronto, Department of EEC, 1995, pp. 1–103.

Hanono, "InnerView Hardware Debugger: A Logic Analysis Tool for the Virtual Wires Emulation System," Masters Thesis, MIT, Department of EEC, Jan. 20, 1995, pp. 1–59; Also available as MIT/LCS Technical Report.

Tessier, "Virtual Wires Pictures," article from webmaster@cag.lcs.mit.edu, Feb. 3, 1995, two pages.

Babb, et al. "More Virtual Wires," article from webmaster@cag.lcs.mit.edu, Feb. 3, 1995, one page.

Ravenscroft, Function Language Extractor and Boolean Generator IEEE 1986, pp. 120–123.

R. Tessier, J. Babb, M. Dahl, S. Hanono and D. Hoki, The Virtual Wires Emulation System: A Gate–Efficient ASIC Prototyping Environment, MIT, Student Workshop on Scalable Computing Jul. 21–22 1994.

Gjump, et al. Microprogrammed Arrays, IEEE Transactions on Computers, vol. C–21, No. 9, Sep. 1972, pp. 974–984.

* cited by examiner

FOUR 2:1 TDM OUTPUTS

FOUR 2:1 TDM INPUTS

EMULATION SYSTEM WITH TIME-MULTIPLEXED INTERCONNECT

This is a continuation of application Ser. No. 08/865,741 filed May 30, 1997 now U.S. Pat. No. 5,960,191.

FIELD OF THE INVENTION

The present invention relates in general to apparatus for verifying electronic circuit designs and more specifically to hardware emulation systems in which multiple design signals are carried on a single physical wire between programmable logic chips.

BACKGROUND OF THE INVENTION

Hardware emulation systems are devices designed for verifying electronic circuit designs prior to fabrication as chips or printed circuit boards. These systems are typically built from programmable logic chips (logic chips) and programmable interconnect chips (interconnect chips). The term "chip" as used herein refers to integrated circuits. Examples of logic chips include reprogrammable logic circuits such as field-programmable gate arrays ("FPGAs"), which include both off-the-shelf products and custom products. Examples of interconnect chips include reprogrammable FPGAs, multiplexer chips, crosspoint switch chips, and the like. Interconnect chips can be either off-the-shelf products or custom designed.

Prior art emulation systems have generally been designed so that each signal in an electronic circuit design to be emulated is mapped to one or more physical metal lines ("wires") within a logic chip. Signals which must go between logic chips are mapped to one or more physical pins on a logic chip and one or more physical traces on printed circuit boards which contain the logic and interconnect chips.

The one-to-one mapping of design signals to physical pins and traces in prior art emulation systems leads to the requirement that the emulation system contain at least as many logic chip pins and printed circuit board traces as there are design signals to be routed between logic chips. Such an arrangement requires the use of very complex and expensive integrated circuit packages, printed circuit boards and circuit board connectors to construct the emulation system. The high cost of these components, which in turn increases the cost of the hardware logic emulation system, is a factor in limiting the number of designers who can afford, and therefore, benefit from, the advantages provided by hardware emulation systems.

Furthermore, integrated circuit fabrication technology is allowing the use of ever decreasing feature sizes. Thus, the logic density of logic chips (i.e., the number of logic gates that can be implemented therein) has increased dramatically. The increase in the number of logic gates that can be implemented or emulated in a single logic chip, however, has not been met with an increase in the number of pins (i.e., leads) available for inputs, outputs, clocks and the like on the chip's package. The number of pins on an integrated circuit package is limited by the available perimeter of the chip. Furthermore, the capability of the wire-bonding assembly equipment used to connect the bonding pads on integrated circuit dice to the pins on the package has increased slowly over time. Thus, there is an increasing mismatch between the amount of logic available on a logic chip and the number of pins available to connect the logic to the outside world. This results in poor average utilization of the logical capacity of the logic chips, which increases the cost of a hardware emulation system necessary for emulation of a given sized electronic circuit design.

Time-multiplexing is a technique that has been used for sharing a single physical wire or pin between multiple logical signals in certain types of systems where the cost of each physical connection is very high. Such systems include telecommunication systems. Time-multiplexing, however, has not been commonly used in hardware emulation systems such as those available from Quickturn Design Systems, Inc., Mentor Graphics Corporation, Aptix Corporation, and others because the use of prior art time-multiplexing methods significantly reduced the speed at which the emulated circuit could operate. Furthermore, prior art time-multiplexing techniques makes it difficult to preserve the correct asynchronous behavior of an embedded design in the hardware emulation system.

As discussed, one function of hardware emulation systems is to verify the functionality of an integrated circuit. Typically, when a circuit designer or engineer designs an integrated circuit, the design is represented in the form of a "netlist" description of the design. A netlist description (or "netlist", as it is referred to by those of ordinary skill in the art) is a description of the integrated circuit's components and electrical interconnections between the components. The components include all those circuit elements necessary for implementing a logic circuit, such as combinational logic (e.g., gates) and sequential logic (e.g., flip-flops and latches). Prior art emulation systems analyzed the user's circuit netlist prior to implementing the netlist into the hardware emulation system. This analysis included the steps of separating the various circuit paths of the design into clock paths, clock qualifiers and data paths. A method for performing this analysis and separation is disclosed in U.S. Pat. No. 5,475,830 by Chen et al, which is assigned to the same assignee as the present invention. The disclosure of U.S. Pat. No. 5,475,830 is incorporated herein by reference in its entirety. The techniques disclosed in U.S. Pat. No. 5,475,830 have been used in prior art emulation systems such as the System Realizer™ brand hardware emulation system from Quickturn Design Systems, Inc., Mountain View, Calif. However, the techniques disclosed therein have not been used in combination with any type of time-multiplexing.

Other prior art hardware emulation systems such as those available from Virtual Machine Works (now IKOS), ARKOS (now Synopsis) and IBM have attempted to use time-multiplexing of design signals onto a single physical logic chip pin and printed circuit board trace to seek lower hardware cost for a given size of electronic design to be emulated. These prior art emulation systems, however, alter or re-synthesize clock paths in an attempt to maintain correct circuit behavior. This alteration or re-synthesis process works predictably for synchronous designs. However, altering or re-synthesizing the clock paths in an asynchronous design can lead to inaccurate or misleading emulation results. Since most circuit designs have asynchronous clock architectures, the need to alter or re-synthesize the clock paths is a large disadvantage.

In addition, prior art hardware emulation machines using time-multiplexing have suffered from low operating speed. This is a consequence of re-synthesizing the clock paths. In these machines, a number of internal machine cycles are required to emulate one clock cycle of a design. Thus, the effective operating speed for the emulated design is typically many times slower than the maximum clock rate of the emulation system itself. If there are multiple asynchronous clocks in the design to be emulated, the slowdown typically becomes even worse because of the need to evaluate the state of the emulated design between each pair of input clock edges.

Prior art hardware emulation machines using time-multiplexing also require complex software for synchronizing the flow of many design signals over a single physical logic chip pin or printed circuit board trace. Each design signal must be timed so that it has the correct value at the instant it is needed in other parts of the system to compute other design signals. This timing analysis software (also known as scheduling software) adds to the complexity of the emulator and to the time needed to compile a circuit design into the emulator.

Furthermore, prior art hardware emulation machines which use time-multiplexing only use a simple form of time-multiplexing which requires minimal hardware but uses a large amount of power (e.g., current) and requires a complex system design.

Thus, there is a need for a hardware emulation system which has very high logical capacity, fast compile times, less complex software, simplified mechanical design and reduced power consumption.

SUMMARY OF THE INVENTION

A new type of hardware emulation system is disclosed and claimed which reduces hardware cost by time-multiplexing multiple design signals onto physical logic chip pins and printed circuit board traces but which does not have the limitations of low operating speed and poor asynchronous performance. Additional methods to multiplex multiple signals onto a single physical interconnection which are suitable for hardware emulation but do not have the disadvantages of high power and complex system design are also disclosed.

In the preferred embodiment, time-multiplexing is performed on clock qualifier paths (a clock qualifier is any signal which is used to gate a clock signal) and data paths in a design but not on clock paths (a clock path is the path between the clock signal and the clock source from which the clock signal is derived).

The reconfigurable logic system of the present invention comprises a plurality of reprogrammable logic devices, each having internal circuitry which can be reprogrammably configured to provide at least combinatorial logic elements and storage elements. The programmable logic devices also have programmable input/output terminals which can be reprogrammably interconnected to selected ones of functional elements of the logic devices. The reprogrammable logic devices have input demultiplexers and output multiplexers implemented at each input/output terminal. The input demultiplexers receive a time-multiplexed signal and divide it into one or more internal signals. The output multiplexers combine one or more internal signals onto a single physical interconnection.

The invention also comprises a plurality of reprogrammable interconnect devices, each of which have input/output terminals and internal circuitry which can be reprogrammably configured to provide interconnections between selected input/output terminals. The reprogrammable interconnect devices also have input demultiplexers and output multiplexers implemented at each input/output terminal. The input demultiplexers receive a time-multiplexed input signal and divide it into one or more component signals. The output multiplexers combine one or more component signals onto a second single physical interconnection.

The invention also comprises a set of fixed electrical conductors connecting the programmable input/output terminals on the reprogrammable logic devices to the input/output terminals on the reprogrammable interconnect devices.

In another aspect of the present invention, a logic-analyzer is integrated into the logic emulation system which provides complete visibility of the design undergoing emulation. The logic analyzer of the present invention is distributed, in that its components are integrated into many of the resources of the emulation system. The logic analyzer of the present invention comprises having at least scan chains programmed into each of the logic chips of the logic boards. The scan chains are comprised of at feast one flip-flop. The scan chains are programmably connectable to selected subsets of sequential logic elements of the design undergoing emulation.

The logic analyzer further comprises at least one memory device which is in communication with the scan chain. This memory device stores data from the sequential logic elements of the logic design undergoing emulation. Control circuitry communicates with the logic chips of the emulation system and generates logic analyzer clock signals which clock the scan chains. The control circuitry also generates trigger signals when predetermined combinations of signals occur in the logic chips.

The above and other preferred features of the invention, including various novel details of implementation and combination of elements will now be more particularly described with reference to the accompanying drawings and pointed out in the claims. It will be understood that the particular methods and circuits embodying the invention are shown by way of illustration only and not as limitations of the invention. As will be understood by those skilled in the art, the principles and features of this invention may be employed in various and numerous embodiments without departing from the scope of the invention.

BRIEF DESCRIPTION OF THE DRAWINGS

Reference is made to the accompanying drawings in which are shown illustrative embodiments of aspects of the invention, from which novel features and advantages will be apparent.

DETAILED DESCRIPTION OF THE DRAWINGS

Turning to the figures, the presently preferred apparatus and methods of the present invention will now be described.

Figure 1:
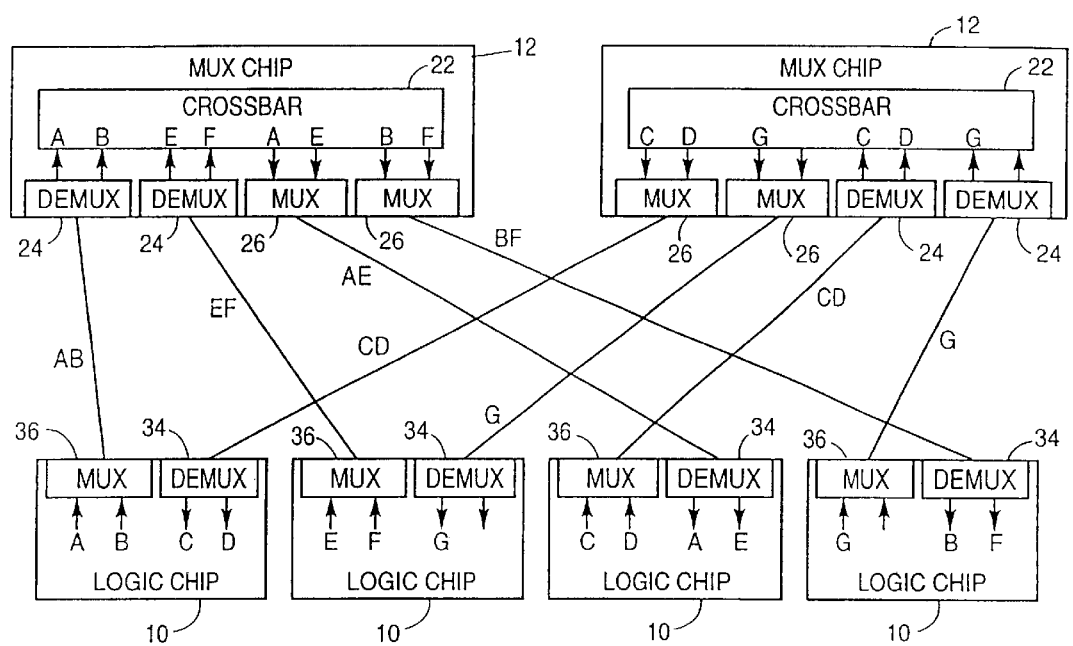
FIG. 1 is a block diagram shoving a partial crossbar network incorporating time-multiplexing.

FIG. 1 shows a portion of the partial crossbar interconnect for a preferred embodiment of a hardware emulation system of the present invention. Embodiments of a partial crossbar interconnect architecture have been described in the U.S. Pat. Nos. 5,036,473, 5,448,496 and 5,452,231 by Butts et al, which are assigned to the same assignee as the present invention. The disclosure of U.S. Pat. Nos. 5,036,473, 5,448,496 and 5,452,231 are incorporated herein by reference in their entirety. In a partial crossbar interconnect, the input/output pins of each logic chip are divided into proper subsets, using the same division on each logic chip. The pins of each Mux chip (also known as crossbar chips) are connected to the same subset of pins from each logic chip. Thus, crossbar chip 'n' is connected to subset 'n' of each logic chip's pins. As many crossbar chips are used as there are subsets, and each crossbar chip has as many pins as the number of pins in the subset times the number of logic chips. Each logic chip/crossbar chip pair is interconnected by as many wires, called paths, as there are pins in each subset.

The partial crossbar interconnect of FIG. 1 comprises a number of reprogrammable interconnect blocks 12, which in a preferred embodiment are multiplexer chips (Mux chips). The partial crossbar interconnect of FIG. 1 further comprises a number of reprogrammable configurable logic chips 10, which in a presently preferred embodiment are field-programmable gate arrays (FPGAs). Each Mux chip 12 has one or more connections to each logic chip 10. In the preferred embodiment described in Butts, each design signal going from a logic chip to a Mux chip takes one physical interconnection. In other words, one signal on a pin from a logic chip 10 is interconnected to one pin on a Mux chip 12. In the embodiments of the present invention, each physical interconnection in the partial crossbar architecture may represent one or more design signals.

Each Mux chip 12 comprises a crossbar 22, together with a number of input demultiplexers 24 and output multiplexers 26. The input demultiplexers 24 take a time-multiplexed input signal and divide it into one or more component signals. The component signals are routed separately through the crossbar 22. They are then multiplexed again, in the same or a different combination, by an output multiplexer circuit 26. In a preferred embodiment, time-multiplexed signals are not routed through the Mux chip crossbar 22. By not routing time-multiplexed signals through the Mux chip crossbar 22, the flexibility of routing the partial crossbar network is increased because input signals and output signals to the Mux chips may be combined in different combinations. This also reduces the power consumption of the Mux chip 12 since the time-multiplexing frequency is typically much higher than the average switching rate of the component signals.

The logic chips 10 also comprise a plurality of input demultiplexers 34 and output multiplexers 36. The output multiplexers 36 take one or more internal logic chip 10 signals and combine them onto a single physical interconnection. The input demultiplexers 34 take a time-multiplexed signal and divide it into one or more internal logic chip 10 signals. In the presently preferred embodiment, these multiplexers 36 and demultiplexers 34 are constructed using the internal configurable logic blocks of a commercially available off-the-shelf FPGA. However, they could be constructed using input/output blocks of a reprogrammable logic chip custom designed for emulation.

FIG. 1, for illustrative purposes only, shows two Mux chips 12 with four pins each and four logic chips 10 with two pins each. The actual embodiments of preferred hardware emulation systems would have more of each type of chip and each chip would have many more pins. The actual number of Mux chips 12, logic chips 10, and number of pins on each is purely a matter of design choice, and is dependent on the desired gate capacity to be achieved. In a presently preferred embodiment, each printed circuit board contains fifty-four Mux chips 12 and thirty-seven logic chips 10. The presently preferred logic chips 10 are the 4036XL FPGA (also known as a "logic cell array"), which is manufactured by Xilinx Corporation. It should be noted, however, that other reprogrammable logic chips such as those available from Altera Corporation, Lucent Technologies, or Actel Corporation could be used. In the presently preferred embodiment, thirty-six of the logic chips 10 make five connections to each of the fifty-four Mux chips 12. What this means is that five of the pins of each of these thirty-six logic chips 10 has a physical electrical connection to five pins of each of the fifty-four Mux chips 12. The thirty-seventh logic chip 10 makes three connections to each of the fifty-four Mux chips. What this means is that three of the pins of this thirty-seventh logic chip 10 have a physical electrical connection to three pins of each of the fifty-four Mux chips 12.

Figure 2:
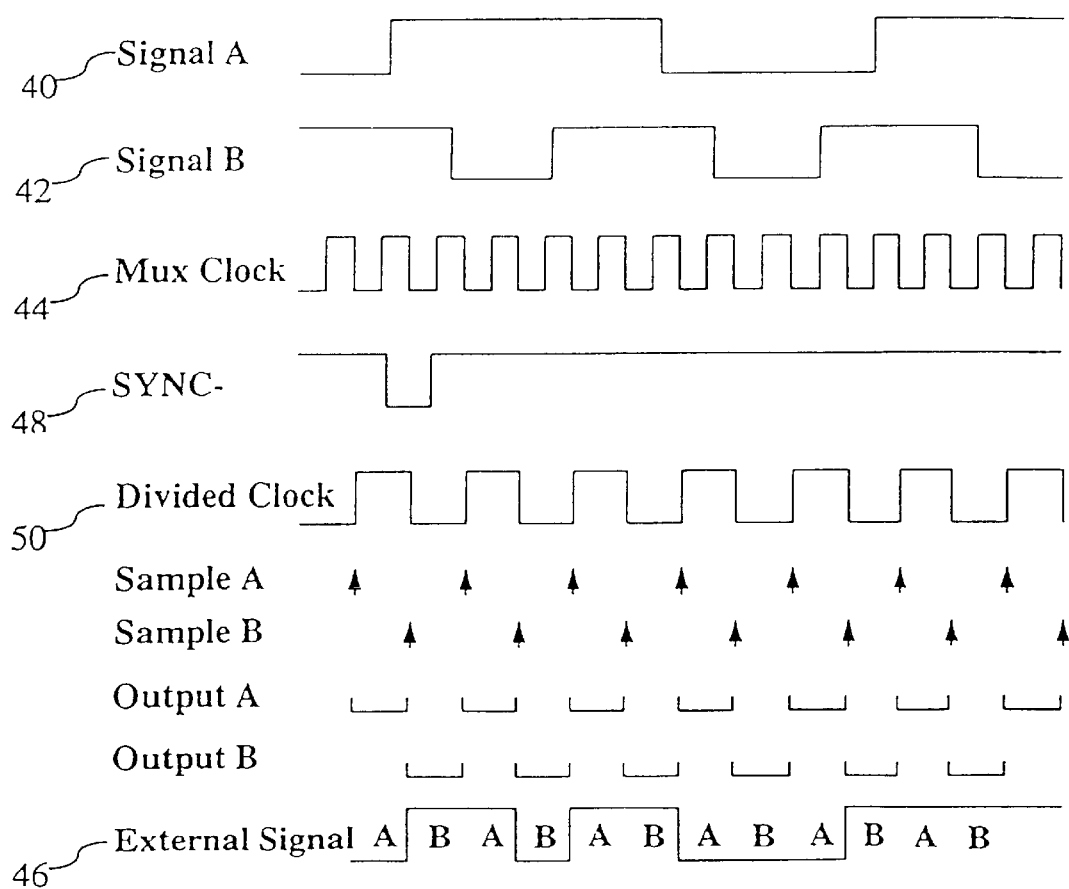
FIG. 2 is a timing drawing showing the signal relationships for two-to-one time-multiplexing.

FIG. 2 shows a example of a timing diagram for a two-to-one time-multiplexing emulation system in which internal logic chip Signal A 40 and internal logic chip Signal B 42 are multiplexed onto a single output signal 46. A Mux Clock Signal 44 is divided by two to produce Divided Clock Signal 50. A SYNC-Signal 48 is used to synchronize the Mux Clock divider 68 (see FIG. 3) so that the falling edge of Mux Clock 44 sets Divided Clock Signal 50 to zero if SYNC-Signal 48 is low. Divided Clock 50 is used to sample internal signal A 40 on each rising edge. This sample is placed into a storage element such as a flip-flop or latch (shown in FIG. 3) The same Divided Clock Signal 50 is used to sample internal Signal B 42 on each falling edge. This sample is placed into another flip-flop or latch (shown in FIG. 3). In a preferred embodiment, the Mux Clock Signal 44 may be asynchronous to Signal A 40 and Signal B 42. When the value on the Divided Clock Signal 50 is high, the previously sampled Signal A 40 is then transferred to the Output Signal 46. When the Divided Clock Signal 50 is low, the previously sampled Signal B 42 is transferred to the Output Signal 46.

Figure 3:
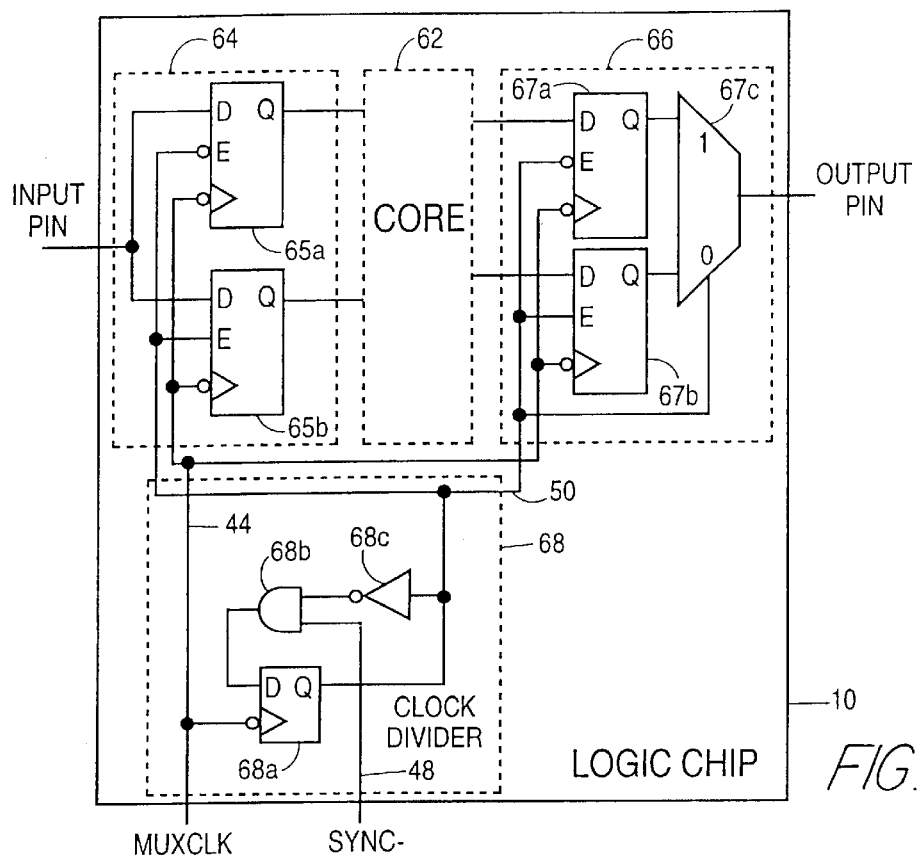
FIG. 3 is a block diagram showing the circuitry necessary in an FPGA to do two-to-one time-multiplexing.

Referring now to FIG. 3, the logic implemented in FPGA 10 of a presently preferred embodiment which creates the timing of the signals shown in FIG. 2 is shown in detail. A two-to-one clock divider 68 divides the Mux Clock Signal 44 to produce Divided Clock Signal 50. Clock divider 68 comprises flip-flop 68a, AND gate 68b and inverter 68c. Divided Clock Signal 50 is input to an output multiplexer 66 (see multiplexer 36 of FIG. 1) and the input demultiplexer (see demultiplexer 34 of FIG. 1). The clock divider 68 is reset periodically by the SYNC-Signal 48 to ensure that all the clock dividers in the system are synchronized. The input demultiplexer 64 is composed of two flip-flops 65a and 65b. Flip-flops 65a and 65b are clocked by Mux Clock 44. One flip-flop (e.g., 65b) is enabled when divided clock signal 50 is high and the other (e.g., 65a) is enabled when Divided Clock Signal 50 is low. Divided clock Signal 50 is not used directly as a clock to the flip-flops 65a, 65b in input demultiplexer 64 and in the output multiplexer 66 to conserve low-skew lines in the FPGA 10. The output of either flip-flop 65a or 65b provides a static demultiplexed design signal to the core 62 of the FPGA 10 (the core 62 of the FPGA 10 comprises the configurable elements used to implement the logic functions of the user's design). The output multiplexer 66 comprises two flip-flops 67a, 67b which are clocked by Mux Clock 44. Output multiplexer 66 also comprises two-to-one multiplexer 67c. One flip-flop (e.g., flip-flop 67b) is enabled when Divided Clock Signal 50 is high and the other flip-flop (e.g., flip-flop 67a) is enabled when Divided Clock Signal 50 is low. The two-to-one multiplexer 67c selects the output Q of either flip-flop 67a or flip-flop 67b to appear on the output pin.

Figure 4:
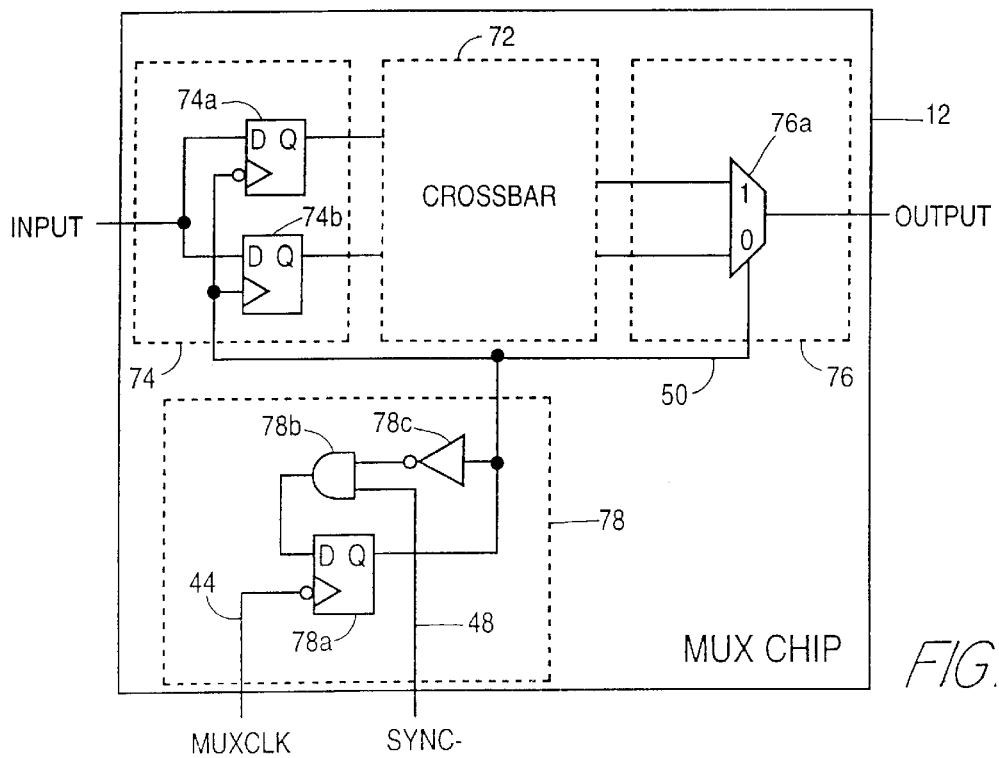
FIG. 4 is a block diagram showing the equivalent circuitry in a multiplexing chip.

Corresponding circuitry for the Mux chip 12 is shown in FIG. 4. Unlike the circuitry in the logic chip 10, the output multiplexer 76 (see multiplexer 26 of FIG. 1) in the Mux chip 12 is constructed without flip-flops and therefore comprises two-to-one multiplexer 76a. This is possible because in the preferred embodiment, delays through the Mux chip 12 are short. To save additional logic, flip-flops 74a, 74b in the input demultiplexer 74 (see demultiplexer 24 of FIG. 1) do not have enable inputs. Instead, the Divided Clock Signal 50 is used to clock the flip-flops 74a, 74b directly. Clock divider 78 is preferably comprised of flip-flop 78a, AND gate 78b, and inverter 78c. The clock divider 78, the input demultiplexer 74, and the output multiplexer 76 operate similarly to the corresponding elements in FIG. 3.

Since it is not known in advance whether an input/output ("I/O") pin on a Mux chip 12 will be an input or an output for a given design, all I/O pins in the Mux chips 12 include both an input demultiplexer 74 and an output multiplexer 76.

Figure 5:
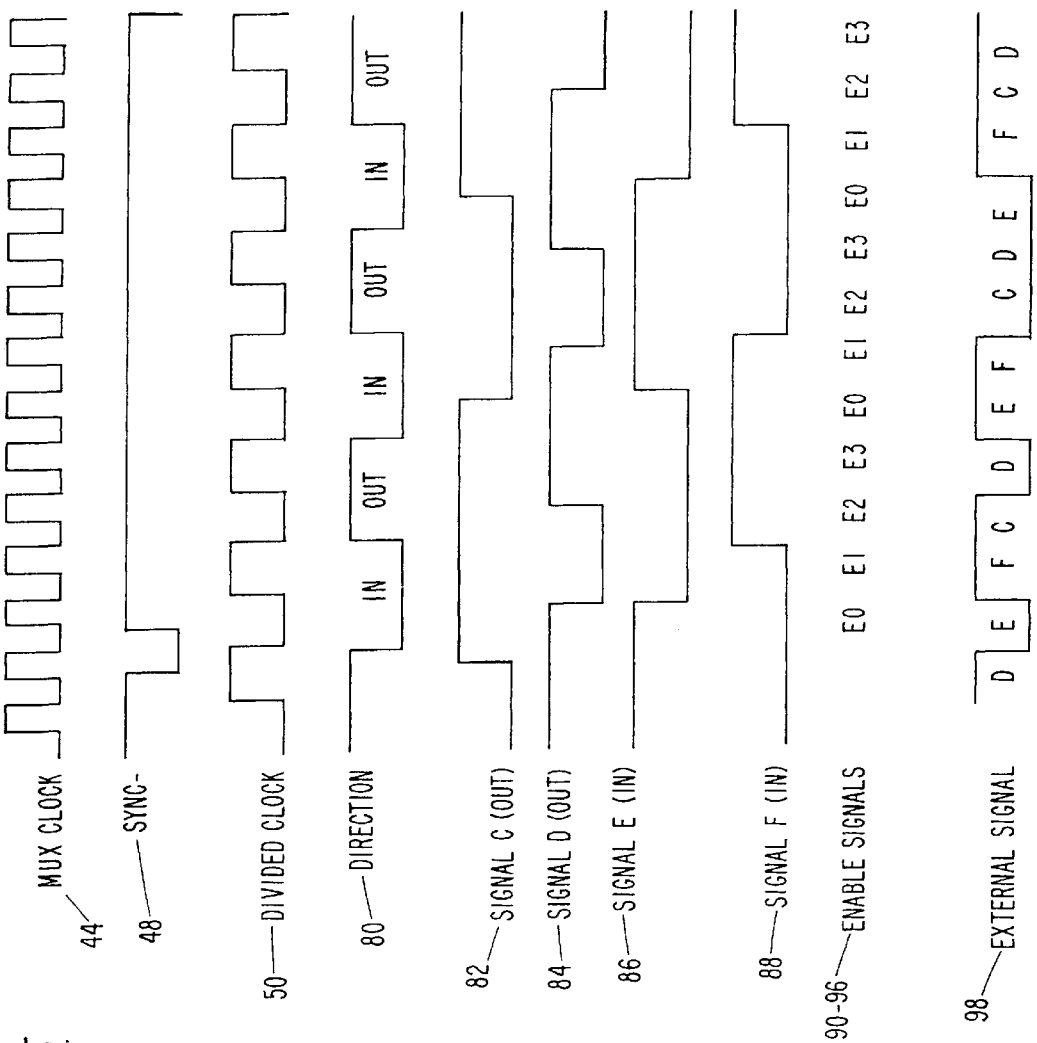
FIG. 5 is a timing diagram showing the signal relationships necessary for four-to-one time-multiplexing.

Using the concepts of the present invention, it is possible to do four-to-one time-multiplexing where a pin is an input for a time then an output for a time. FIG. 5 shows a timing diagram for four-to-one time-multiplexing. Just as for two-to-one time-multiplexing, there is a Mux Clock signal 44 and a SYNC-Signal 48. The Mux Clock Signal 44 is divided by two to produce a Divided Clock Signal 50. The divider is synchronously reset when the SYNC-Signal is low and a falling edge occurs on the Mux Clock Signal 44. In addition, there is an additional Direction Signal 80 which is produced by dividing the Divided Clock Signal 50 again by two. The Direction Signal 80 controls whether the pin is an input or an output at each instant in time. Four enable signals E0 90, E1 92, E2 94 and E3 96 are used to enable individual flip-flops in the logic chips 10 as will be described later. These four signals are derived from the Divided Clock Signal 50 and the Direction Signal 80.

The Divided Clock Signal 50 samples the External Signal 98 to produce Internal Input Signal E 86 and Internal Input Signal F 88 when the Direction Signal 80 is low. When Direction Signal 80 is low, it signifies that the pin is operating in an input direction. Internal Input Signal E 86 is produced by sampling on the rising edge of Divided Clock Signal 50. Internal Input Signal F 88 is produced by sampling on the falling edge of Divided Clock Signal 50. When Direction Signal 80 is high, the pin receiving it operates as an output. Internal Output Signal C 82 is output onto External Signal 98 when Divided Clock signal 50 is low and Internal Output Signal D (84) is output when Divided Clock Signal 50 is high.

Figure 6:
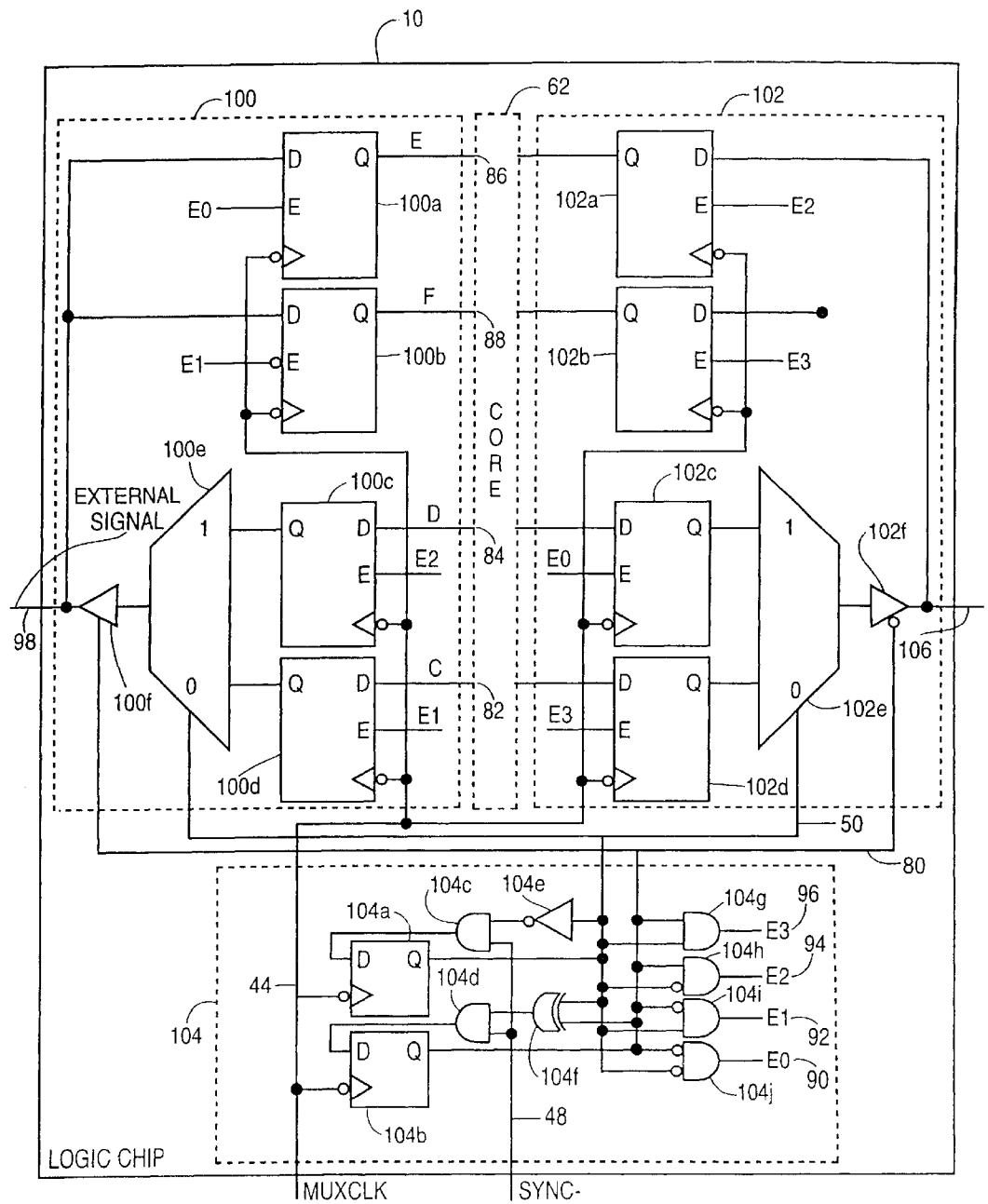
FIG. 6 is a block diagram showing the logic necessary in an FPGA to do four-to-one time-multiplexing.

Referring now to FIG. 6, the logic implemented in logic chip 10 to create the timing signals of FIG. 5 is shown in detail. A clock divider 104 divides the Mux Clock signal 44 to produce Divided Clock Signal 50 and Direction Signal 80. Clock divider 104 is comprised of flip-flops 104*a* and 104*b*, AND gates 104*c* and 104*d*, inverter 104*e*, EXCLUSIVE-OR gate 104*f*, and AND gates 104*g*–104*j*. The clock divider 104 is reset periodically by the SYNC-Signal 48 to insure that all the clock dividers 104 in the system are synchronized. In addition, the clock divider circuit 104 also produces Enable Signals E0 90, E1 92, E2 94 and E3 96. These signals are used as enables in the input/output multiplexer circuits 100 and 102.

The input/output multiplexer circuit 100 has timing corresponding to the diagram of FIG. 5. The External Signal 98 is an input when Direction Signal 80 is low. Signal E 86 and Signal F 88 are sampled from External Signal 98 when Enable Signal E0 90 and Enable Signal E1 92 are active and placed in flip-flops 100*a* and 100*b* respectively. Signals D 84 and C 82 are saved in flip-flops 100*c* and 100*d* when enable signals E2 94 and E1 92 are active. A preferred input/output multiplexer circuit 100 is also comprised of multiplexer 100*e* and buffer 100*f*. These cause signals D 84 and C 82, previously saved in flip-flops 100*c* and 100*d*, to appear successively on External Signal 98 when Direction Signal 80 is high.

The input/output multiplexer circuit 102 is similar except that the timing has been altered so that Signal 106 is an output when Direction Signal 80 is low. Input/output multiplexer 102 is preferably comprised of flip-flops 102*a*–102*d*, multiplexer 102*e* and buffer 102*f*. The input/output multiplexer 100 is referred to herein as an "inout" multiplexer while the multiplexer 102 is referred to herein as an "outin" multiplexer. When pins are connected together in a system, an inout pin must always be connected to an outin pin so that one pin is driving while the other is listening (i.e., ready to receive or receiving a signal).

Figure 7:
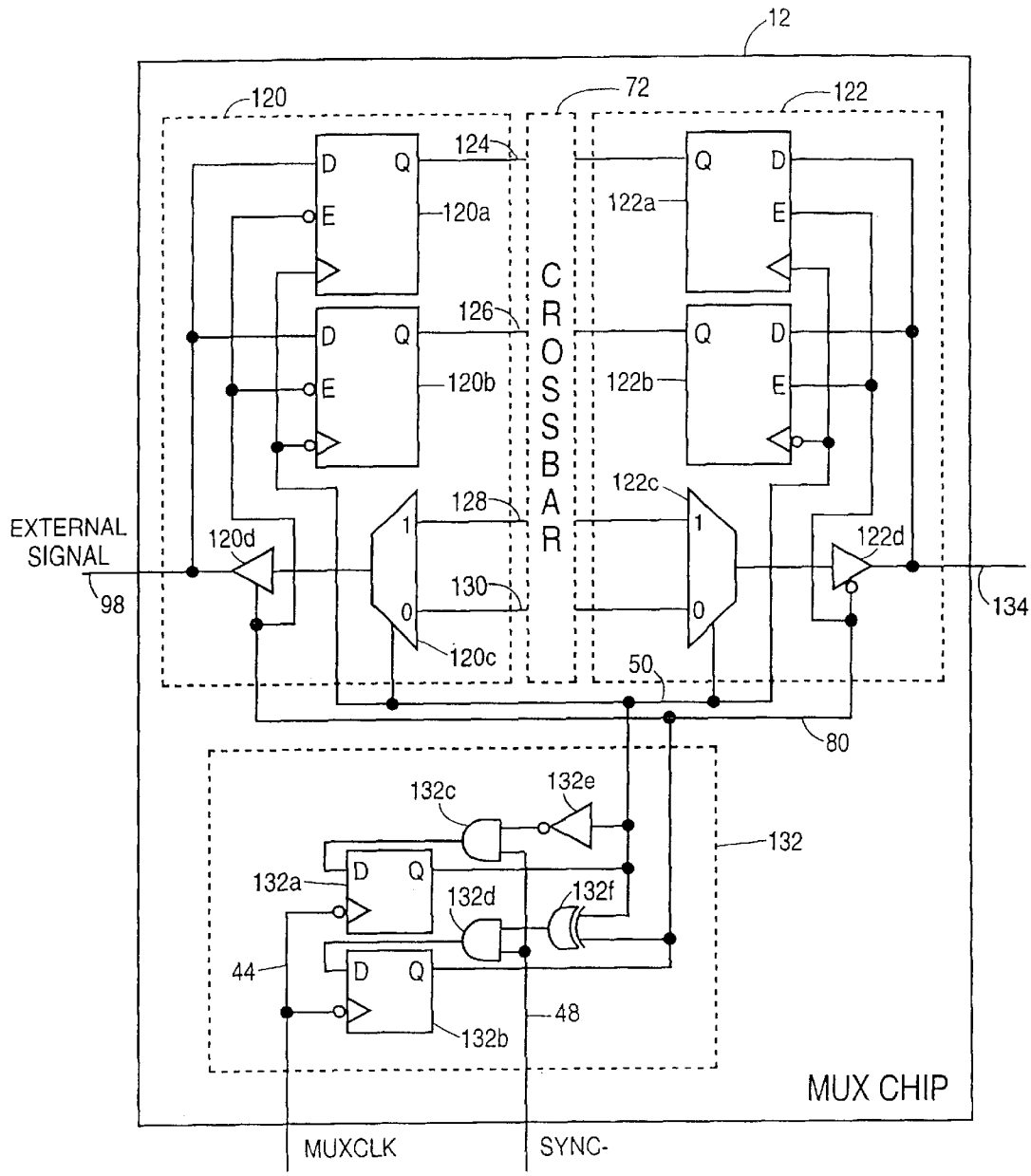
FIG. 7 is a block diagram showing the equivalent circuitry in a multiplexing chip.

Corresponding 4-way time-multiplexing circuitry is shown in FIG. 7 for mux chip 12. Clock divider 132 produces Divided Clock Signal 50 and Direction signal 80. Clock divider 132 is comprised of flip-flops 132*a*, 132*b*, AND gates 132*c*, 132*d*, inverter 132*e* and EXCLUSIVE-OR gate 132*f*. As in the logic chip 10, there is an inout multiplexer 120 and an outin multiplexer 122. Inout multiplexer 120 is preferably comprised of flip-flops 120*a*, 120*b*, two-to-one multiplexer 120*c* and buffer 120*d*. Inout multiplexer 120 has the timing shown in FIG. 5. External Signal 98 is an input when Direction Signal 80 is low and an output when Direction Signal 80 is high. Internal signals 124 and 126 are sampled from External Signal 98 when Direction signal 80 is low. Internal signals 128 and 130 are output onto External Signal 98 when Direction signal 80 is high.

Outin multiplexer circuit 122 is similar except that the timing has been altered so that signal 134 is an input when Direction Signal 80 is high and an output when Direction Signal 80 is low. Outin multiplexer 122 is preferably comprised of flip-flops 122*a*, 122*b*, two-to-one multiplexer 122*c* and buffer 122*d*. An outin pin on a mux chip 12 must connect to an inout pin on another mux chip 12 or a logic chip 10. Additional configuration bits (not shown in FIG. 7) make it possible to programmably configure any pin of the mux chip 12 to be either non-multiplexed, two-to-one multiplexed as either an input or an output, or four-to-one multiplexed as either an inout or an outin pin. This is done by selectively forcing direction signal 80 to always be low (for a two-to-one input), always be high (for a two-to-one output), be non-inverted (for an inout four-to-one pin as in 120), or be inverted (for an outin four-to-one pin as in 122). Additionally, external signal 98 can be directly connected to core signal 124 for a non-multiplexed input. Core outputs 128 and 130 can be directly connected to the input and enable pins of buffer 120*d* for a non-multiplexed output.

Although the preferred embodiment incorporates two-to-one and four-to-one time-multiplexing, the technique disclosed could be extended to allow multiplexing by any other factor that the designer might choose. In general, higher multiplexing factors result in slower emulation speed but allow simpler and lower-cost hardware because the physical wires and pins can be shared among more logical design signals.

Furthermore, there are many other methods for multiplexing multiple bits of information onto a single physical wire which could be used in an emulation system. Examples of these techniques are pulse-width modulation, phase modulation and serial data encoding. The choice of which technique to use in a particular embodiment is a matter of the designer's choice and depends on the tradeoffs between operating speed, cost, power consumption and complexity of the logic required.

One aspect of these more complex encoding schemes which is important in a hardware emulation system is the ability to reduce power consumption. A hardware emulation system typically will have many thousands of interconnect paths. To minimize delay through the system, it is desirable to switch these interconnect paths as rapidly as possible between different logical design signals. Power consumption of the system, however, is largely determined by the speed at which the interconnect paths are switched. In a large system, generating and distributing power and removing the resulting heat can significantly increase the complexity and cost of the system. It is therefore desirable to have a multiplexing scheme which operates quickly but does not require large amounts of power. One way in which power dissipation could be minimized is by only transferring design signal information when design data changes rather than transferring design signal information continuously, as is done in the presently preferred embodiment.

Another important aspect to consider when choosing an encoding scheme is the ability to have interconnections which operate asynchronously to each other or asynchronously to a master multiplexing clock. In the simple form of time-multiplexing described above for the presently preferred embodiment, a master multiplexing clock must be distributed with low skew to all logic chips 10 and Mux chips 12 in the system. In addition, the master multiplexing clock must be run slow enough so signals have time to pass over the longest interconnect path in the system. At the same time, there must be no hold-time violations for the shortest interconnect path in the system. A hold time violation could occur if a transmitting device removed a data signal before a receiving device had properly saved it into a flip-flop or latch. The requirement for a low-skew master clock significantly increases the complexity and cost of the emulation system. In addition, the requirement to not have hold time violations on the shortest possible data path while insuring sufficient time for signals to pass over the longest possible data path means that the multiplexing clock must operate relatively slowly. As explained earlier, this is undesirable because it limits the effective operating speed of the emulation system.

The inventive concepts described above with respect to the simplest form of time-multiplexing are equally applicable to more complex encoding schemes, which will now be seen. Encoding schemes using pulse-width modulation, phase-shift modulation and serial encoding can reduce power consumption and and increase the relatively low operating speed intrinsic to the simplest form of time-multiplexing. The disadvantage of all of these schemes (relative to simple time-multiplexing) is that they require significantly more encoding and decoding logic and, for that reason, simple time-multiplexing was used in the presently preferred embodiment. As the cost of digital logic decreases relative to the cost of physical pins and circuit board traces, one or more of these more complex encoding schemes will likely be used in the future.

Figure 8:
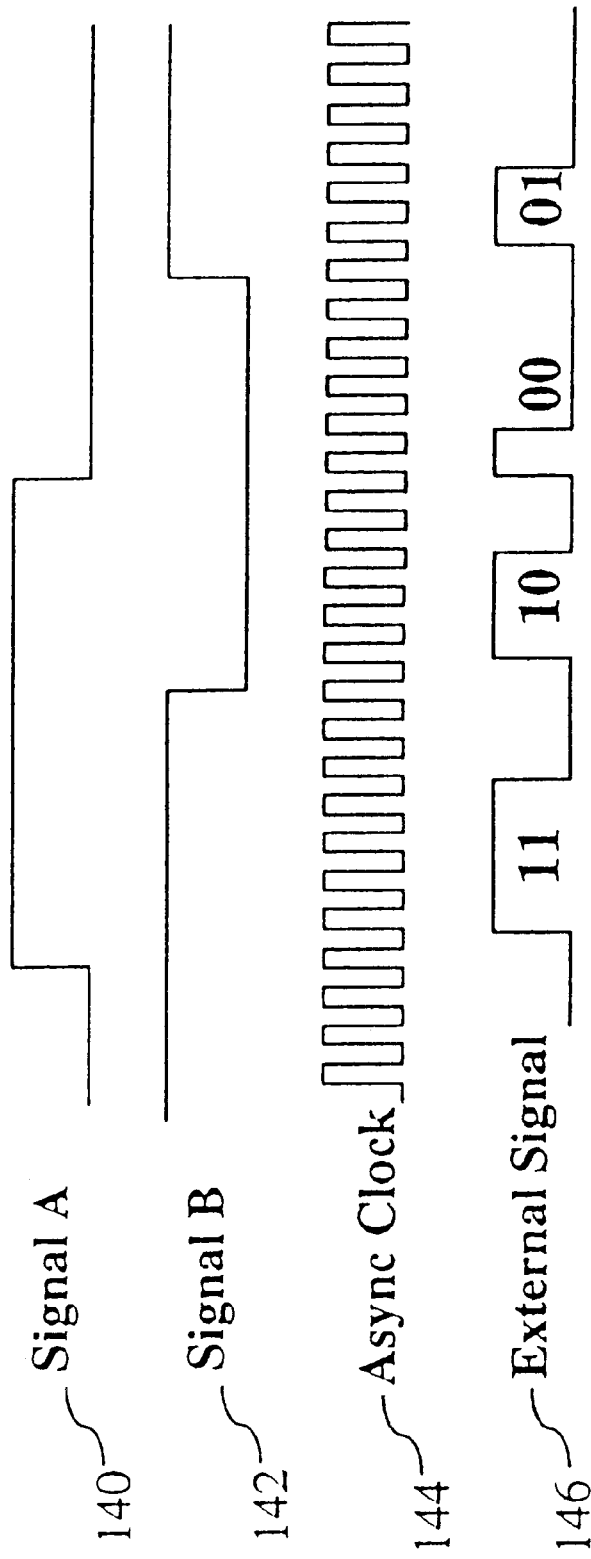
FIG. 8 is a timing diagram showing the signal relationships for a pulse width encoding scheme suitable for a hardware emulation system.

Referring to FIG. 8, a form of pulse-width modulation is shown which would be suitable for a hardware emulation system. The External Signal 146 is normally low. When a transition occurs on a Design Signal 140 or 142, a pulse is emitted on the External Signal 146. A High Speed Asynchronous Clock Signal 144 is distributed to all chips in the system. Unlike the Mux Clock 44 described earlier with reference to FIG. 2, Asynchronous Clock Signal 144 need not be synchronized between any two chips in the system or even between two pins on the same chip. Therefore, there is no need for a SYNC-Signal 48 as described earlier with reference to FIG. 2. Also, Asynchronous Clock Signal 144 may operate at any speed as long as the minimum pulse width produced on External Signal 144 will pass through the interconnect without undue degradation. The pulse emitted on External Signal 146 may have a width of one, two, three or four clocks depending on whether the two Design Signals 140 and 142 had values of 00, 01, 10 or 11 when a signal transition occurred. Asynchronous Clock Signal 144 must, however, be sufficiently fast that five clock cycles always elapse between successive edges of Design Signals 140 and 142 to ensure that information is not lost. Data Signals 140 and 142 are recovered from External Signal 146 by counting the number of Asynchronous Clock 144 cycles that occur each time External Signal 146 goes high. In an actual embodiment, Asynchronous Clock 144 would operate at twice or three times the speed showy to ensure that recovered signals could be unambiguously distinguished. Additional circuitry would also be added to periodically transfer data, even in the absence of design signal transitions in order for the design to initialize properly.

Since Design Signals 140 and 142 transition relatively infrequently on average compared to Asynchronous Clock 144, power consumption will be low compared to the continuous time-multiplexing scheme described earlier. In addition, this encoding scheme is not affected by varying amounts of delay between the transmitting circuit and the receiving circuit.

The logic circuitry necessary to implement this pulse-width encoding scheme could be designed by one skilled in the art of circuit design and thus will not be further discussed here. It is noted, however, that one skilled in the art could design logic circuits having many different variations while still achieving the same function. For example, three design signals could be encoded onto one external signal 146 instead of two. Also different encodings of Design Signals 140 and 142 could be used or the default value of External Signal 146 could be one instead of zero.

The pulse width modulation encoding scheme described with reference to FIG. 8 suffers from the following limitations. In a pulse width modulation encoding scheme, the pulse width must be measured from a rising edge on External Signal 146 to a falling edge on External Signal 146. However, When a signal passes through many levels of routing chips, a rising edge will often be delayed by a different amount than a falling edge. The speed of the signal multiplexing may, therefore, need to be slowed down to ensure that signal values can still be distinguished after passing through many levels of routing chips. Also, the modulation scheme of FIG. 8 is sensitive to unavoidable momentary signal transitions or glitches on External Signal 146 which may cause false signal values to be transmitted.

Figure 9:
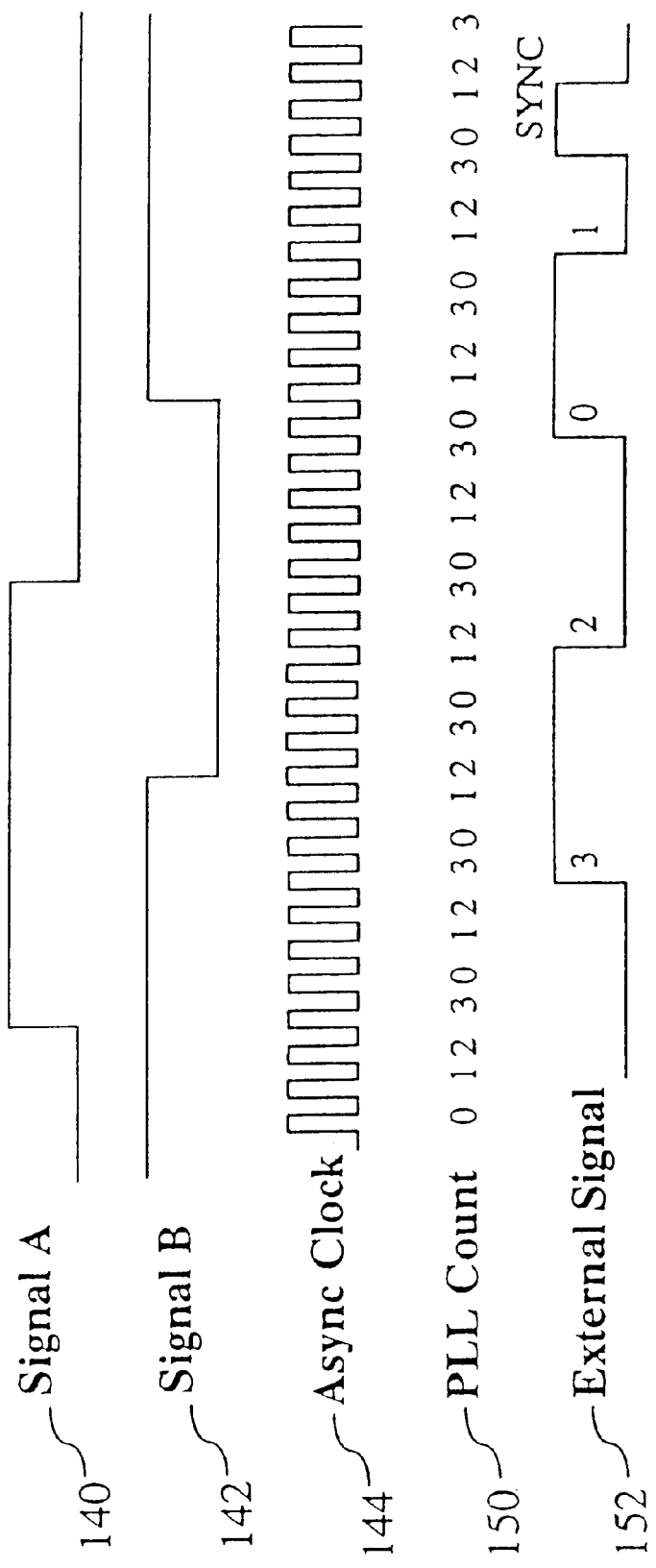
FIG. 9 is a timing diagram showing the signal relationships for a phase encoding scheme suitable for a hardware emulation system.

Referring to FIG. 9, a form of phase modulation is shown which would be suitable for a hardware emulation system. An internal phase-locked loop ("PLL") circuit continuously counts from zero to three (shown as PLL Count 150 in FIG. 9) using Asynchronous Clock 144 as an input. The PLL circuit may be of a type commonly known as a digital phase-locked loop ("DPLL") which is relatively easy to construct with complementary metal oxide semiconductor ("CMOS") integrated circuit technology. When a transition occurs on Design Signals 140 or 142, External Signal 152 makes a transition at a time which depends on the value of Design Signals 140 and 142. For example, after the first transition on Signal A 140, both Signal A 140 and Signal B 142 will be high. External Signal 152, therefore makes a transition when the PLL is at count 3 (A, B=11). Later, after a transition on Signal B 142, Signal A 140 will be high and signal B 142 will be low. External signal 152 therefore makes a transition when the PLL is at count 2 (A, B=10).

The receiving circuit has a matching PLL which is kept synchronized to the transmitting PLL by sync pulses which are sent periodically when no data needs to be transferred. A sync pulse consists of two transitions occurring at time zero and time two of the transmitting PLL. A sync pulse may be recognized by the receiving PLL because it is the only time when two transitions occur on external signal 152 within one PLL cycle. The sync pulse causes the receiving PLL to adjust its count gradually so that it becomes synchronized with the transmitting PLL after several sync pulses have occurred. The sync pulse need only occur relatively infrequently compared to transitions on Signals A 140 and Signal B 142 so power consumption is not greatly increased. In an actual embodiment, Asynchronous Clock 144 would operate at a relative speed two or three times what is shown in FIG. 9 to have sufficient resolution to clearly distinguish between the different edge transition times on External Signal 152. Alternatively, the phase-locked loop could be run at a multiple of the frequency of Asynchronous Clock 144 to increase resolution. Also, circuitry would be included to periodically transmit the value of Design Signal A 140 and Design Signal B 142 even if no transition had occurred, so that the design would initialize properly.

The circuitry necessary to implement the digital phase-lock loops and the transmit and receiving circuitry used in this phase encoding scheme could be designed by one skilled in the art of circuit design and thus will not be further discussed here.

The phase modulation encoding scheme discussed above has several advantages over the pulse-width modulation scheme discussed earlier (see FIG. 8). Fewer transitions on External Signal 152 are required to transmit values of Signal A 140 and Signal B 142 than is the case for External Signal 146 in FIG. 8. This reduces the power consumed by the system. Also, the circuit can be made less sensitive to noise because glitches or short pulses are treated as sync pulses and have only a gradual effect on PLL Count 150. In addition, separate PLL counters can be used to time rising edges and falling edges since the sync pulse always includes one rising and one falling edge. By timing the rising and falling edges separately, Asynchronous Clock 144 can be run at a very high frequency and External Signal 152 can be passed through many intermediate routing chips without affecting the ability to reliably recover Signal A 140 and Signal B 142. The main disadvantage of phase modulation, however, is that it requires a relatively large amount of digital logic to implement.

Many variations of the phase modulation encoding scheme disclosed herein are possible without deviating from the teachings of the invention. For example, the PLL could recognize eight or sixteen transition times rather than just four. Also, additional design signals could be transmitted by creating more than one edge on External Signal 152 each time a transition occurred on a design signal. For example, Design Signals A and B could be transmitted on a first edge of External Signal 152 and Design Signals C and D could be transmitted on a second edge of External Signal 152. This has the effect of transmitting more data on External Signal 152 but at a lower speed.

Figure 10:
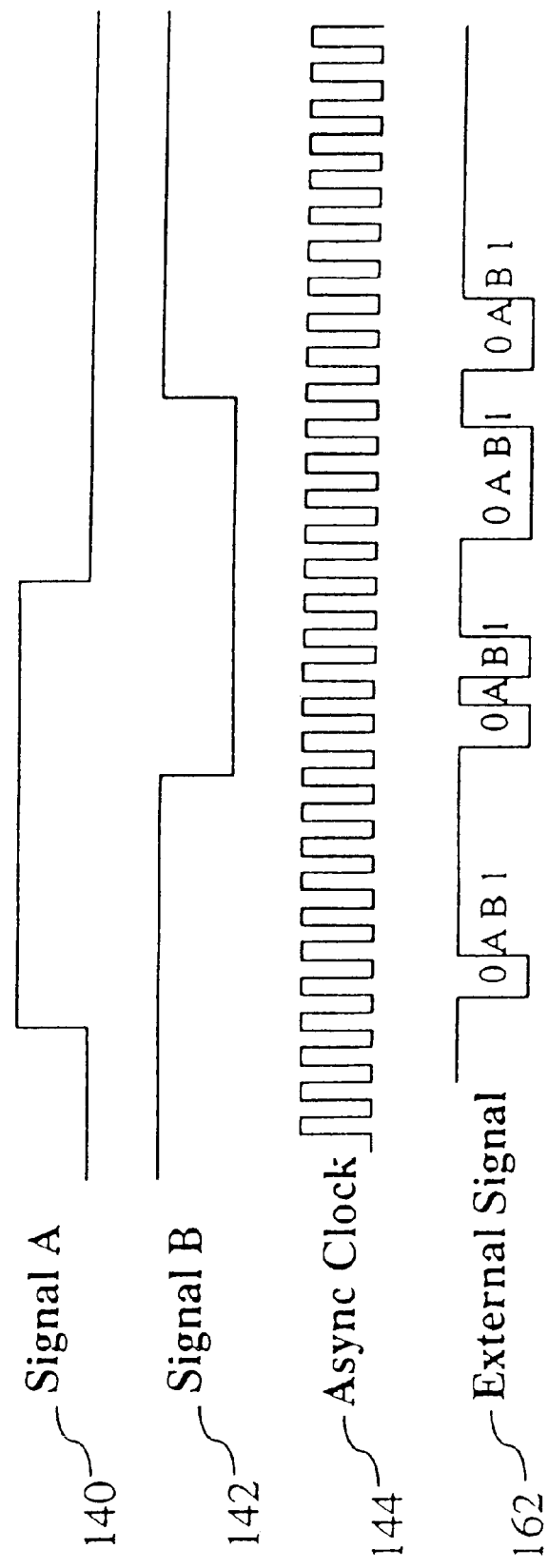
FIG. 10 is a timing diagram showing the signal relationships for a serial data encoding scheme suitable for a hardware emulation system.

Referring to FIG. 10, another form of modulation is shown which would also be useful in a hardware emulation system. This technique is known as serial data encoding. Many common protocols such as RS232 use a variation of serial data encoding. When Design Signal A 140 or Design Signal B 142 make a transition, a serial string of data is transmitted on External Signal 162. A start bit which is always zero signifies that a transmission is about to occur. Next, the values of Signal A 140 and Signal B 142 are transmitted successively. Finally, a stop bit which is always a one is transmitted. The receiving circuitry uses Asynchronous Clock Signal 144 to delay one and one-half clocks from the falling edge of the start bit before sampling External Signal 162 to recover Signal A 140. It then delays an additional clock before sampling External Signal 162 again to recover Signal B 142. In an actual embodiment, Asynchronous Clock 144 would operate at a relative frequency several times higher than that shown in FIG. 10 to sample External Signal 162 accurately at the center point when Signal A 140 and Signal B 142 are being transmitted.

The circuitry necessary to implement the serial data encoding scheme could be designed by one skilled in the art of circuit design and thus will not be further discussed here.

Serial data encoding has the advantage that relatively simple digital logic may be used. It has the disadvantage, however, that several edges on external signal 162 are required to transmit each chance to Design Signal A 140 and Design Signal B 142. This means that the data rate is relatively low and the power consumption relatively high compared to other techniques.

Many variations of the serial data encoding scheme disclosed herein are possible without deviating from the teachings of the invention. For example, values for more than two design signals could be transmitted each time a design signal makes a transition.

Any of the encoding techniques shown in FIGS. 8–10 could be further improved by the addition of some form of error checking technique. Since design data is only transmitted when a design signal chances, transmission errors will result in wrong data values being latched by the receiving circuits and the probability of incorrect operation of the emulation system. Common error detection and correction techniques such as parity or cyclic redundancy checking (CRC) could be used.

Figure 11:
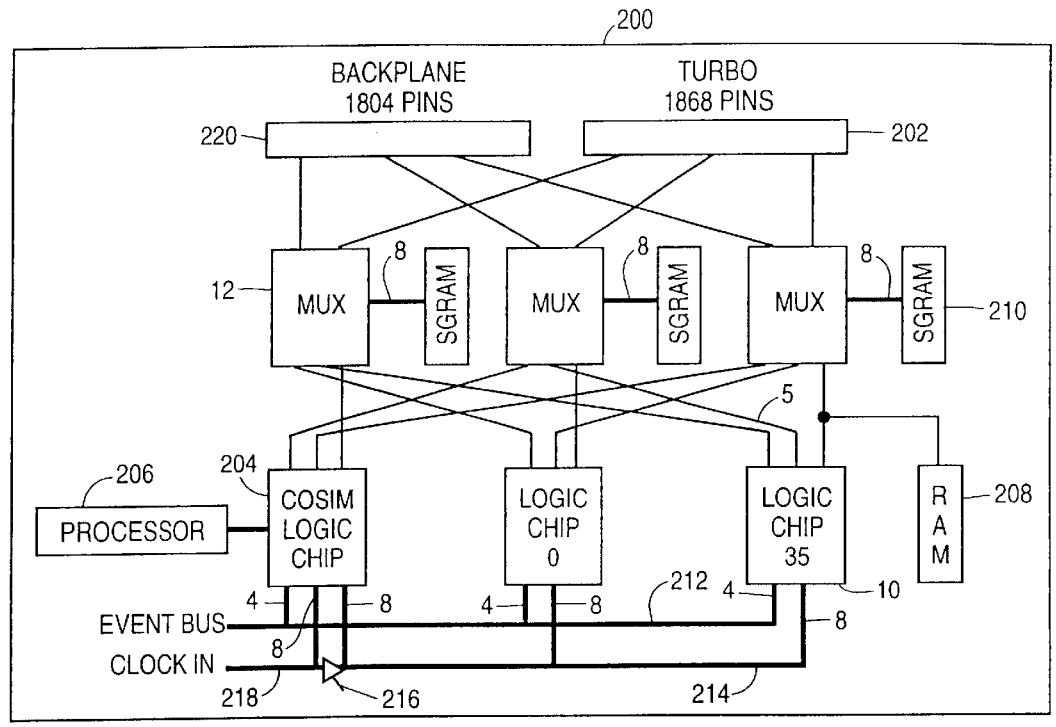
FIG. 11 is a block diagram of a logic board of a preferred embodiment of the present invention.

The system aspects of a preferred embodiment will now be disclosed in more detail. Referring to FIG. 11, a block diagram of the logic board 200 of a preferred embodiment is shown incorporating logic chips (which in the presently preferred embodiment are FPGAs) and Mux chips 12. The logic board 200 has a partial crossbar interconnection similar to that disclosed in Butts et al. The main difference is that the partial crossbar of the presently preferred embodiment of the present invention is not completely uniform because logic chip 204, which will be discussed below, has fewer connections with Mux chips 12 than do the other logic chips. In the presently preferred embodiment, there are fifty-four Mux chips 12 with two-hundred and sixty I/O pins on each and thirty-six logic chips (FPGAs) 10 with two-hundred and seventy I/O pins each. The presently preferred embodiment utilizes FPGAs as logic chips 10 with the part number XC4036XL manufactured Xilinx Corporation, San Jose, Calif., U.S.A. Each of the thirty-six logic chips 10 has five connections to each of the fifty-four Mux chips 12. A thirty-seventh logic chip 204, known herein as the co-simulation (CoSim) logic chip has three connections to each of fifty-four mux chips 12. In a presently preferred embodiment, this thirty-seventh logic chip 204 is also an FPGA manufactured by Xilinx having part number 4036XL. Additional pins (not shown) on Mux chips 12 and logic chips 10 and 204 are reserved for downloading, clock distribution, and other system functions. The purpose of CoSim logic chip 204 will be discussed below. Any of the Mux chip 12 to logic chip 10 connections may be non-multiplexed, multiplexed two-to-one, or multiplexed four-to-one by programming the mux chips 12 and logic chips 10 appropriately.

In addition to the interconnections discussed above, CoSim logic chip 204 is also in electrical communication with a processor 206. In the presently preferred embodiment, the processor 206 is a PowerPC 403GC chip available from IBM corporation. Processor 206 is used for co-simulation, which is described in copending application Ser. No. 08/733,352, entitled Method And Apparatus For Design Verification Using Emulation And Simulation, to Sample et al. The teachings of application Ser. No. 08/733,352 are incorporated herein by reference. Processor 206 is also used for diagnostic functions and downloading information to Mux chips 12, logic chips 10, 204 and RAM 208 (discussed below) and SGRAM 210 (discussed below). The processor 206 is connected through a VME interface (not shown) to backplane connector 220. Twelve of the logic chips 10 also have connections to a 32K by 32 static random access memory (RAM) chip 208. This RAM chip 208 is used for implementing large memories which may be part of an emulated circuit. The RAM 208 is attached to some of the lines also connecting the logic chips 10 to the mux chips 12. In this way, if the RAM is not used, the logic chip 10 to mux chip 12 connections can be used for ordinary interconnect functions and are not lost. If the RAM 208 is needed for implementing memory that is part of a particular netlist, the logic chip 10 that communicates with it has a RAM controller function programmed into it.

Figure 13:
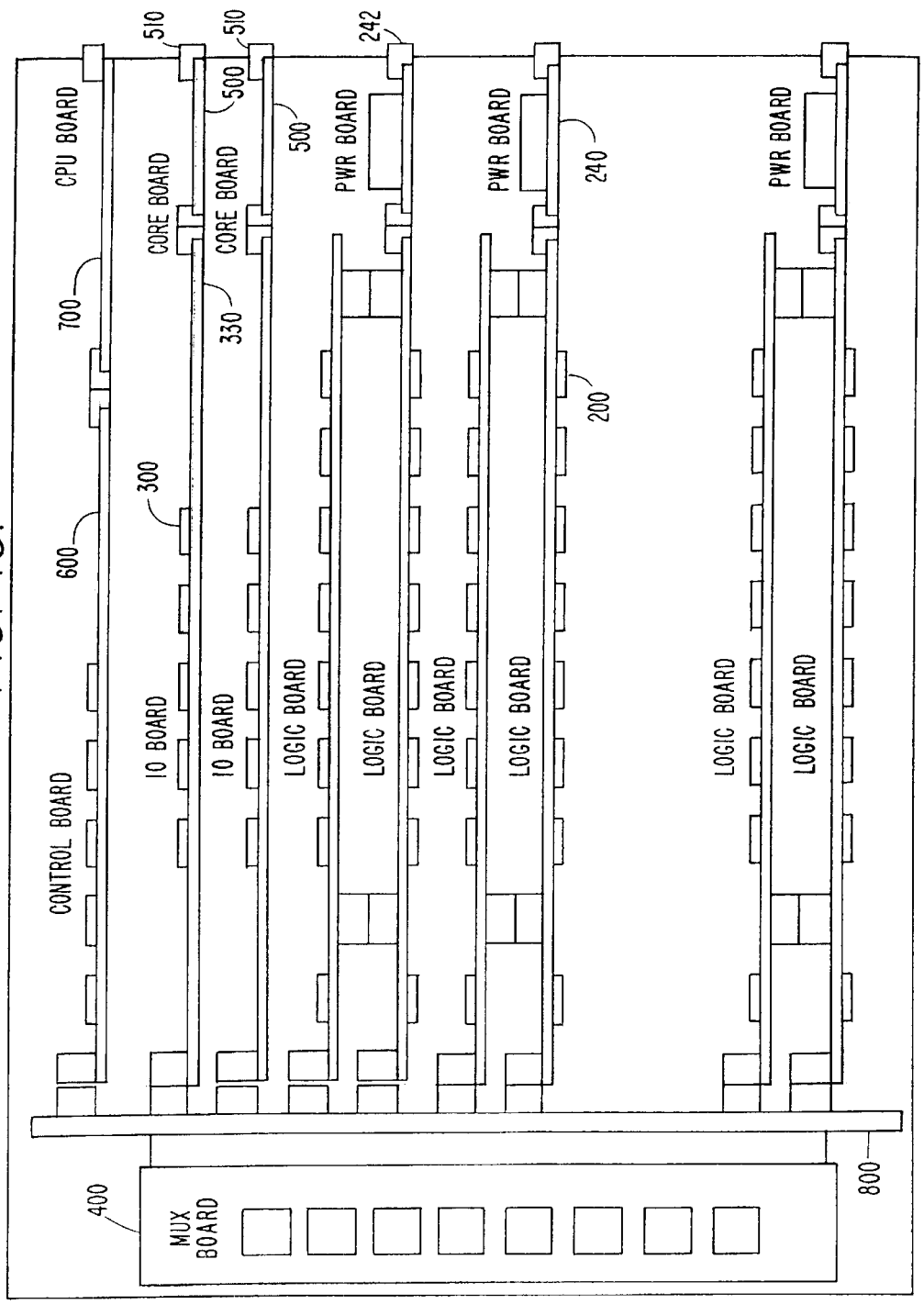
FIG. 13 is a diagram showing the physical construction of a preferred embodiment of the present invention.
Figure 15:
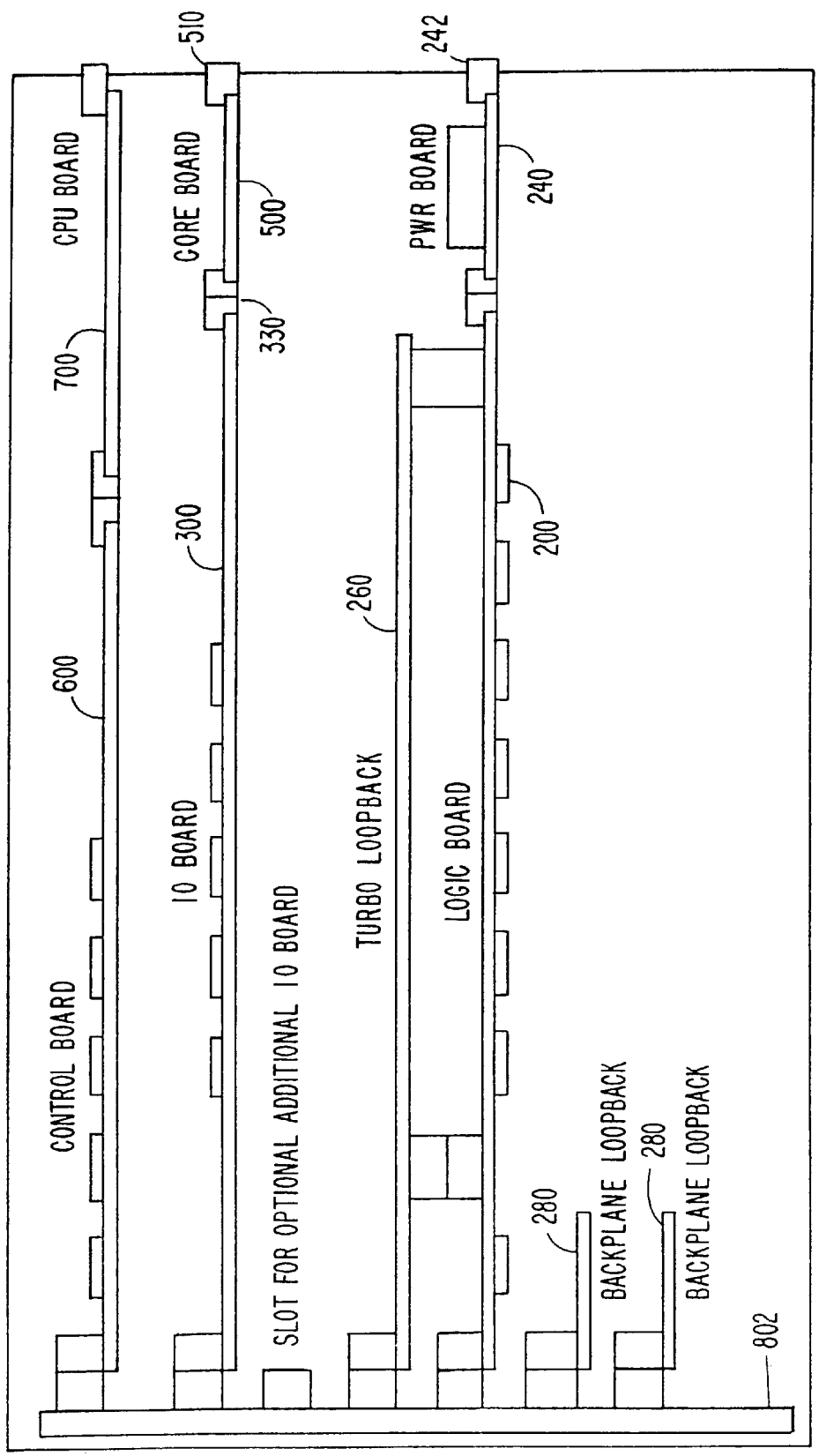
FIG. 15 is a diagram showing the physical construction of the emulation system of FIG. 14 that has one logic board and one I/O board.

The mux chips 12 also have connections to a backplane connector 220 and a turbo connector 202. Backplane and turbo connections may also be either non-multiplexed, multiplexed two-to-one, or multiplexed four-to-one. The turbo connector 202 is used to electrically connect two logic boards 200 together in a sandwich. By providing direct connections between two logic boards in a pair, the number of backplane connections required for a particular design may be reduced. The backplane connector must fit along one edge of the logic board and the number of possible backplane connections is limited by the types of connectors available. If there are insufficient backplane connections, the partitioning software will not be able to operate efficiently, thereby reducing the logic capacity of the board. Two emulation boards connected in a sandwich are shown in FIG. 13. If a smaller emulation system comprising less than two emulation boards is desired, a special turbo loopback board having no logic disposed thereon is used. In such a system, the special turbo loopback board simply routes signals from turbo connector 202 to backplane connector 220. An example of a configuration using a turbo loopback board is shown in FIG. 15.

In addition, the Mux chips 12 have eight connections each to a set of synchronous graphics RAMs (SGRAMs) 210. These SGRAMs 210 are used to form the data path of a distributed logic analyzer. Design signals may be sampled in the logic chips 10 and CoSim logic chip 204 and routed through Mux chips 12 then saved in SGRAMs 210 for future analysis by the user. The logic analyzer is disclosed further below.

Logic chips 10 and CoSim logic chip 204 are also attached to an event bus 212 and a clock in bus 214. The event bus is used to route event signals from within logic chips 10 and CoSim logic chip 204 to logic analyzer control circuitry (shown in FIG. 20a, discussed below). The event bus consists of four signals and is time-multiplexed two-to-one to provide eight event signals. The signals on the event bus 212 are buffered and then routed to additional pins (not shown) on backplane connector 220.

The clock in bus 214 consists of eight low-skew special purpose clock nets which are routed to all logic chips 10 and CoSim logic chip 204 (discussed below). The clock in bus 214 is used to distribute clock signals as is explained in U.S. Pat. No. 5,475,830. Clocks from clock in bus 214 may come directly through buffer 216 from signals 218 which are connected to additional pins (not shown) on backplane connector 220 or they may be created by combining primary clock signals 218 with logic in CoSim logic chip 204. When CoSim logic chip 204 is used for implementing clock logic, it is acting as a "clock generation FPGA" as explained in U.S. Pat. No. 5,475,830.

Figure 12:
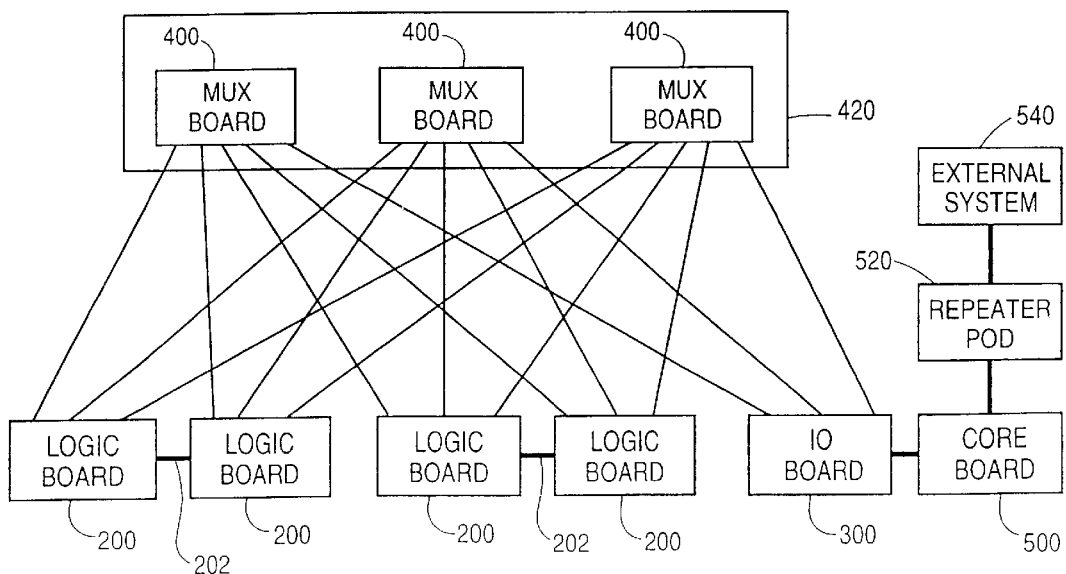
FIG. 12 is a block diagram of the interconnection among the various circuit boards of a preferred embodiment of the present invention.

Referring now to FIG. 12, the interconnection among boards is shown. Logic boards 200 are assembled into pairs which are connected through turbo connectors 202. The logic boards are also connected through the backplane connectors 220 (shown in FIG. 11) to a switching backplane 420. The switching backplane 420 is comprised of mux boards 400 which are disposed at right angles to the logic boards. An arrangement of logic boards and switching boards can be seen in U.S. Pat. No. 5,352,123 to Sample et al and assigned to the same assignee as the present application. U.S. Pat. No. 5,352,123 is incorporated herein by reference in its entirety. The switching backplane 420 also connects to I/O boards 300 (only one I/O board 300 is shown in FIG. 12. However, the use of more than one I/O board 300 is contemplated as part of the present invention). I/O boards 300 serve the functions of routing and buffering signals from external devices contained on core board 500 or external system 540. They also have the ability to provide stimulus signals to all external pins so that the emulated design can be operated in the absence of an external device or system.

I/O boards 300 connect through core board 500 and repeater pod 520 to an external system 540. To simplify FIG. 12, the actual numbers of boards and connections have been reduced. In a presently preferred embodiment, there are twenty-two mux boards 400, one to ten pairs of logic boards 200 and up to eight I/O boards 300. In the presently preferred embodiment, if more than two I/O boards 300 are used, a pair of logic boards 200 are lost for each additional pair of I/O boards 300. In the presently preferred embodiment, each I/O board 300 has one associated core board 500 which has up to seven repeater pods 520 which are attached to cables. Each repeater pod in the presently preferred embodiment buffers eighty-eight bidirectional signals.

FIG. 13 shows the physical construction of the preferred embodiment system. Mux boards 400 are disposed at right angles to logic boards 200 and 110 boards 300. Backplane 800 has connectors on one side for mux boards 400 and on the other side for logic boards 200 or I/O boards 300. To simplify the drawing, only one mux board 400 and three pairs of logic boards 200 are shown. However, in a presently preferred embodiment, there are, in fact, twenty-two mux boards 400 and up to eleven pairs of logic boards 200 or I/O boards 300. I/O boards 300 attach to core boards 500 through connector 330. Core boards 500 have an external connector 510, which attaches through a cable to repeater pod 520 and external system 540 (not shown in FIG. 13). A power board 240 converts from a forty-eight volt DC main power supply to the 3.3 volts necessary to power the logic board. This type of distributed power conversion is made necessary by the time-multiplexing circuitry's high demand for power. In addition, the system contains a control board 600 and a CPU board 700 (see FIG. 20). In a presently preferred embodiment, the CPU board 700 is a VME bus Power-PC processor board available from Themis Computer and others. Other similar processor boards would be suitable. The selection of the particular processor board to use depends on tradeoffs between cost, speed, RAM capacity and other factors. The CPU board 700 provides a network interface and overall control of the emulation system. The control board 600 provides clock distribution, downloading and testing functions for the other boards as well as centralized functions of the logic analyzer and pattern generator (the structure and function of which will be discussed below).

Figure 14:
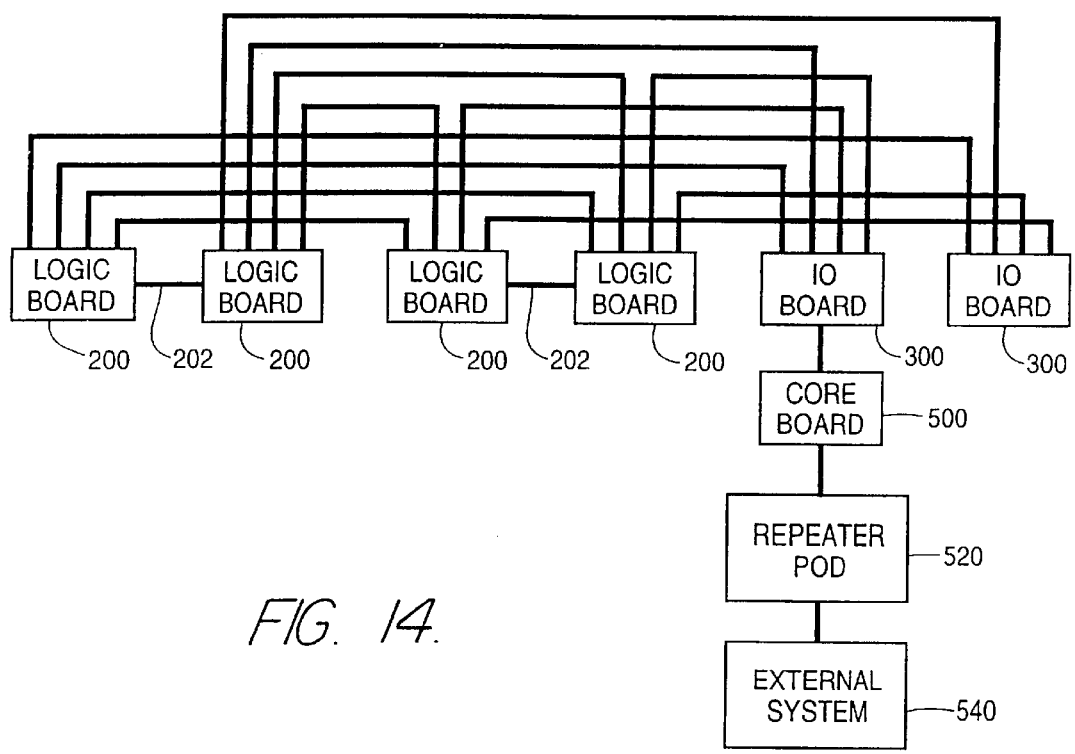
FIG. 14 is a block diagram of the interconnection among the various circuit boards of a version of the presently preferred emulation system that has less logical capacity.

A smaller version of the presently preferred emulation system can also be constructed. A block diagram of this system is shown in FIG. 14. The smaller system does not have a switching backplane 420. Instead, logic boards 200 are connected directly together and to I/O boards 300. This is possible because the size of the system is limited to two pairs of logic boards 200 and one pair of I/O boards 300. The backplane connections are shown at the top of FIG. 14. Pins from each backplane connector 220 (shown in FIG. 10) are divided in to 4 equal groups. Each group is routed through the backplane to one of the two logic boards 200 not in the same pair and to each I/O board 300. It is not necessary to make connections through the backplane to the other logic board 200 or I/O board 300 in the same pair because this connection is provided through the turbo connector 202 in the case of logic boards 200 and is not necessary in the case of I/O boards 300. The connection pattern shown in FIG. 14 provides sufficient richness for good routability between boards but avoids the high cost of a switching backplane 420. As in the large system, I/O board 300 is connected through core board 500 and repeater pod 520 to an external system 540. To simplify the drawing, core board 500, repeater pod 520, and external system 540 are not shown for the second I/O board although they are, in fact, present. By using a set of additional boards to make connections between otherwise unused backplane and turbo connectors, versions of the small system may be constructed with one to four logic boards 200 and either one or two I/O boards 300. These additional boards are turbo loopback board 260 and backplane loopback board is shown in FIG. 15. Neither of these boards have any digital logic on them. They simply route signals between connectors.

A physical drawing of the small system with one logic board and one I/O board is shows in FIG. 15. Backplane 802 provides the connections described earlier with reference to FIG. 14. I/O board 300 is connected through connector 330 to core board 500. Core boards 500 have an external connector 510 which attaches through a cable to repeater pod 520 and external system 540 (not shown in FIG. 15). A power board 240 converts from a forty-eight volt DC main power supply to the 3.3 volts necessary to power the logic board. In addition, the small system contains a control board 600 and a CPU board 700 as in the large system described earlier with reference to FIG. 13. To preserve routing connections when less than four logic boards are used, turbo loopback board 260 connects signals from unused turbo connectors 202 (shown in FIG. 11) of logic board 200 to the backplane 802. The turbo loop back board 260 is used when there are either one or three logic boards 200 in the system. An additional pair of backplane loopback boards 280 are used to preserve routing connections through the backplane when there are unused logic board slots. This occurs when there are either one or two logic boards in the system. The backplane loopback boards 280 connect the groups of backplane signals (shown in FIG. 14) to each other so that no signals are lost when there are otherwise vacant backplane connectors.

Figure 16:
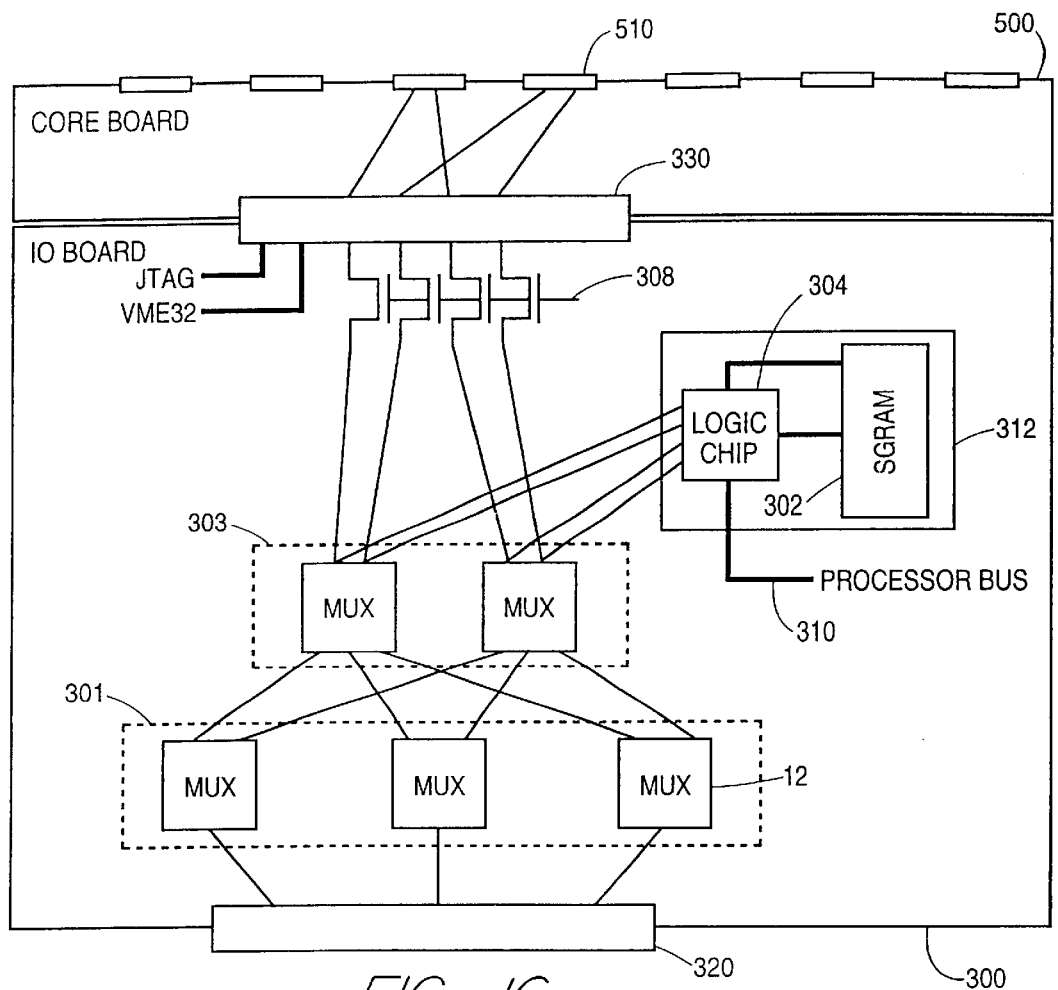
FIG. 16 is a block diagram of an I/O board and core board.

A block diagram of I/O board 300 and core board 500 is shown in FIG. 16. A first row 301 of Mux chips 12 is attached to backplane connector 320 on I/O board 300. To simplify the drawing, only three mux chips 12 are shown in the first row 301. In a presently preferred embodiment, however, there are fourteen Mux chips 12 in the first row 301. A second row 303 of mux chips 12 connects to the first row 301 of Mux chips 12 as well as to field effect transistors (FETs) 30S and logic chips 304. Again, the drawing has been simplified to only show two Mux chips 12 . In a presently preferred embodiment, there are twelve Mux chips 12 in the second row 303. Two rows 301, 303 of Mux chips 12 are required to achieve sufficient routing flexibility so that any arbitrary external signal can be connected to any pin of repeater cable connectors 510 on core board 500. Logic chip 304 also is attached to synchronous graphics RAM (SGRAM) 302. In the presently preferred embodiment, logic chip 304 is a FPGA. Although only one logic chip 304 and one SGRAM 302 is shown, in a presently preferred embodiment, there are six logic chips 304 and three SGRAMs 302 on I/O board 300. Logic chips 304 and SGRAMs 302 provide the capability of driving stimulus vectors into the emulator on any external connection pin. When driving stimulus vectors, FETs 308 are turned off (i.e., are opened) so the stimulus will not conflict with signals from an external system which may be attached through repeater pods 520 to connectors 510. When not driving stimulus vectors, pins of logic chips 304 are tristated and FETs 308 are turned on (i.e., closed) so that signals on connectors 510 may drive or receive signals from second row mux chips 303. In the presently preferred embodiment, logic chips 304 are the XC5215, which is available from Xilinx Corporation, San Jose, Calif., although other programmable logic chips could be used with satisfactory results. In addition to the components shown in FIG. 16, the I/O board 300 contains a processor chip (not shown) which is connected through a VME interface to backplane connector 320. In a presently preferred embodiment, this processor chip is a PowerPC 403GC from IBM corporation, although other microprocessor chips could be used with satisfactory results. The processor chip attaches through processor bus 310 to logic chips 304. Processor bus 310 serves to upload stimulus information into SGRAMs 302. The processor is used for diagnostic functions and for uploading and downloading information from Mux chips 12, logic chips 304 and SGRAMs 302.

Connector 330 attaches core board 500 to I/O board 300. In addition to logic signals coming from FETs 308, this connector 330 receives JTAG signals and is electrically connected to the VME bus. The JTAG signals are for downloading and testing repeater pods 520 which may be plugged into connectors 510. In a presently preferred embodiment, the VME bus is not used with core board 500. However, it is contemplated that the VME bus could be used with other types of boards which may be plugged into connector 330. For example, it is contemplated that a large memory board might be plugged into connector 330 to provide the ability to emulate memories larger than will fit into RAMs 208 (shown in FIG. 11).

Figure 17:
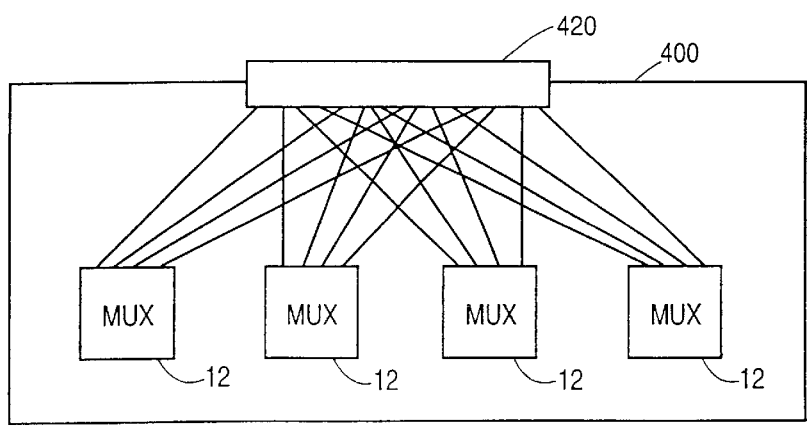
FIG. 17 is a block diagram of a mux board.

Referring now to FIG. 17, a block diagram of mux board 400 is shown. Mux chips 12 attach to backplane connector 420 in a distributed fashion. The drawing of FIG. 17 has been simplified to only show four Mux chips 12. However, in a presently preferred embodiment, there are, in fact, seven Mux chips on mux board 400. Furthermore, there are many more connections to Mux chips 12 than are shown in FIG. 17. These additional connections are arranged similarly to the ones shown. In addition to the Mux chips 12 shown in FIG. 17, mux board 400 contains a JTAG interface (not shown) attached to backplane connector 420 which allows the Mux chips 12 to be downloaded and tested.

Figure 18:
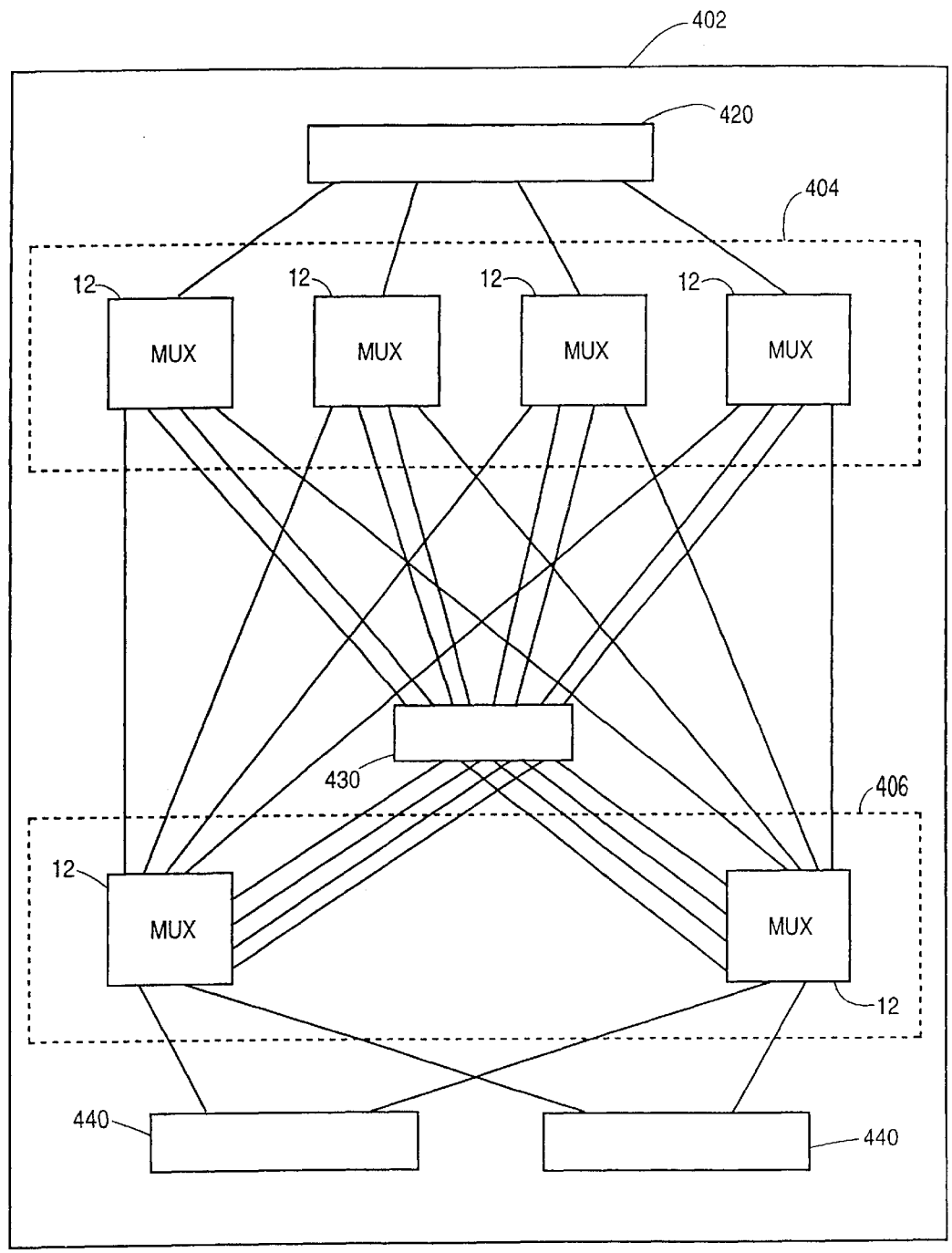
FIG. 18 is a block diagram of an expandable mux board.

The mux board of FIG. 17 is suitable for a non-expandable emulation system. It is often desirable, however, to connect several emulation systems together to form a larger capacity emulation system. In this case, an expandable version of mux board 400 is used. A block diagram of an expandable mux board 402 is shown in FIG. 18. A first row 404 of Mux chips 12 is electrically connected to backplane connector 420. The drawing has been simplified to show only four Mux chips 12 in the first row 404. However, in a presently preferred embodiment, there are ten Mux chips 12 in the first row 404. The first row 404 of Mux chips 12 are electrically connected to a second row 406 of Mux chips 12 and to a turbo connector 430. The second row 406 of Mux chips 12 is also electrically connected to turbo connector 430 and to external connectors 440. Only two Mux chips 12 are shown in the second row 406, and only two external connectors 440 are shown in FIG. 18. However, in a presently preferred embodiment, there are five Mux chips 12 in the second row 406. Furthermore, there are six external connectors 440 in the presently preferred embodiment, Each external connector 440 of the presently preferred embodiment has ninety-two I/O pins. Mux boards 402 are assembled into pairs which are attached together through turbo connector 430. Turbo connector 430 acts to expand the effective intersection area between a pair of mux boards 402 and a pair of logic boards 200. Without the turbo connector 430, the intersection area is too small for effective routability between external connectors 440 and logic boards 200.

Figure 19:
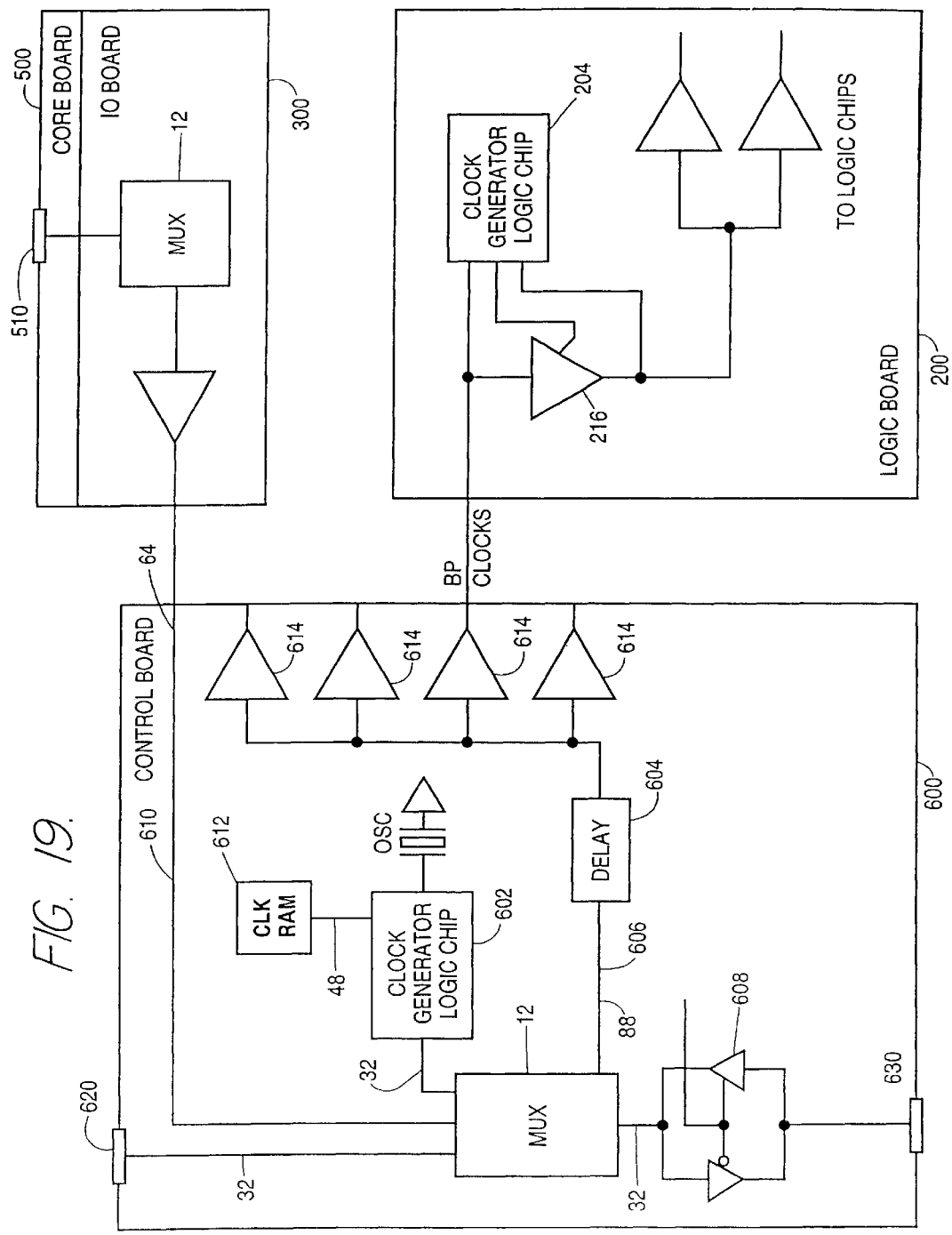
FIG. 19 is a block diagram showing how the user clocks are distributed in a preferred hardware emulation system of the present invention.

With reference to FIG. 19, the manner in which user clocks are distributed in the emulation system is described. Distribution of user clocks is important in emulation system design. As is discussed in U.S. Pat. No. 5,475,830, it is necessary to ensure that user clocks arrive at the logic chips 10 on emulation boards 200 before data signals, assuming that the user clocks and data signals change at the same time in external system 540 (external system 540 is shown in FIGS. 12 and 14). It is possible to satisfy this requirement by delaying the data signals. This solution, however, slows down the maximum operating speed of the emulation system. A more desirable alternative is to make the user clock distribution network as fast as possible so that minimal, if any, delay needs to be added to the data signals.

FIG. 19 shows the clock distribution for a preferred hardware emulation system. Clocks may enter the system either through a clock connector 620 on control board 600, through multi-box clock connector 630 on control board 600, or as a normal signal on connector 510 of core board 500. As discussed, core board 500 is attached to I/O board 300. For simplicity, only one connector 510 is shown in FIG. 19. However, in a presently preferred embodiment, there are seven connectors 510 on each core board 500. Also, the system may contain multiple I/O board/core board combinations. As described earlier with reference to FIG. 12 and 14, connector 510 attaches to repeater pod 520 which connects to an external system 540. If clock connector 630 is used to input clocks, connector 620 will be also attached through a cable to external system 540. Clock connector 620 provides a faster method for clocks to enter the emulation system while connectors 5 10 on core boards 500 provide an easier method for the user.

Connector 510 on core board 500 connects through connector 330 and FETs 308 to a second row 303 Mux chip 12 on I/O board 500 as described earlier with reference to FIG. 16. Second row 303 Mux chip 12 connects to dedicated clock pins on backplane connector 320 in addition to other connections described earlier. In a presently preferred embodiment, there are sixteen of these pins. From I/O board backplane connector 390, clocks connect through backplane 800 or 802 to control board 600 (see FIG. 13). On control board 600, a Mux chip 12 is used to select a combination of clocks from all of the different potential sources. The system may have up to thirty-two distinct clock sources. Any eight of these may be used on a pair of emulation boards 200. This allows different pairs of emulation boards 200 to have different clocks as might be required, for example, ashen more than one chip design was being emulated in a single hardware emulation system. Clocks are routed through programmable delay element 604 and buffers 614 then through backplane 800 or 802 to emulation boards 200. As described earlier with reference to FIG. 11, clocks on emulation board 200 may be routed either through buffer 216 or clock generation logic chip 204 (i.e., CoSim logic chip) before going to logic chips 10.

Logic analyzer clock generator logic chip 602 on control board 600 may also generate clocks. This typically happens when running the system with test vectors. Data from clock RAM 612 is input to a state machine programmed into logic analyzer clock generator logic chip 602 which allows different clock patterns to be created such as return-to-zero, non-return-to-zero, two-phase non-overlapping, etc. Design of such a state machine is well understood to those skilled in the art of control logic design and will not be further described here. From logic analyzer clock generator logic chip 602, the thirty-two generated clocks are communicated to the clock selection Mux chip 12. In a presently preferred embodiment, logic analyzer clock generator logic chip 602 is an XC4036XL device manufactured by Xilinx Corporation, although other programmable logic devices could be used with satisfactory results.

Multi-box clock connector 630 may serve either to input clocks or to output clocks. Direction is controlled by buffer 608. In a multi-box emulation system, i.e., an emulation system comprised of more than one stand-alone emulation system, one box is designated as the master and the others are designated as slaves. The master box produces the clocks on its multi-box clock connector 630 which are then input to all other slave emulation systems through their multi-box clock connectors 630. In a multi-box system, delay element 604 is programmed in the master box to compensate for the inevitable cable delays between the master and slave boxes.

It will be recognized by one skilled in the art that FIG. 19 has been considerably simplified for clarity and that there are a large number of interconnections and components not shown. The need for these additional components and interconnections are a matter of design choice.

Figure 20:
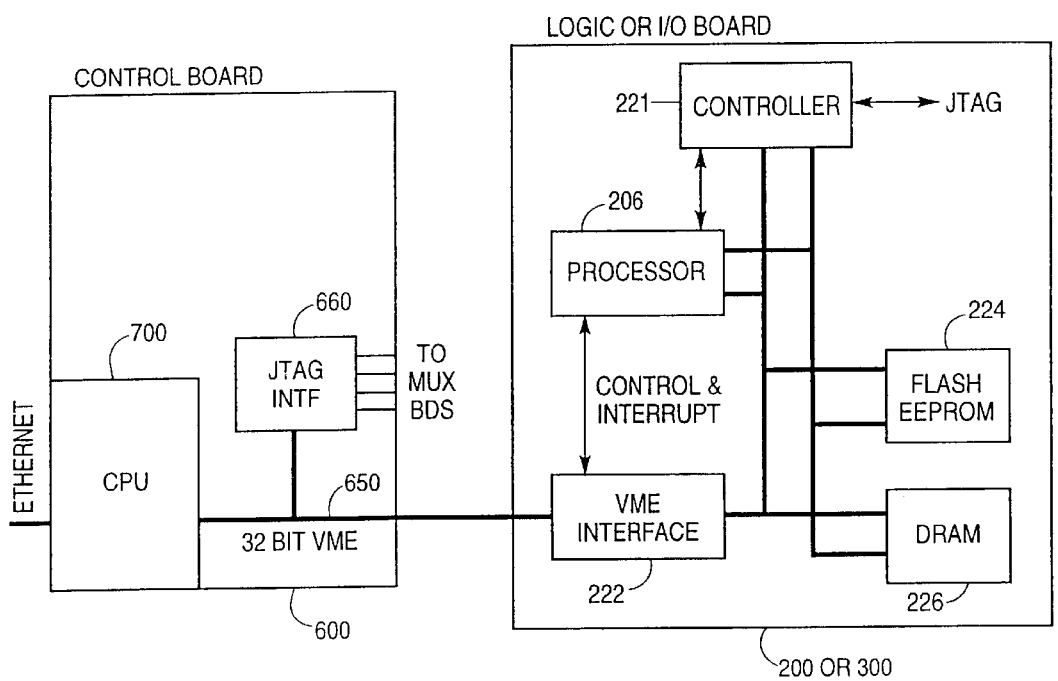
FIG. 20 is a block diagram showing the control structure of a preferred hardware emulation system of the present invention.

Referring now to FIG. 20, the control structure of the hardware emulation system will be discussed. Previous hardware emulation systems have generally suffered from insufficient processing capability. This resulted in long delays when transferring data to or from the system, when loading design data into the system, and when running hardware diagnostics. In a preferred embodiment of the present invention, a two level processor architecture is used to alleviate this problem. A main processor 700 is attached to control board 600. In a presently preferred embodiment, processor 700 is a Power PC VME based processor card available from Themis Computer, although other similar cards could be used with satisfactory results. Processor 700 is electrically connected to the Ethernet and to VME bus 650 on control board 600. VME bus 650 is electrically connected through an interface (not shown in FIG. 20) to backplane 800 or 802, and then to logic boards 200 and I/O boards 300. VME bus 650 also connects through JTAG interface 660 on control board 600 and backplane 800 to the mux boards 400.

Each logic board 200 and I/O board 300 has a local processor with a VME interface and memory. This circuit will be discussed with reference to logic board 200 although a similar circuit exists on each I/O board 300. Processor 206 (shown earlier on FIG. 11) is electrically connected through VME interface 222 to VME bus 650 on backplane 800 or 802. It is also electrically connected to a Controller 221. In a preferred embodiment, controller 221 is comprised of several XC5215 FPGAs from Xilinx Corporation. Controller 221 provides JTAG testing signals to other components on logic board 200. In addition, various devices such as flash EEPROM 224 and dynamic RAM 226 connect to processor 206. Processors 206 can operate independently when doing board level diagnostics, loading configuration data into logic chips 10 or transferring data to and from memories 208 and 210 (shown earlier on FIG. 11).

Figure 20A:
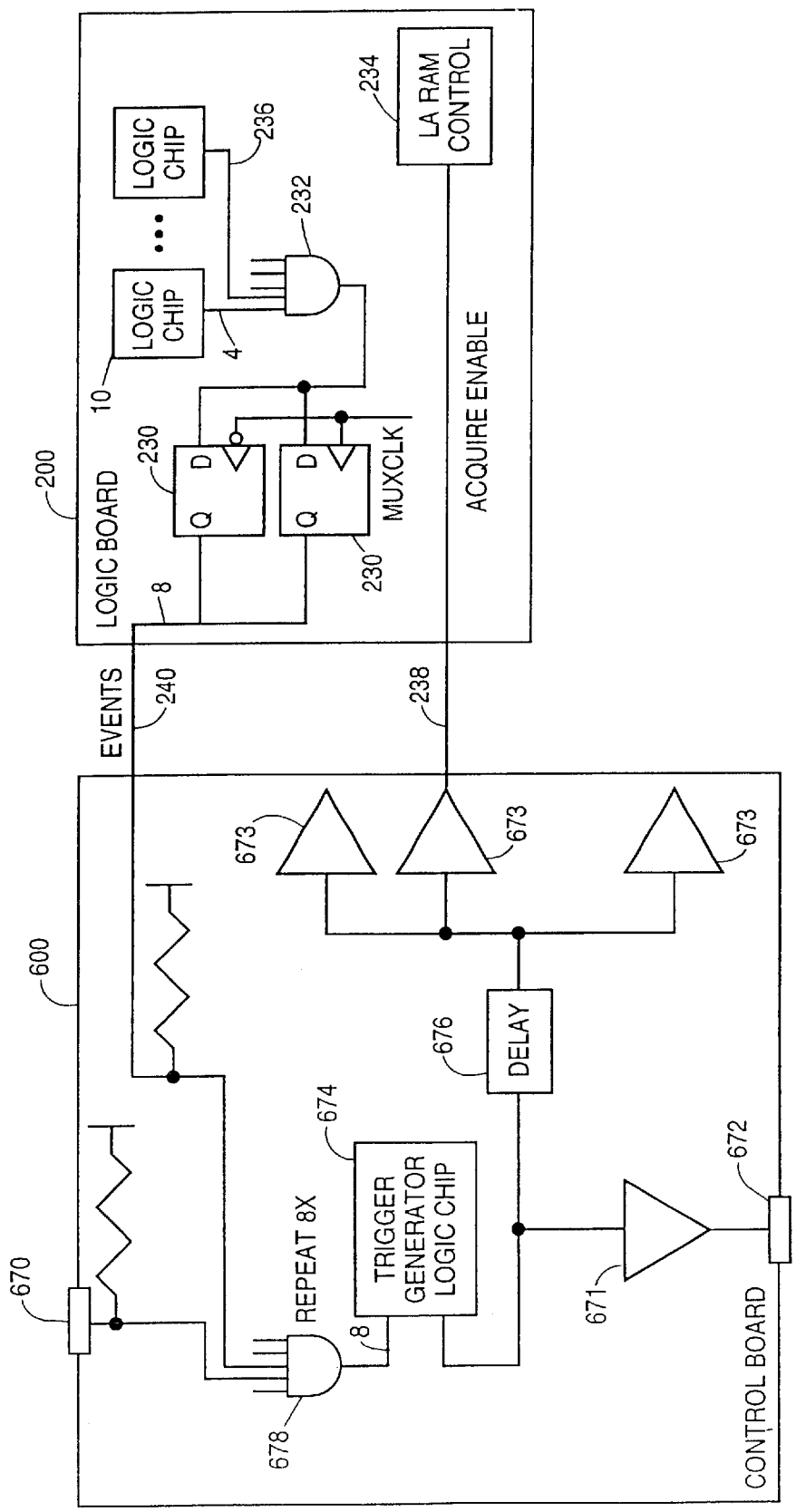
FIG. 20a is a block diagram of the logic analyzer of a preferred embodiment of the present invention.

Referring now to FIG. 20*a*, the logic analyzer circuit for the preferred embodiment system will be discussed in detail. The logic analyzer is distributed. This means that portions of the logic analyzer are contained on each logic board 200 while centralized functions are contained on control board 600. Events, i.e., combinations of signal states in the design undergoing emulation, are generated inside the logic chips 10 and 204 on the logic boards 200. These are combined in pairs and output on signals 236, which are then ANDed together in a special event logic chip 232 (shown in FIG. 20*a* as AND gate 232). The resulting combined event signals are separated into eight signals by flip-flops 230 (for simplicity, only two flip-flops 230 are shown in FIG. 20*a*). Separated event signals 240 then go through the backplane 800 or 802 (not shown in FIG. 20*a*) to the control board 600 where they are again AND'ed by AND gate 678 (which is part of a logic chip) with events from other boards or other boxes. Connector 670 may contribute event signals from other emulation boxes. The final event signals go to the trigger generator logic chip 674 on the control board 600 which computes a trigger condition and conditional acquisition condition and generates an acquire enable signal 238 which controls acquisition of data on the logic boards 200. The output of the trigger generator logic chip 674 is sent through buffer 671 to connector 672 and through delay element 676. The output of delay element 676 is buffered by buffers 673 and sent across backplane 800 or 802 to a logic analyzer memory controller 234 on logic boards 200. The control board 600 also generates the trace and functional test clocks and other logic analyzer/pattern generator signals.

Figure 20B:
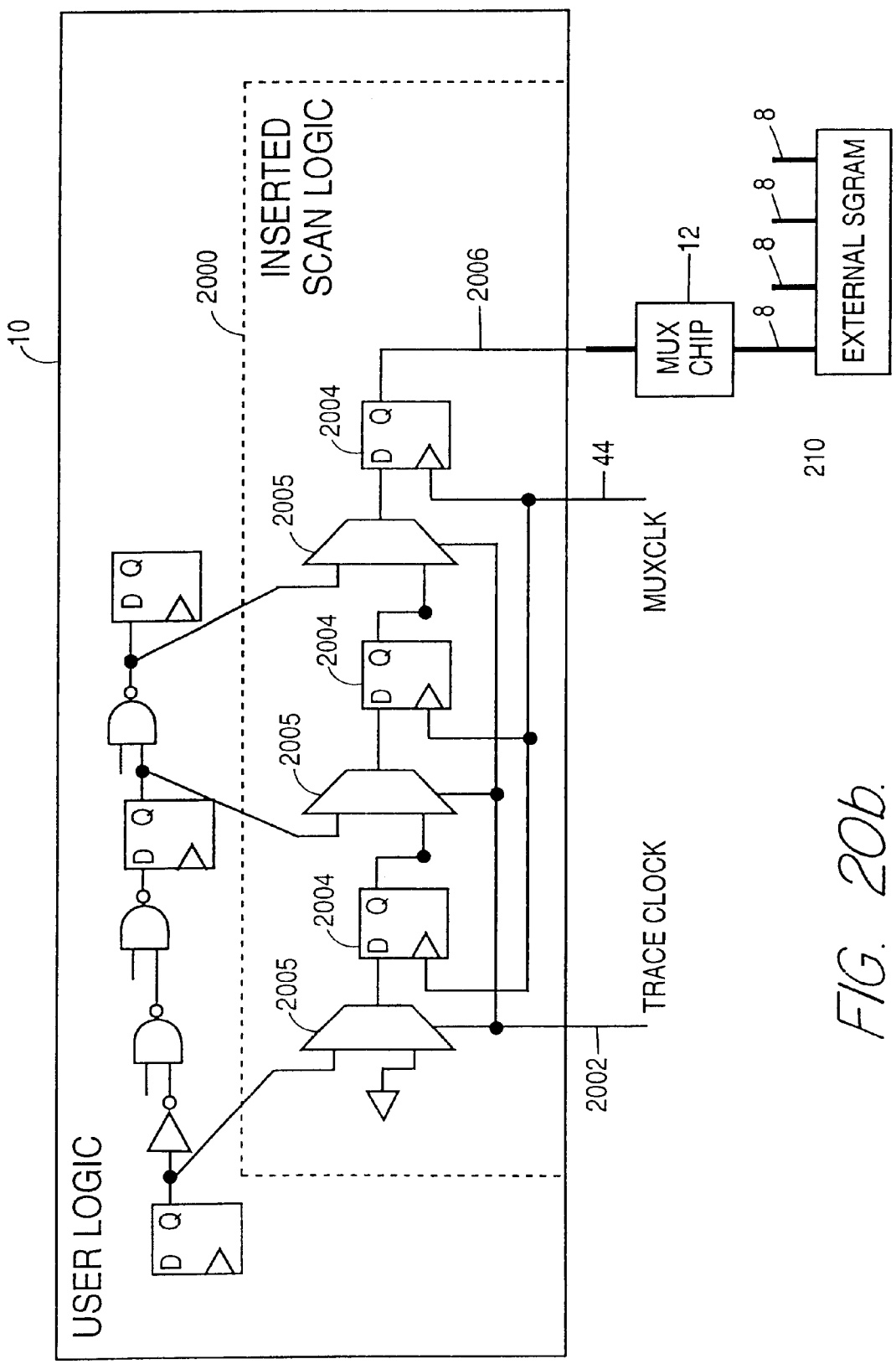
FIG. 20b is a block diagram showing the data path for logic analyzer signals of a preferred embodiment of the present invention.

Referring now to FIG. 20*b*, the data path for logic analyzer signals is shown. Data signals are latched in the logic chips 10 and 204 and scanned out into synchronous graphics RAMs (SGRAMs) 210 on the emulation boards 200. The logic analyzer data path is distributed across all the logic boards 200. Each Mux chip 12 on the logic boards 200 has eight pins connected to a 256K×32 SGRAM 210. The SGRAM 210 operates at high speed while the emulation is running to save logic analyzer data. Data is time-multiplexed anywhere from two-to-one to sixty four-to-one, depending on the desired logic analysis speed, channel depth and number of probed signals as shown in the chart below:

| Logic Analyzer Tradeoffs | | | |
|---|---|---|---|
| Max Speed | Depth | Channels/Logic Board | Time-mux factor |
| 16 MHZ | 128K | 864 | 2-1 |
| 8 MHZ | 64K | 1,728 | 4-1 |
| 4 MHZ | 32K | 3,456 | 8-1 |
| 2 MHZ | 16K | 6,912 | 16-1 |
| 1 MHZ | 8K | 13,824 | 32-1 |
| .5 MHZ | 4K | 27,648 (All Signals) | 64-1 |

The maximum speed numbers shown above are approximate and will vary depending on the logic analyzer design and the multiplexing clock speed.

At a 0.5 MHZ rate, a sufficient number of channels are available so that it is possible to probe every flip-flop or latch in the emulated design simultaneously. When a signal is "probed", the value of the signal at that element or node is read. Generally, this value is then stored in a memory element (SGRAM 210). By reconstructing combinational signals in software, the user can view any set of signals for several thousand clocks around a trigger condition without moving probes or even restarting the emulator. When it is desired to probe a combinational signal, the software examines the design netlist. A cone of logic is extracted in which each combinational logic path leading to the desired signal is traced backwards until it terminates either at a probed storage element (i.e., a flip-flop or a latch) or at an external input of the design. The logic function for the desired signal is then derived in terms of all the storage elements or external inputs contributing to it. Finally, the value of the desired signal is calculated for each instant of time by evaluating the logic function using the previously saved values for all storage nodes and external inputs. The logic function is evaluated at each point where one of the inputs to the logic cone changes. This is done as part of the design debug software.

Figure 20C:
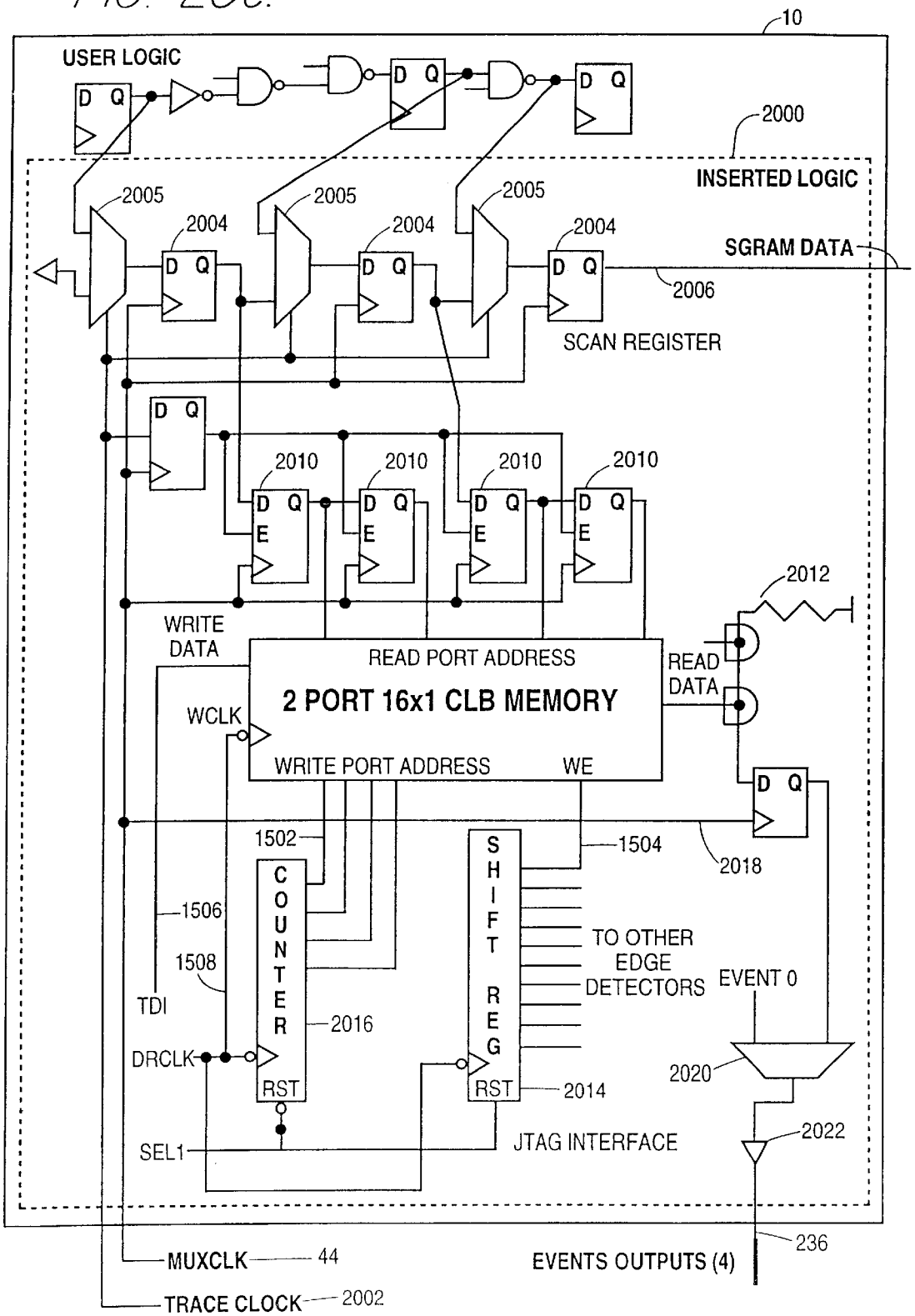
FIG. 20c is a block diagram showing how logic analyzer events are distributed in the logic chips in a preferred embodiment of the present invention.
Figure 20D:
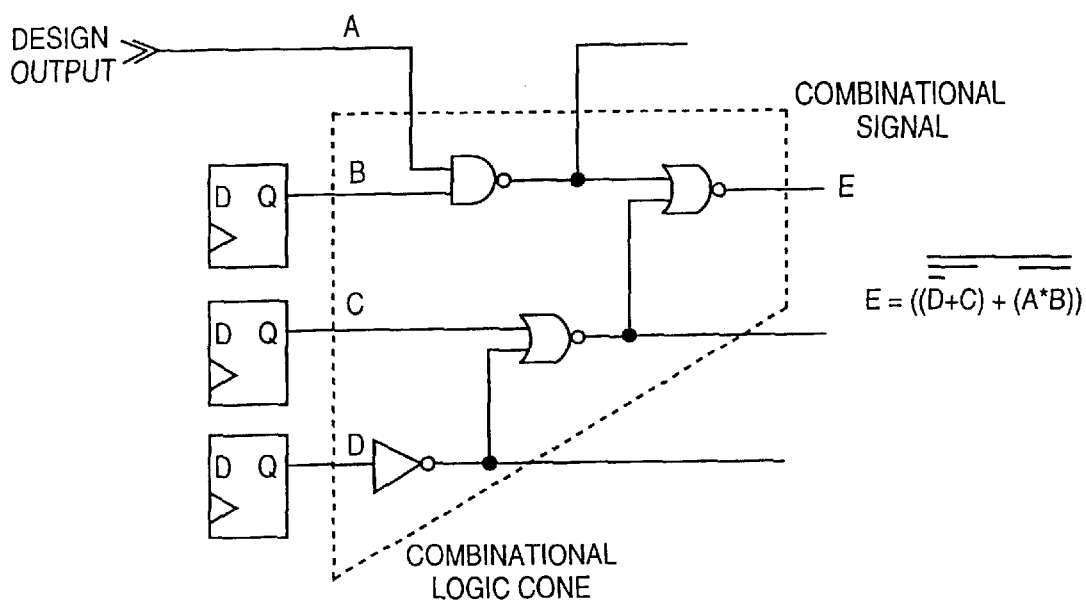
FIG. 20d is a logic diagram showing how probed signals are computed from storage elements and external input values.

For example, in FIG. 20*d*, probed signal E can be calculated by extracting its combinational logic cone which terminates at storage elements B, C, D and design input A. The equation for signal E is evaluated whenever signals A, B, C, D change. A waveform for signal E can then be displayed exactly as if a physical probe were placed on it. This full visibility greatly speeds up debugging for complex design problems. Full visibility can also be available at a higher frequency if the number of flip-flops per logic chip 10 or 204 is limited.

At higher speeds, i.e., speeds higher than 0.5 MHZ, the user must specify which signals to probe. However, because each logic board 200 has its own logic analyzer memories 210, changing the signal being probed is fast. The reason for this is that probes do not need to be routed over the backplane, as in prior art emulation systems.

Referring again to FIG. 20*b*, inside each logic chip 10 or 204, an additional logic circuit 2000 is added to the user's design which is programmed into logic chips 10 or 204. If a custom designed logic chip is used, this logic circuit 2000 could be designed (i.e., hard-wired) into the chip. A number of dedicated scan resisters are added depending on the number of signals to be probed. The maximum depth of the scan registers is determined according to the table above. Each dedicated scan register is also known as a scan chain. Disposed between each scan flip-flop 2004 is a two-to-one multiplexer 2005. The output of each multiplexer 2005 feeds the input D of the scan flip-flop 2004 which follows it. The first input to each multiplexer 2005 is provided by a node in the user's design. The second input to each multiplexer 2005 is provided by the output Q of the preceding scan flip-flop 2004. The select input to the multiplexers 2005 is trace clock 2002, the function of which is discussed below. The scan flip-flops 2004 are clocked by the Mux Clock Signal 44. Together, a series of scan flip-flops 2004 and multiplexers 2005 form a scan register or scan chain. Depending on the length of scan chains and the number of signals to be probed, each logic chip 10 or 204 will have zero, one, or a plurality of scan chains. The number of scan chains in a given chip depends on the number of flip-flops or signals to be probed. As explained later, the software will assign signals to scan chains to minimize the number of chains and simplify the chip routing. In a preferred embodiment, a maximum of twelve scan chains and twelve I/O pins per logic chip 10 or 204 are required in order to probe all flip-flops or latches in an emulated design. To achieve the fastest possible logic analyzer operating speed, the scan chains and SGRAMs 210 operate at twice the time-multiplexing frequency. A bit of data is output on each scan output pin 2006 for every cycle of the time-multiplexing clock.

Referring now to FIG. 20c, logic analyzer events are also distributed on the logic boards 200. This avoids the need to route design signals contributing to events over the backplane 800 or 802. Events are detected using additional dedicated logic 2000 inserted into each logic chip 10 or 204 on the logic boards 200.

Signals contributing to events are latched by the same scan flip-flops 2004 used for logic analyzer data and previously shown in FIG. 20b. These signals are then routed to JTAG programmable edge detectors comprising CLB memories 2018 (CLB memory is memory available on the logic chips 10, 204) which are then AND'ed together using wide edge decoder 2012 to form eight event signals. The eight event signals inside each logic chip 10, 204 are combined two to a pin using multiplexer 2020 and output to the emulation board as event signals 236 (also shown in FIG. 20a) where they are again AND'ed with the event signals from other FPGAs. The board level event signals are transmitted over the backplane to the control board where they are AND'ed with event signals from other emulation boards and other boxes. The resulting system wide event signals go the trigger logic chip 674 on the control board where they are used to generate an acquisition enable and other logic analyzer control signals.

Signals contributing to events may be defined by the user of the emulation system before compilation by filling out a form that is displayed to the user prior on the workstation connected to the emulation system. If this is done, sufficient configurable logic blocks (CLBs) in the logic chips 10, 204 (CLBs are the logical building blocks used to implement functionality in logic chips 10, 204) will be reserved during the compilation process to allow all the necessary event logic to fit. Any number of signals can be predefined with only a minimal impact on capacity (approximately four CLBs per signal). New signals can also be added after the full compile is complete. This will require an incremental recompilation and redownload to create additional edge detectors and route the new signals. Once all signals contributing to events have been defined, the user has total flexibility to change event conditions on the fly while the emulation is running. Breakpoints, trigger conditions and conditional acquisition conditions can be modified and the logic analyzer restarted without stopping the emulation. This is made possible by using JTAG programming to set up the event logic.

FIG. 20c shows an logic chip 10 or 204 with all the event and scan logic inserted. The design is divided into scan registers comprised of scan flip-flops 2004 and multiplexers 2005, event register comprised of flip-flops 2010, a JTAG interface 2016 and 2014, a set of edge detectors 2018 and wide edge decoder 2012.

Event signals cannot be saved in the scan flip-flops 2004 because the contents change as the logic analyzer data is shifted out. Thus, event flip-flops 2010 are used to remember the current and previous state for all signals contributing to events. The event register 2010 is clocked once on the next scan clock after the scan register 2004 has been loaded by Trace Clock Signal 2002 (discussed below). Alternatively, the scan register 2004 could be a parallel shadow register and tristate buffers could be used to load the scan data onto the scan output pins.

Outputs from the event flip-flops 2010 are used as inputs to the edge detectors 2018. Edge detectors 2018 are comprised of dual port CLB memories. Each CLB memory is loaded to perform the desired level/edge detection for two input signals and produces one event output. The outputs from all the CLB memories belonging to one event are AND'ed together using the built-in wide decoders 2012 to form one event signal for this logic chip 10. Event signals are then combined using a multiplexer 2020 and output to a tristate buffer 2022 at the I/O pin. Every time a user signal is needed for any event, it is attached to all eight events so event definitions can be changed at run time.

The CLB memory used in edge detector 2018 is programmed over the JTAG bus. This is done with a counter 2016 and decoder 2014 by using the dual port memory feature of the preferred embodiment logic chip 10, 204. For large numbers of event circuits, creating and routing select signals from decoder 2014 can take a significant fraction of the logic chip 10 gate capacity. As an alternative, a shift register can be created containing all edge detector memories 2018. This alternative, however, prevents random access.

Each signal contributing to an event requires approximately four CLBs plus a small amount of overhead for the JTAG interface. It is assumed that whenever a signal is added, the necessary logic is inserted to allow it to be used as part of any or all of the eight events. If the user specified exactly which event the signal was to be used for, only one-half of a CLB would be required, but this would significantly restrict the ability to make changes to event conditions while the emulation was running.

The edge detection memory 2018 for each signal/event combination is programmed to detect one of the following conditions:

| | Event Conditions | |
|---|---|---|
| Equation | Mnemonic | Description |
| A=0 | 0 | 0 Level |
| A=1 | 1 | 1 Level |
| A=0 & B=1 | F | Falling Edge |
| A=1 & B=0 | R | Rising Edge |
| A xor B | E | Any Edge |
| A-0 & B=0 | S0 | Stable at a 0 |
| A=1 & B=1 | S1 | Stable at a 1 |
| A xnor B | S | Stable at a 1 or 0 |
| 0 | — | Don't use signal |

A logic analyzer cycle starts with the Trace Clock Signal 2002. Trace Clock 2002 is not a tightly controlled signal. It is only guaranteed valid at the rising edge of the Mux Clock Signal (MUXCLK) 44. Trace Clock 2002 causes a synchronous sample of data to be saved in all the scan chains. It also starts the event computation. The board level events are sent to the control module 600 where they are AND'ed together and used to control the trigger generator state machine 674. After several trace clock periods, the trigger generator produces an Acquire Enable signal 238 that controls writing of data to the SGRAM 210 on logic boards 200. The circuit then remains inactive until the next Trace Clock 2002.

Logic analyzer data is stored in RAMs on each emulation board. As stated earlier, each logic board 200 contains-fifty-four mux chips 12, each of which has eight pins connected to an SGRAM 210. Thus, there are 54*8=432 data channels in the RAM. Logic analyzer data is stored in basic units called frames. A frame is generated following each trace clock 2002 and consists of all the data shifted out once from the logic chip 10 or 204 scan chains. A frame may fill from two to sixty-four RAM locations and take two to sixty-four Mux Clock signal (MUXCLK) cycles to generate. A typical frame looks as follows:

| | Data Channels (432) |
|---|---|
| Frame 0 | Data 0 |
| | Data 1 |
| | Data 2 |
| | Data 3 |
| Frame 1 | Data 0 |
| | Data 1 |
| | Data 2 |
| | Data 3 |

A minimal frame would take only two RAM locations. Frame length is always a multiple of two. Therefore, legal lengths are two, four, eight, . . . sixty-four RAM locations. To meet the SGRAM 210 timing requirements, sequential writes within a frame are done into opposite banks of the memory. For the minimum size frame, one word of data is stored in the low RAM bank and one word in the high RAM bank.

Logic board memory is 256K words deep. The memory is divided equally into thirty-two self-contained blocks, each of which has 8192 words and may include between 4096 and 128 frames depending on the frame length. Blocks are fixed length and always start on 8K word boundaries. Within a block, frames may be stored in random order but there is no overlap of frames between blocks. All frames from a later block will have a higher timestamp value than all frames from an earlier block.

The depth of logic board memory 210 is dependent on the designers choice and the depth of memory chips available. Deeper memories may be used in the future as larger SGRAMs become available.

A timestamp value is saved in a clock RAM 612 (shown in FIG. 19) on the control board 600 each time a frame is saved on the logic boards 200.

The logic analyzer supports a conditional acquisition option. This means that individual frames may or may not be written into memory depending on the value of one of the event signals and/or the current state of the trigger state machine. Conditional acquisition allows more efficient use of the memory since only significant data is saved. Conditional acquisition is controlled by an Acquire Enable Signal 238 generated on the control board 600. There is a pipeline delay of approximately four trace clocks after a trace clock 2002 to generate the Acquire Enable Signal.

Because of the delayed Acquire Enable Signal, it is not possible to determine at the time data is available whether it is supposed to be saved or not. Data is, therefore, always saved into memory and overwritten later if the delayed Acquire Enable Signal shows that it was not good. This results in the data being saved into memory in essentially random order. The correct data order is recovered after the logic analyzer stops by sorting the timestamps saved in clock RAM 612 and distributing a set of pointers to each logic board processor 206. The pointers show the physical memory location of each sequential data sample. The out-of-order data is limited to one block of the memory because it is necessary to handle wraparound of the memory address counter. The oldest block of data must be discarded as soon as the address counter writes again into the first location of the block.

The logic analyzer control logic chip 674 on the control board also has a Block Register in which five bits of data are saved after each block is written (one-hundred sixty bits total). Four of these bits are the value of the Acquire Enable Signal for each of the last four frames written. One extra bit specifies whether the block was written in sorted order. This is equivalent to saying that Acquire Enable was valid for each trace clock during the block.

To force blocks not to overlap, the last four frames in each block will always be written, regardless of the state of the Acquire Enable Signal. These last four frames may or may not contain good data. The control module processor examines the corresponding Acquire Enable bits in the Block Register to see whether the data is good or not. The number of actual data frames in a block may, therefore, vary by four.

This needs to be taken into account when creating the set of pointers for the emulation boards. The last four words of data saved before the logic analyzer stops also may or may not contain good data. This can be determined by flushing the Acquire Enable pipeline into the Block Register after the logic analyzer stops.

The control module processor 700 is able to read the address of the last frame stored before the logic analyzer was stopped from logic analyzer control chip 674. This is used to determine the last data block written. The first data block is either block 0 if the address counter did not overrun or the next higher block. One additional status bit is necessary which is set when the address counter overruns for the first time.

The last data block being written when the logic analyzer stopped will probably contain some old frames written during the previous wrap-around of the address counter. These must be discarded. The frames to be discarded can be determined by sorting with the timestamp value and discarding any frames that have a timestamp earlier than the earliest timestamp in the first data block.

For example, assume that the frame length was one (instead of two to sixty-four), there were eight frames per block (instead of 4096) and the memory had a depth of twenty-four (instead of 262,144). The logic board and control board memories might have the following data after the logic analyzer stopped:

| | Logic Board | Control Board | Block Register | |
|---|---|---|---|---|
| Address | Data Memory | Timestamp | Sorted | Acq. Enable |
| 0 | 28 | 43 | 0 | 0111 |
| 1 | 18 | 47 | | |
| 2 | ←Counter 17 | 45 | | |
| 3 | 92 | 4 | | |
| 4 | 93 | 5 | | |
| 5 | 94 | 6 | | |
| 6 | 95 | 7 | | |
| 7 | 96 | 8 | | |
| 8 | 3 | 13 | 0 | 0101 |
| 9 | 1 | 10 | | |
| 10 | 2 | 12 | | |
| 11 | 5 | 27 | | |
| 12 | 7 | 29 | | |
| 13 | 14 | 30 | | |
| 14 | 8 | 31 | | |
| 15 | 27 | 32 | | |
| 16 | 3 | 33 | 1 | 0111 |
| 17 | 9 | 34 | | |
| 18 | 10 | 35 | | |
| 19 | 11 | 37 | | |
| 20 | 12 | 39 | | |
| 21 | 13 | 40 | | |
| 22 | 14 | 41 | | |
| 23 | 17 | 42 | | |

Address Overflow Bit = 1

The address counter stopped at location 2 and the Address Overflow bit is set. This means that the block from location 0 to 7 is the last block and the block from location 8 to 15 is the first block. By looking at the Acquire Enable bits stored for the first block, it can be determined that the frames at the end of the first block at locations 12 and 14 are good and the frames at the end of the first block at locations 13 and 15 are bad. All other frames in the block are good, otherwise the address counter would not have incremented to the next block. After sorting by timestamp and removing the bad data, the first block is:

| Address | Emulation Board Data Memory | Control Board Timestamp |
|---|---|---|
| 9 | 1 | 10 |
| 10 | 2 | 12 |
| 8 | 3 | 13 |
| 11 | 5 | 27 |
| 12 | 7 | 29 |
| 14 | 8 | 31 |

Note: The last four frames in a block will always be in sorted order so bad frames may be removed either before or after sorting by the timestamp.

The second block is processed next. The frame at address 23 is bad in the second block starting at address 16. The block does not need to be sorted because the Sorted bit for this block is set in the Block Register. After removing the bad frame, the block looks like:

| Address | Emulation Board Data Memory | Control Board Timestamp |
|---|---|---|
| 16 | 3 | 33 |
| 17 | 9 | 34 |
| 18 | 10 | 35 |
| 19 | 11 | 37 |
| 20 | 12 | 39 |
| 21 | 13 | 40 |
| 22 | 14 | 41 |

The last block, starting at address 0 is now processed. First the frame is sorted by timestamp to give:

| Address | Emulation Board Data Memory | Control Board Timestamp |
|---|---|---|
| 3 | 92 | 4 |
| 4 | 93 | 5 |
| 5 | 94 | 6 |
| 6 | 95 | 7 |
| 7 | 96 | 8 |
| 0 | 28 | 43 |
| 2 | 17 | 45 |
| 1 | 18 | 47 |

Next, all frames with timestamps earlier than the first timestamp, in the first block (10) are discarded. This leaves only three frames in the block.

| Address | Emulation Board Data Memory | Control Board Timestamp |
|---|---|---|
| 0 | 28 | 43 |
| 2 | 17 | 45 |
| 1 | 18 | 47 |

The Block Register Acquire Enable bits for the last frame contain the last values from the Acquire Enable pipeline. The register contents for this block are 0111. This means that the last frame at address 1 is bad and the other two frames at address 0 and 2 are good. The low order bit is meaningless since only three frames have been written to this block. The last block then looks like:

| Address | Emulation Board Data Memory | Control Board Timestamp |
|---|---|---|
| 0 | 28 | 43 |
| 2 | 17 | 45 | and the complete set of recovered data is:

| Address | Emulation Board Data Memory | Control Board Timestamp |
|---|---|---|
| 9 | 1 | 10 |
| 10 | 2 | 12 |
| 8 | 3 | 13 |
| 11 | 5 | 27 |
| 12 | 7 | 29 |
| 14 | 8 | 31 |
| 16 | 3 | 33 |
| 17 | 9 | 34 |
| 18 | 10 | 35 |
| 19 | 11 | 37 |
| 20 | 12 | 39 |
| 21 | 13 | 40 |
| 22 | 14 | 41 |
| 0 | 28 | 43 |
| 2 | 17 | 45 |

Figure 21:
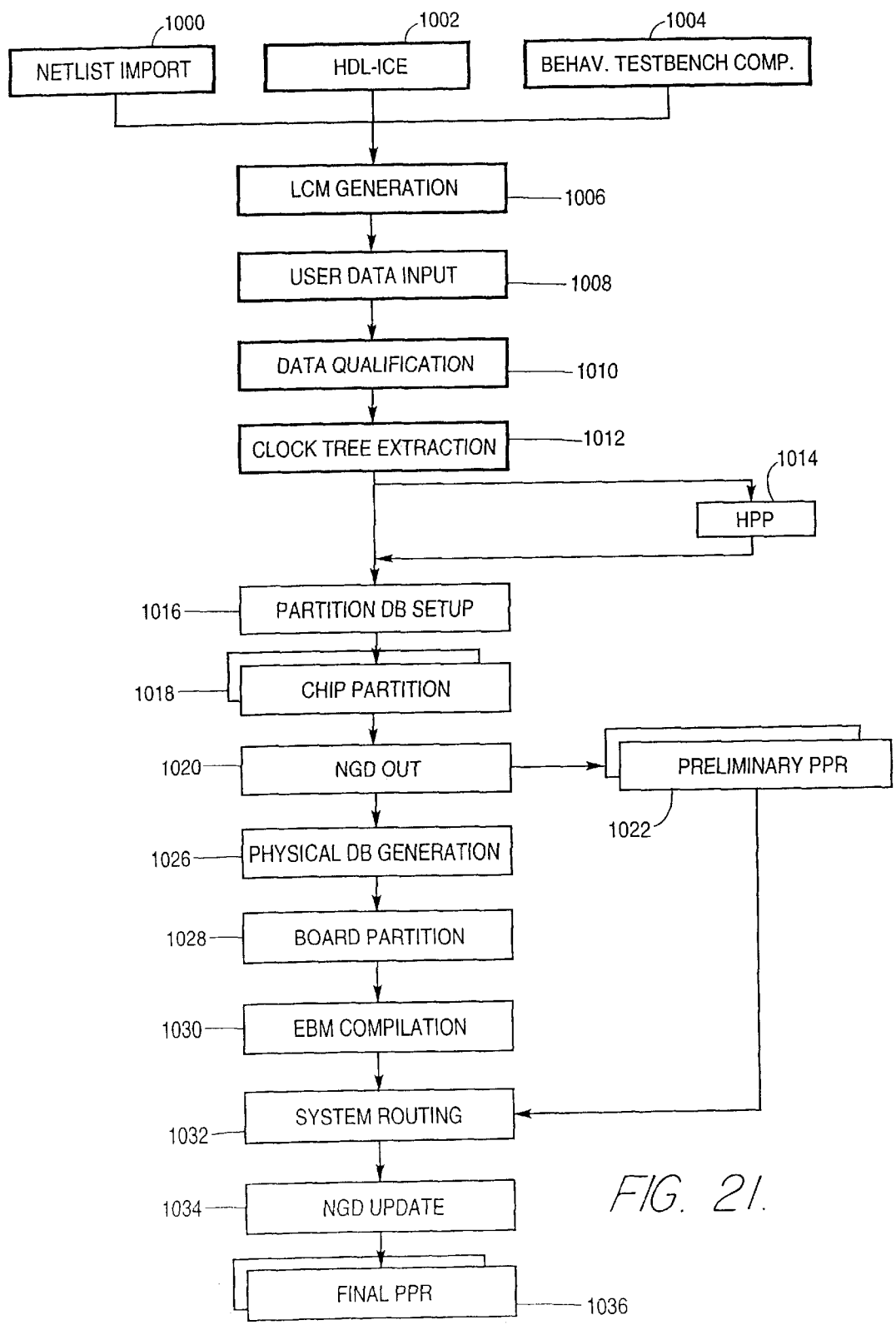
FIG. 21 is a flow chart showing how to program a preferred embodiment of the hardware emulation system of the present invention.

The software required to program the preferred embodiment system will now be discussed. The software is updated from, and therefore different than the software previously disclosed in U.S. Pat. Nos. 5,109,353., 5,036,473, 5,448,496 and 5,452,231 and 5,475,830, the disclosures of which are all incorporated herein by reference. A flow diagram is shown in FIG. 21.

The source netlist could be directly imported by the netlist importer 1000, produced by a logic synthesis program 1002 such as HDL-ICE™ brand logic synthesis software available from Quickturn Design Systems, Inc., or generated by behavioral testbench compiler 1004. Netlist importer 1000 is capable of taking gate level text netlists in a variety of formats such as EDIF and Verilog and converting the netlists into an internal database netlist format which is represented by database logical libraries that contain hierarchically defined cells, generic cells, and special hardware cells. Special hardware cells include memory specification cells, microprocessor cells, and component adaptor cells. Some of the hierarchically defined cells have a flag that prevents them from being flattened and split among several logic chips 10 to avoid timing problems when routing between chips. The choice and design of netlist import software is a matter of design choice and will not be discussed further. As discussed, a flattened cell is one which contains no hierarchical cells. It only contains the most primitive components such as simple logic gates.

HDL-ICE™ brand logic synthesizer 1002, which is the presently preferred logic synthesizer 1002, takes register-transfer-level (RTL) Verilog or VHDL netlists and converts them through a logic synthesis process into the database format used by the netlist importer and other compilation steps. Other suitable synthesis products are commercially available from Synopsis Corporation and others, although the HDL-ICE™ brand logic synthesizer has some advantages such as better integration and higher operating speed.

Behavioral testbench compiler 1004 allows behavioral testbenches described in Verilog or VHDL to be emulated. Code executing in parallel on processors 206 of one or more logic boards 200 is tightly coupled through co-simulation logic chip 204 to other logic which man come through netlist import program 1000 or HDL-ICE™ brand logic synthesizer. Code executing on processors 206 may be a behavioral (non-synthesizable) representation of a logic design while other logic is in a gate level, (synthesizable) RTL representation.

Logic cell memory (LCM) generator 1006 replaces memory specification cells from the user's design that will be implemented using memories built into the logic chips 10, with hierarchically defined cells (hard macros) that define memory cell implementation including, possibly, the mapping to configurable logic blocks within the logic chips 10 and their relative location inside each logic chip 10.

User data input program 1008 allows the user to enter information necessary for the design compilation, such as clock information, probe information, special net information, etc. This information aids the emulation system in handling certain conditions that can cause problems during the emulation if not handled in a special manner.

Data qualification program 1010 verifies correctness of the netlist and user data. It finds common netlist errors such as undriven inputs or multiple outputs attached to a net.

Clock tree extraction program 1012 extracts the clock tree from hierarchical netlist and identifies clock terminals on all levels of design hierarchy. A description of the operation of this step is disclosed in detail in U.S. Pat. No. 5,475,830.

Hierarchical partition planning program (HPP) 1014 is used for the physical module chip partitioning algorithm. It identifies the portions of the design to be mapped to each logic board 200.

Partition DB setup 1016 prepares the database for parallel execution of the chip partitioning program for each portion identified by HPP 1014.

Chip partitioning program 1018 identifies the clusters of logic to be implemented in each separate logic chip 10.

NGD Out program 1020 creates NGD files corresponding to each chip based on the results of chip partitioning. NGD is a file format common to various software programs available from Xilinx Corporation. NGD files contain logic and routing information necessary to implement a logic design into logic chip. As discussed, in the presently preferred embodiment, logic chips from Xilinx are utilized. The NGD Out program 1020 translates database information into the NGD format. NGD Out program 1020 also starts parallel partition, place and route (PPR) jobs 1022 for the individual logic chips 10 with an arbitrary I/O pin assignment. PPR program 1022 is a program commercially available from Xilinx Corporation which produces programming files for the FPGAs Xilinx manufactures.

Physical DB Generation program 1026 prepares the physical database to be used by board partitioning program. The physical database contains information about the physical connections between logic chips 10 and Mux chips 12 for each board in the system.

Board partitioning program 1028 identifies the placement of logic gates into logic chips within each pair of logic boards 200. It considers the limitations on memory instances that can be implemented on each logic board 200, the logic analyzer probe channels limitation, the one microprocessor per board limitation as well as backplane and turbo connector limitations.

EBM compilation program 1030 combines all remaining memory specification cells assigned to the same logic board 200 into no more than twelve groups corresponding to the RAMs 208 (previously shown on FIG. 1). The I/O signals that connect to SRAM chips 208 are marked with corresponding pin numbers.

System routing module 1032 selects the physical nets and time-division multiplexing (TDM) phases to implement logical nets that cross the chip boundaries. It assigns pin numbers and TDM phases to all chip I/O pins. It also produces the programming data for Mux chips 12 and repeater pods 520.

NGD update program 1034 starts final incremental PPR jobs 1036 for each logic chip 10 providing the final connectivity of TDM logic and I/O assignment. When the jobs are successfully completed, the compilation is finished.

Details of the functionality of the various programs will now be described further.

Figure 22:
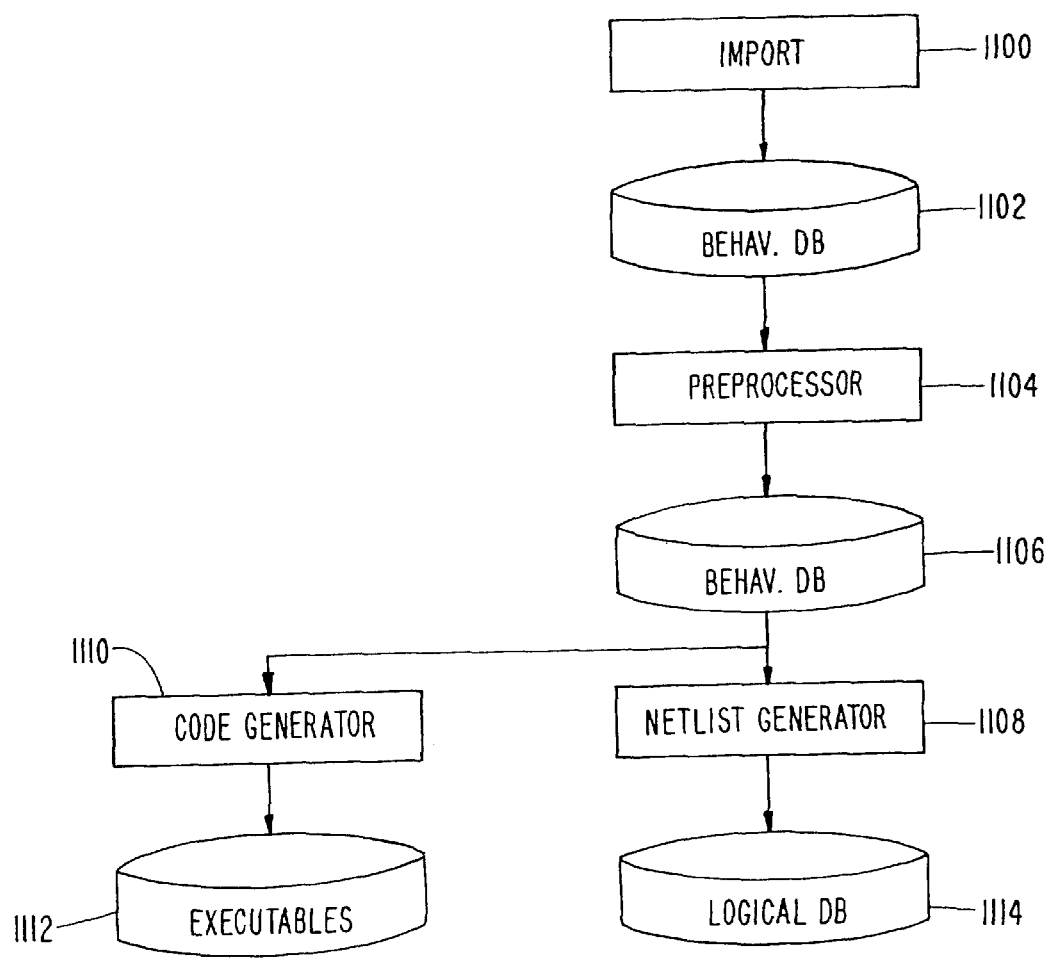
FIG. 22 is a flow diagram showing the sequence of steps necessary for the compilation of a software-hardware model created by a behavioral testbench compiler according to a preferred embodiment of the present invention.

Referring to FIG. 22, the sequence of steps necessary for the compilation of a software-hardware model created by behavioral testbench compiler 1004 is shown. Compilation starts from the user's source code in Verilog or VHDL. As a result of an import process 1100, the behavioral database representation 1102 is created. After model compilation is finished, it results in a logic representation of an emulation model 1114 and a set of executables 1112 downloadable into logic module processor DRAMs 226 previously shown on FIG. 20.

The behavioral testbench compiler software 1004 includes four executables and a runtime support library.

The importer 1100 processes the user's Verilog or VHDL source files and produces a behavioral database library 1102. It accepts a list of source file names and locations and file names for libraries where the otherwise undefined module references are resolved. The source file names are the file names used by Verilog or VHDL.

The preprocessor 1104 transforms the behavioral database library 1102 created by importer 1100 into a new behavioral database library 1106. It performs partitioning of the behavioral code into clusters (also referred to as partitions) directed for an execution on each of the available processors 206 (see FIG. 11) and determines the execution order of the code fragments, and the locality of variables in the partitions. Code fragments are independent pieces of code which can be executed in parallel on processors 206. Also, the preprocessor does all the transformations necessary for creation of hold time violation free model. See, for example, U.S. Pat. No. 5,259,006 to Price et al, the disclosure of which is hereby incorporated by reference in its entirety.

The code generator 1110 reads the behavioral database library 1106 as transformed by the preprocessor 1104 and produces downloadable executables for each of the clusters identified by the preprocessor 1104. These executables will be downloaded into DRAMs 226 for execution on processors 206.

Figure 23:
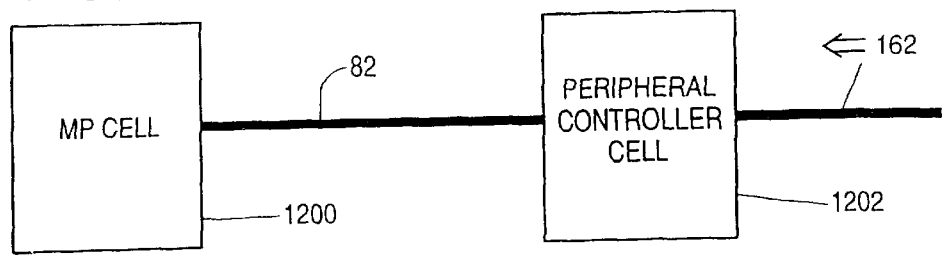
FIG. 23 is a block diagram of a netlist structure created to represent special connections of the co-simulation logic to a microprocessor event synchronization bus according to a preferred embodiment of the present invention.
Figure 24A:
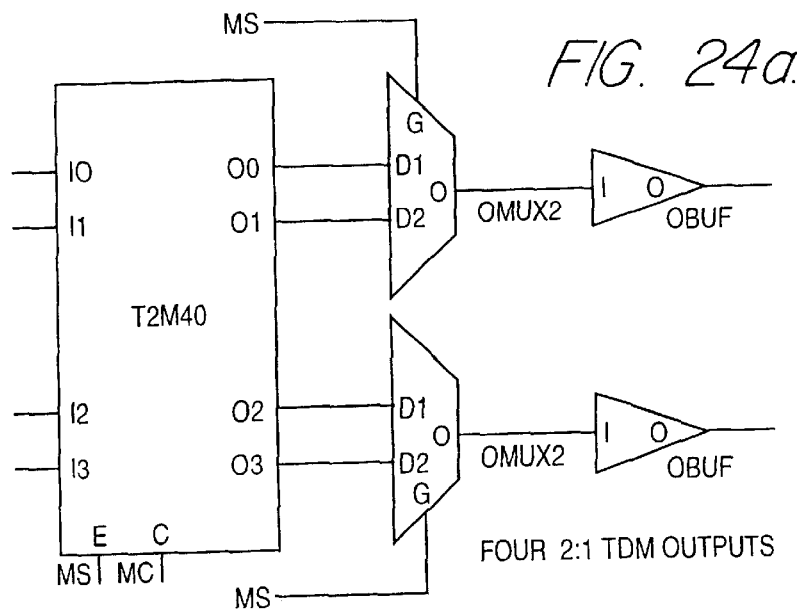
FIG. 24a is a schematic diagram of a time-division-multiplexing cell which may be inserted depending on the type of the I/O pins of a logic chip in a preferred embodiment of the present invention.
Figure 24B:
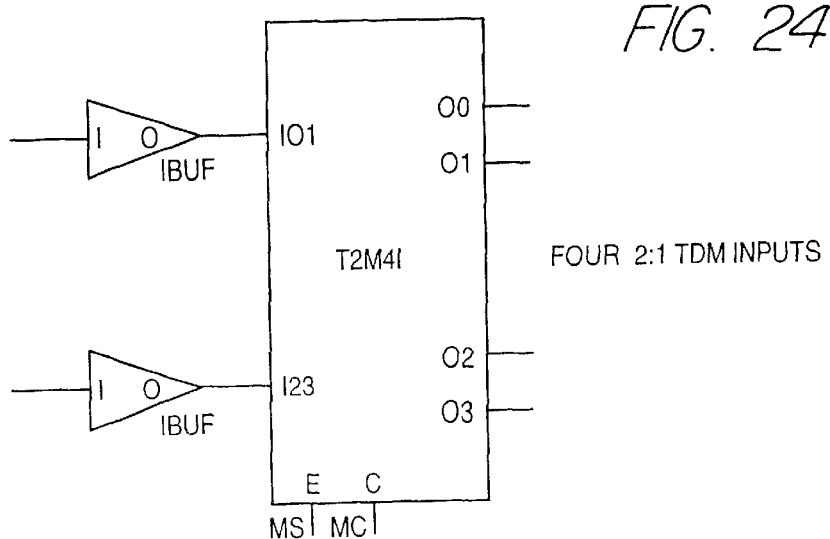
FIG. 24b is a schematic diagram of a time-division-multiplexing cell which may be inserted depending on the type of the I/O pins of a logic chip in a preferred embodiment of the present invention.
Figure 24C:
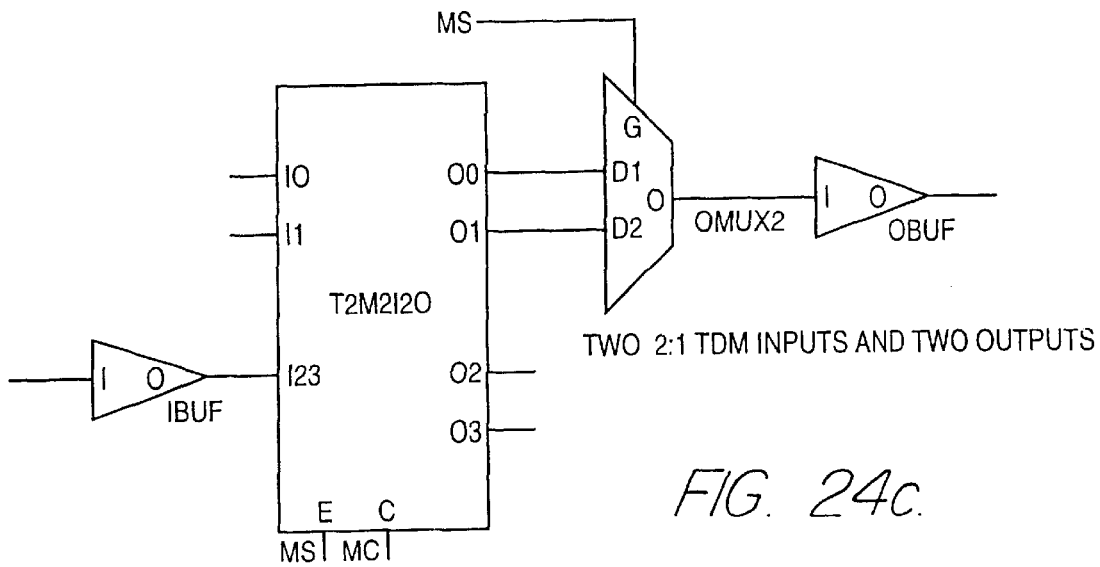
FIG. 24c is a schematic diagram of a time-division-multiplexing cell which may be inserted depending on the type of the I/O pins of a logic chip in a preferred embodiment of the present invention.
Figure 24D:
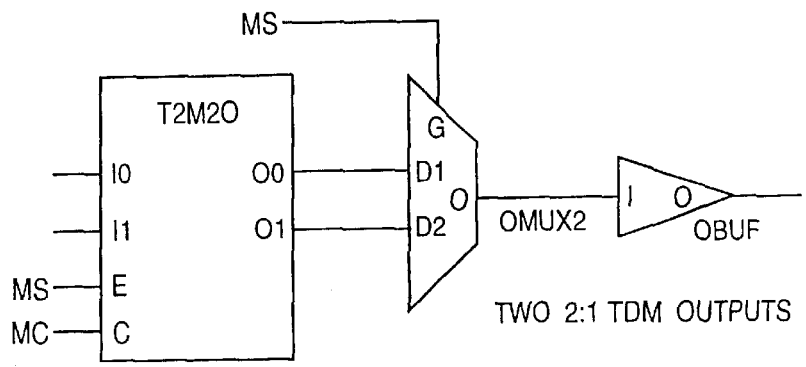
FIG. 24d is a schematic diagram of a time-division-multiplexing cell which may be inserted depending on the type of the I/O pins of a logic chip in a preferred embodiment of the present invention.
Figure 24E:
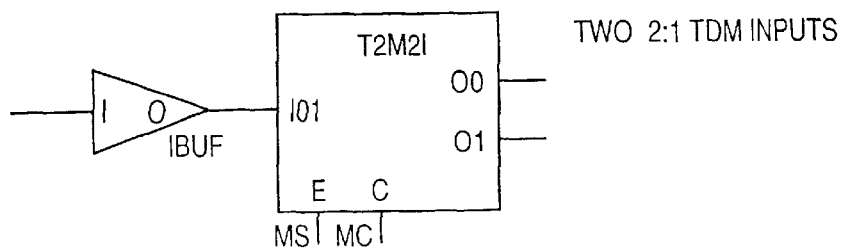
FIG. 24e is a schematic diagram of a time-division-multiplexing cell which may be inserted depending on the type of the I/O pins of a logic chip in a preferred embodiment of the present invention.
Figure 24F:
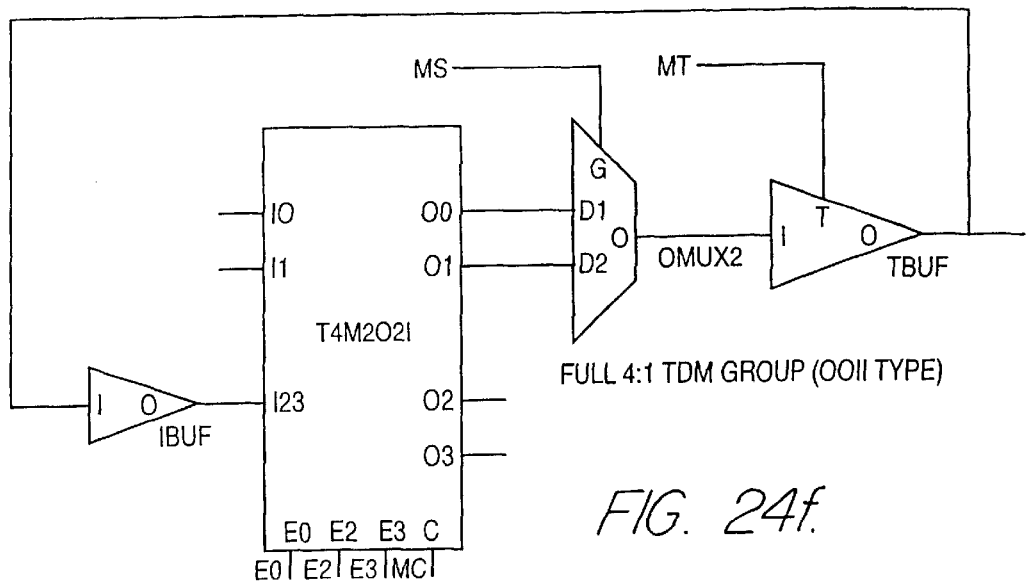
FIG. 24f is a schematic diagram of a time-division-multiplexing cell which may be inserted depending on the type of the I/O pins of a logic chip in a preferred embodiment of the present invention.
Figure 24G:
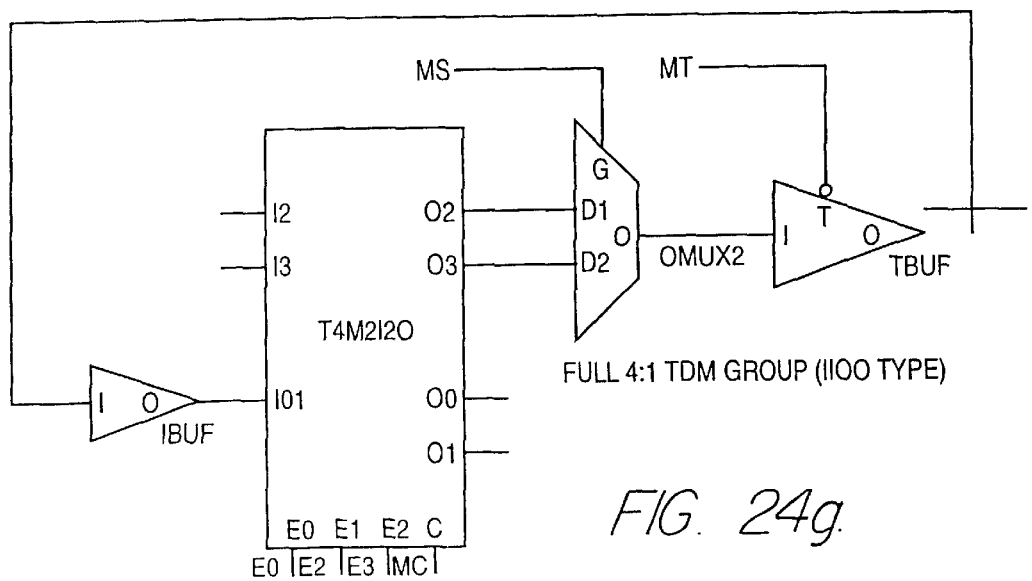
FIG. 24g is a schematic diagram of a time-division-multiplexing cell which may be inserted depending on the type of the I/O pins of a logic chip in a preferred embodiment of the present invention.
Figure 24H:
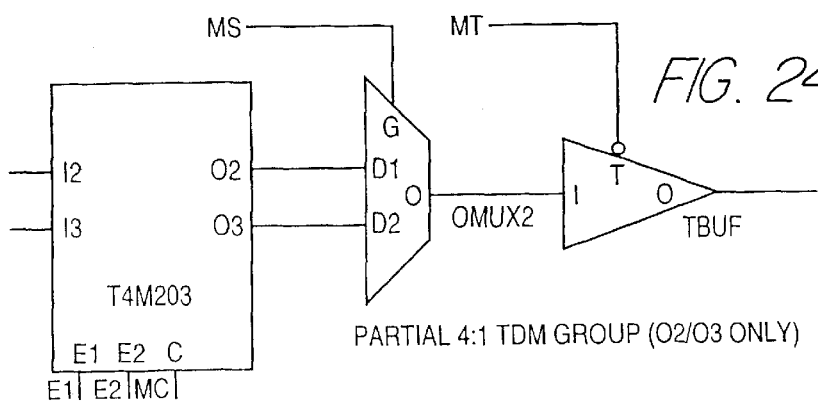
FIG. 24h is a schematic diagram of a time-division-multiplexing cell which may be inserted depending on the type of the I/O pins of a logic chip in a preferred embodiment of the present invention.
Figure 24I:
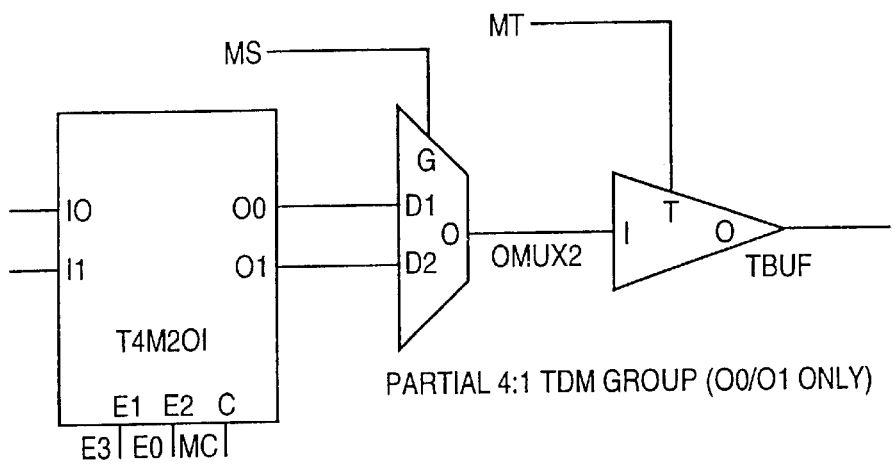
FIG. 24i is a schematic diagram of a time-division-multiplexing cell which may be inserted depending on the type of the I/O pins of a logic chip in a preferred embodiment of the present invention.
Figure 24J:
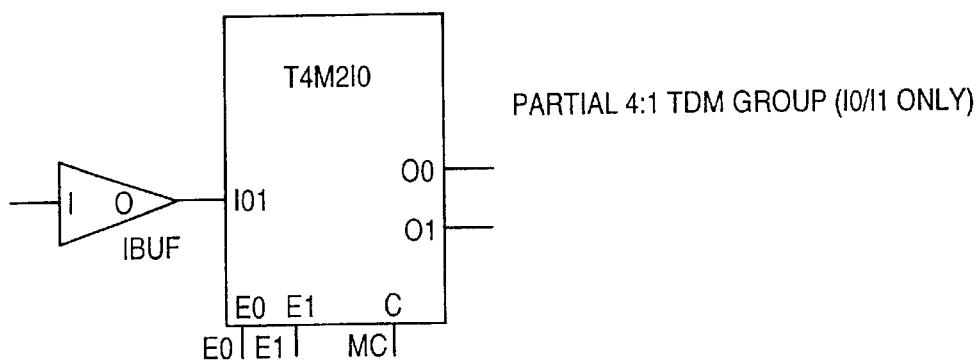
FIG. 24j is a schematic diagram of a time-division-multiplexing cell which may be inserted depending on the type of the I/O pins of a logic chip in a preferred embodiment of the present invention.
Figure 24K:
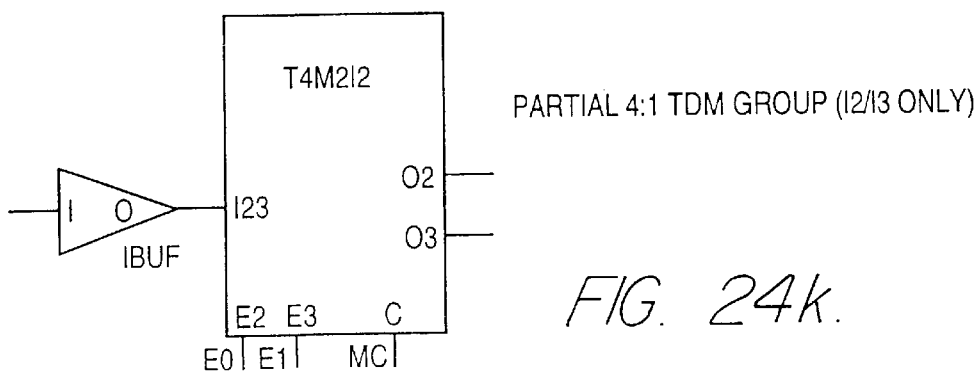
FIG. 24k is a schematic diagram of a time-division-multiplexing cell which may be inserted depending on the type of the I/O pins of a logic chip in a preferred embodiment of the present invention.

The netlist generator 1108 reads the behavioral database library as transformed by the preprocessor 1104 and produces a logical database library 1114 for further processing by the other compiler programs 1006–1036. To represent special connections of the co-simulation logic chip 204 to the microprocessor bus and event synchronization bus (see FIG. 11), the netlist generator 1108 will create the netlist structure shown in FIG. 23. MP Cell 1200 is a special cell corresponding to processor 206 which will not be clustered by chip partitioning program 1018 (similar to the LBM cell instances). Peripheral controller cell 1202 is a regular cell that contains library component instances and will be placed into co-simulation logic chip 204. Only a minimal amount of logic will be placed into this cell 1202 that directly interacts with the microprocessor bus. Placing minimal amounts of logic into the peripheral controller cell 1202 prevents the need for wait state programming. Peripheral controller cell 1202 will be flagged to prevent chip partitioning program 1018 from splitting it among several logic chips 10. It is a responsibility of netlist generator 1108 to make sure that the capacity of this cell does not exceed the capacity of a single logic chip 204 and that the number of connections between this cell and the rest of the netlist does not exceed the number of connections between co-simulation logic chip 204 and Mux chips 12. As discussed previously, co-simulation logic chip 204 has three pins electrically communicating with each of fifty-four Mux chips 12. This means that one hundred sixty-two connections are available between the co-simulation logic chip 204 and the Mux chips (3*54=162) as shown in FIG. 11. Netlist generator 1108 will also mark special nets that connect to the MP cell 1200 with the corresponding pin numbers that will guide system router 1032 to generate correct physical connections for co-simulation logic chip 204. This is required because connections between processor 206 and co-simulation logic chip 204 are attached to specific pins of logic chip 204.

Behavioral testbench compiler 1004 has been fully disclosed in a co-pending application: Method And Apparatus For Design Verification Using Emulation And Simulation, Ser. No. 08/733,352 by Sample et al. which is incorporated herein by reference in its entirety.

Logic Chip Memory (LCM) generator 1006 implements shallow but highly ported memories using Xilinx relationally placed macros (rpms). It supports memories with up to fourteen write ports, any number of read ports, and one additional read-write port for debug access. It utilizes synchronous dual-port RAM primitives which are available as components of the logic chip 10.

Figure 22A:
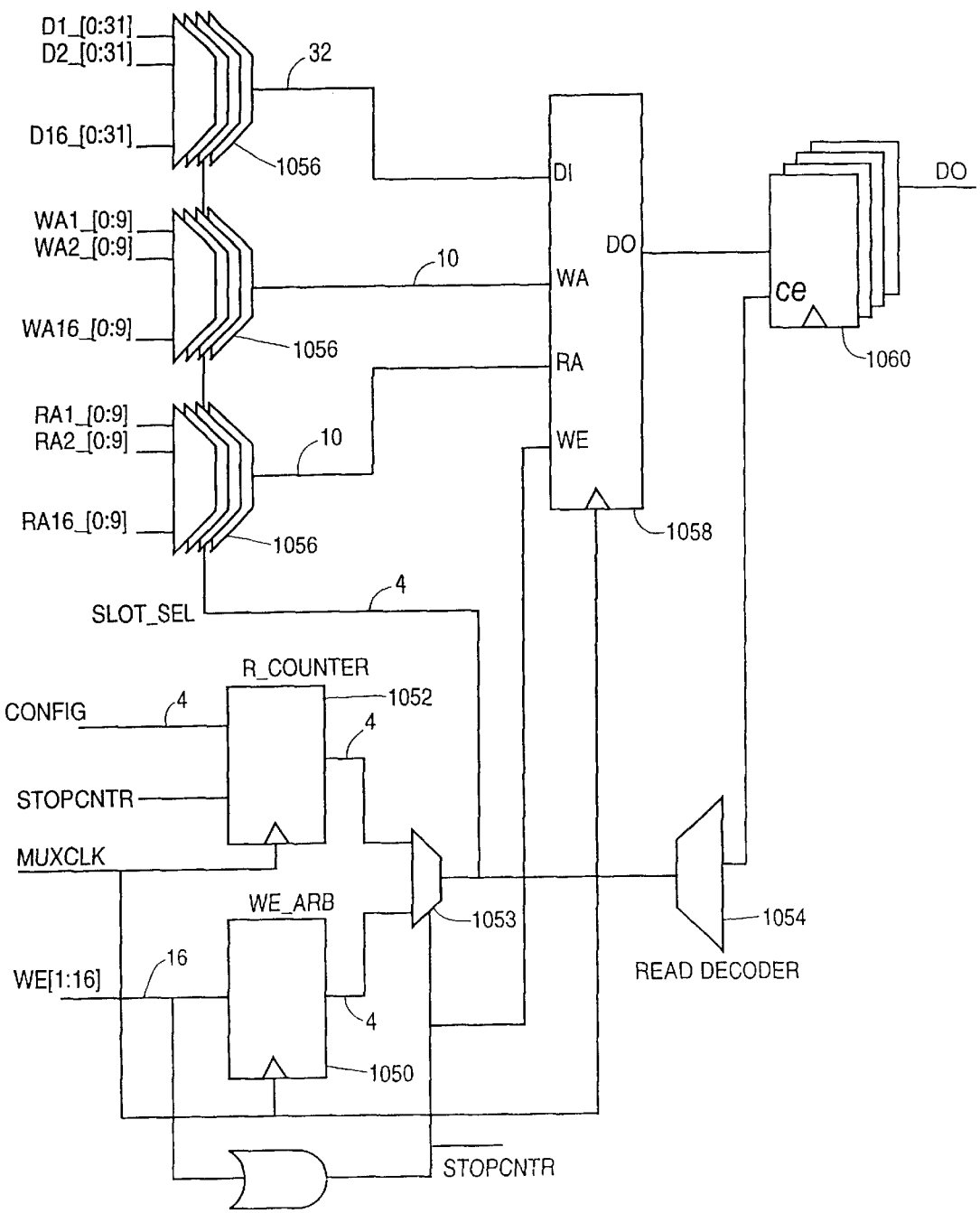
FIG. 22a is a block diagram showing an example of a memory circuit that could be generated by the LCM memory generator of a preferred embodiment of the present invention.

FIG. 22a shows an example of a memory circuit that could be generated by LCM memory, generator 1006 for placement in a logic chip 10. The memory circuit in FIG. 22a comprises the following components:

A write enable sampler and arbitrator 1050 synchronizes write enable signals with a fast clock and prioritizes the write operations of the memory circuit when there are requests from several ports at once. The write enable sampler and arbitrator 1050 outputs write address/data mux selects and write enable signals. Write enable sampler and arbitrator cells are pre-compiled into a reference library in the form of hard macros with various different write port configurations from two to sixteen write ports.

The memory circuit of FIG. 22a also comprises a read counter 1052. Read counter 1052 is used to cycle through the read ports of the memory to be implemented. These counters are also pre-compiled into a reference library as hard macro cells with various count lengths.

The memory circuit of FIG. 22a also comprises a multiplexer 1053 which places either the output of the read counter 1052 or the write enable sampler and arbitrator 1050 on its output. The output of multiplexer 1053 is the slot select signal SLOT_SEL, which comprises four wires allowing any one of sixteen slots (or ports) to be selected.

The memory circuit of FIG. 22a also comprises address muxes and data muxes 1056. Address muxes and data muxes 1056 are used to select port write/read address data and port write data when the appropriate slot or port time arrives. The slot select signal SLOT_SEL is input to the select inputs of the address muxes and data muxes 1056 to perform this function.

The memory circuit of FIG. 22a also comprises memory 1058. Memory 1058 is a static RAM memory available as a one or more Xilinx configurable logic block (CLB) components.

The memory circuit of FIG. 22a also comprises read slot decoder 1054. Read slot decoder 1054 decodes the slot select signal SLOT_SEL (of which there are four) into up to sixteen individual wires to be used as the clock enable inputs for the output registers 1060.

Referring back to FIG. 21, the width, depth and number of ports generated by LCM memory generation program 1006 depends on the requirements of the netlists produced by netlist import program 1000, HDL-ICE™ brand synthesizer program 1002 or Behavioral Testbench program 1004. The Xilinx relationally placed macros (RPMS) are created as a database cells defined using generic cell instances, as well as instances of special FMAP and HMAP cells to control the mapping of the memory circuits into the particular logic modules of the logic chips 10. FMAP and HMAP cells are special primitive components which control the behavior of the Xilinx PPR program 1022. As discussed, in the presently preferred embodiment, these are the CLBs in the Xilinx FPGAs. These instances can also have an RLOC property that specifies relative location of a logic module (a CLB in the presently preferred embodiment) where the logic is to be placed.

The RPM cells must be flagged (in the presently preferred embodiment, this flag is referred to as "NOFLAT") to prevent the chip partitioning program 1018 from splitting them between several logic chips. The RPM cells must also have precalculated capacity values and a property containing their dimensions (number of logic modules, e.g., CLBs, used horizontally and vertically).

Data qualification program 1010 does not verify the netlist inside RPM cells because parallel connection of FMAP and HMAP primitives to the logic primitives may create an appearance of design rule violation. The NGD Out program 1020 will preserve RLOC values in all primitives in each RPM instance. This will allow PPR 1022 to place RPMs in a chip in such a manner as to satisfy the constraints defined by RLOC properties.

User data input program 1008, in addition to allowing the user to enter clock and other design information, also computes the global probe multiplexing factor. Probes are the points inside a netlist which will be observed during debugging of the design. The probe multiplexing factor determines the length of scan chains which will be added to the logic chips 10. The user can either list the probes or request a full visibility mode. In the case of full visibility, the multiplexing factor is sixty-four. If the user wants only a specified list of signals to be visible, then the multiplexing factor should be computed as:

(Number of probes) * (Deviation factor)/(432 * (Number of logic boards))

The number of logic boards 200 must be known when the computation is made. Deviation factor is an experimentally determined factor used to account for possible non-uniform distribution of probed signals among logic boards 200. Probability theory considerations suggest a value between 1.4 for large systems and 1.7 for two-board systems. For a system with B boards it is approximately $1/(1-0.29\sqrt{B/(B-1)})$. This factor can be further increased to provide the room for adding probes incrementally without recompilation of more than one logic board 200.

Logic analyzer events in the preferred embodiment system are computed by the programmable logic in the logic chips 10 on logic boards 200. Therefore, capacity should be reserved in logic chips 10 for event calculations. Consequently, if the user delays signal and event definition until after the design compilation, the incremental recompile of affected chips will be necessary. In the case when the reserved capacity is insufficient for a given chip, signals will need to be routed to other logic chips 10 that have sufficient capacity to build an event detector, as previously shown in FIG. 20c. This can result in a longer compilation time. A long compilation time can be avoided by specifying all signals before compilation that are used to create any event. It is unnecessary to actually define events or triggers at this point because this has no effect on capacity. The event logic function itself can be downloaded into the logic chip 10 during its operation using the JTAG bus connected to controller 221 (shown in FIG. 20 and 20c).

Finally, during this user data input step 1008, the user needs to select the time-multiplexing factor for non-critical signals. As discussed above, the time-multiplexing factor can be either one, two, or four.

Chip partitioning programs 1016 and 1018 use a clustering based algorithm. Examples of similar algorithms can be seen in prior art hardware emulation systems such as the System Realizer™ emulation system from Quickturn Design Systems, Inc. In the presently preferred embodiment, however, there are a number of differences. These differences will now be explained in detail.

1) Certain types of cells need special attention to avoid improper partitioning, clustering, etc. "No-touch" cells are certain cells which must not be clustered together with any logic. An example of a "No-touch" cell is the MP cell shown in FIG. 23. "No-flat" cells are cells which must not be split among several chips. Examples of "No-flat" cells are latches and hard macros where splitting would introduce timing problems.

2) Some special nets do not have drivers and can be cut arbitrarily. In addition to POWER and GROUND, an example of such a special net to which logic gates can be connected is the Mux Clock signal (MUXCLK) 44. In particular, the behavioral testbench compiler 1004 and the EBM compiler 1030 and LCM compiler 1006 will create logic connected to MUXCLK.

3) Pin out constraints control the maximum number of nets that a cluster can have. Assuming that a cluster of logic has RI regular external input nets, RO regular external output nets, CN critical external nets, P probed signals, and the time-division multiplexing factor for probes is T, the number of pins required to implement this cluster on a chip is calculated as follows (all divide operations are pure integer divisions without rounding).

a. Without time-multiplexing of logic signals, the number of pins is

RI+RO+CN+(P+T−1)/T;

b. With two-to-one time-multiplexing of logic signals, the number of pins is (RI+1)/2+(RO+1)/2+CN+(P+T−1)/T c. With four-to-one time-multiplexing of logic signals, the number of pins is max((RI+1)/2, (RO+1)/2)+CN+(P+T−1)/T Note: when full visibility mode is selected by the user, the number of probes P is assumed equal to the number of flip/flops and latches.

4) The maximum size allowed for a cluster is based upon the gate capacity of the particular logic chip 10. In addition to logic gates, additional capacity is required for time-division multiplexing, probing and event detection circuitry. Assuming that a cluster of logic has RN regular (non-critical) external nets (RN is equal to RI plus RO), P probed signals, and E signals used in event detection then the added capacity for time-division multiplexing, probing, and event detection circuitry is as follows:

a. Without time-multiplexing of logic signals the additional capacity for logic analyzer is
   flip/flops: P+2*E+logE
   gates: $C_1*P+C_2*((E+1)/2)*8$
      In the presently preferred embodiment, the constants are $C_1=2$, $C_2=4$. They may be adjusted later based on experimental results.

b. with any type of time-multiplexing (2:1, 4:1, or other schemes), an additional RN flip/flops is needed in addition to those required for the logic analyzer.

5) Partitioning is also controlled by the need to implement the clock tree correctly as explained in U.S. Pat. No. 5,475,830. Each net in the design is assigned a 16-bit integer property which is called CLKMASK. Bit i of CLKMASK should be set if user clock i reaches this net in a direct (non-inverted) phase. Bit 8+i should be set if user clock i reaches this net in an inverted phase. This information will be passed to the PPR program 1022 to perform the required delay adjustment.

The NGD Out program 1020 outputs a netlist in a format suitable for the PPR program 1022 to process. In addition, it performs a number of special functions relating to logic modification to insert time-division multiplexing or debugging logic. These functions are:

Relationally placed (RP) macro preservation: Relationally placed macros in the database are preserved in the NGD files passed to PPR. RP macros are groups of logic gates that have been mapped into fixed patterns of CLBs inside the Xilinx FPGAs. RP macros will not be re-partitioned in later software steps so as to preserve their timing characteristics.

TDM cells insertion: Time-division-multiplexing cells are added to the boundary of each logic chip 10 where it connects to a Mux chip 12. Predefined cells are used which are placed relative to the set of I/O pins being multiplexed. FIGS. 24a–24k show all the different varieties of TDM cells which may be inserted depending on the type of the I/O pins. For time-division multiplexing, the terminals of a logic chip 10 and Mux chip 12 are divided into groups of four using the special RPM cells as shown in FIGS. 24a–24k. For the remainder of the terminals, groups of two are used, or the regular non-multiplexed already on the logic chip 10 or Mux chip 12 is used. Non-multiplexed I/O is always used for critical nets.

TDM control logic insertion: TDM control logic generates and distributes the TDM control signals, which are MC, MS, MT, E0, E1, E2, and E3, into the circuits shown in FIGS. 24a–24k. These signals are generated by one of three special control cells which are inserted into each logic chip 10 in addition to the logic shown in FIGS. 24a–24k. Generation of these signals is done using logic 104 shown in FIG. 6 or logic 68 shown in FIG. 3. MC is Mux Clock Signal 44; MS is Divided Clock Signal 50; MT is Direction Signal 80; and E0–E3 are the Enable Signals 90, 92, 94 and 96, respectively. The special cells have two inputs MUXCLK 44 and SYNC-48 which are connected to fixed input pins on logic chip 10. One type of control cell (not shown) is used for the chips that do not use TDM but have logic connected to Mux Clock Signal (MUXCLK) 44. This cell only outputs Mux Clock Signal (MUXCLK) 44. The second type (logic 68 shown in FIG. 3) is used for designs with two-to-one TDM. It outputs Mux Clock Signal (MUXCLK) 44 and MS (Divided Clock) signals 50. The third type of control cell (logic 104 shown in FIG. 6) is used for four-to-one time-multiplexing. It generates Mux Clock Signal (MUXCLK) 44, MS (Divided Clock) 50, MT (Direction) 80, E0 90, E1 92, E2 94, E3 96.

Scan cell insertion for probed signals: Each probed signal must be connected to the data input of a probe cell. The probe cell has no outputs and two other inputs. One of these inputs is electrically connected to Mux Clock Signal (MUXCLK) 44. The other input is electrically connected to the Trace Clock Signal 2002 coming from a chip input. Probe cells comprise a flip-flop 2004 and a multiplexer 2005, as seen in FIGS. 20b and 20c.

Generation of scan chain specification file: All instances of probe cells must be listed in a scan chain specification file. The scan outputs 2006 (see FIG. 20b) of the chip must also be listed. These outputs must are inserted into a database model of chip logic clusters so that the system router can see them and build appropriate connections. The number of outputs is (P+T−1)/T where P is the number of probe cells and T is a time-division multiplexing factor for probe signals.

Figure 25:
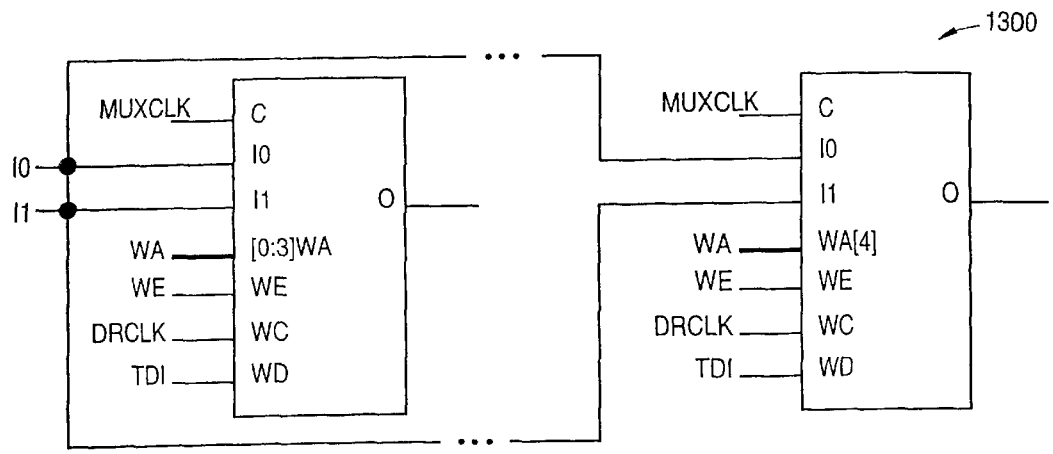
FIG. 25 is a block diagram of an event detection cell of a preferred embodiment of the present invention.

Insertion of event detection cells for signals contributing to events: The signals contributing to events are divided in pairs and each pair is connected to the I0 and I1 inputs of eight copies of an event detection cell 1300, as shown in FIG. 25. A preferred embodiment of an event detection cell has been previously shown in FIG. 20c. The event detection cell 1300 comprises four flip-flops 2010 and a CLB memory 2018. Four multiplexers 2020 and four output buffers 2022 are used to produce four multiplexed event signals 236 (also shown in FIGS. 20c and 20a). If the number of signals is odd, one of the inputs to each of the event detection cells is left unused for the corresponding eight cells.

Figure 26:
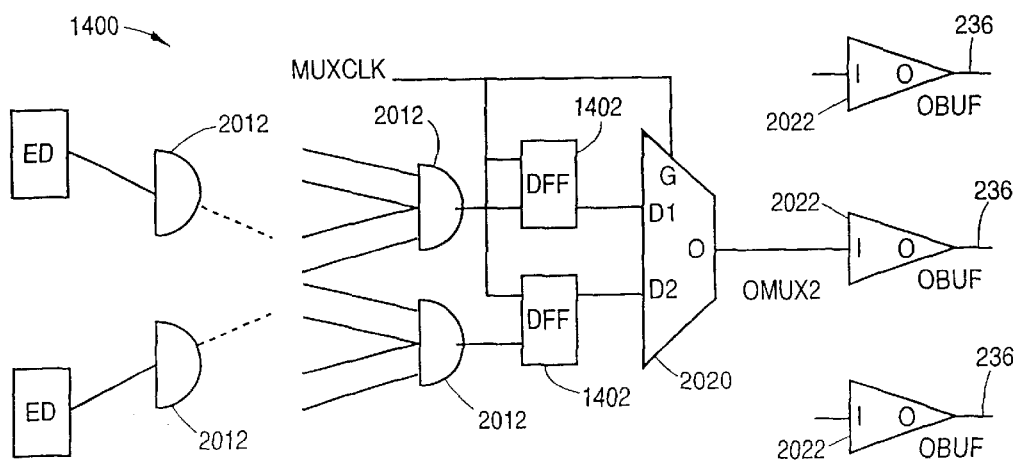
FIG. 26 is a schematic diagram showing how the outputs of AND trees are time-multiplexed pairwise using special event-multiplexing cells in accordance with an embodiment of the present invention.

Generation of eight balanced AND trees for event detector outputs, and the TDM logic to connect the eight AND trees' outputs to four dedicated event pins: The outputs of event detection cells 1300 are combined using eight balanced AND trees so that one copy of the eight cells created in the previous step is present in each of the trees. The outputs of the trees are time-multiplexed pairwise using special event-multiplexing cells as shows in FIG. 26. This circuitry has also been described in reference to FIG. 20c. AND gates 2012 are constructed using wide edge decoders 2012 as shown in FIG. 20c. FIG. 26 shows this circuitry in greater detail.

Figure 27:
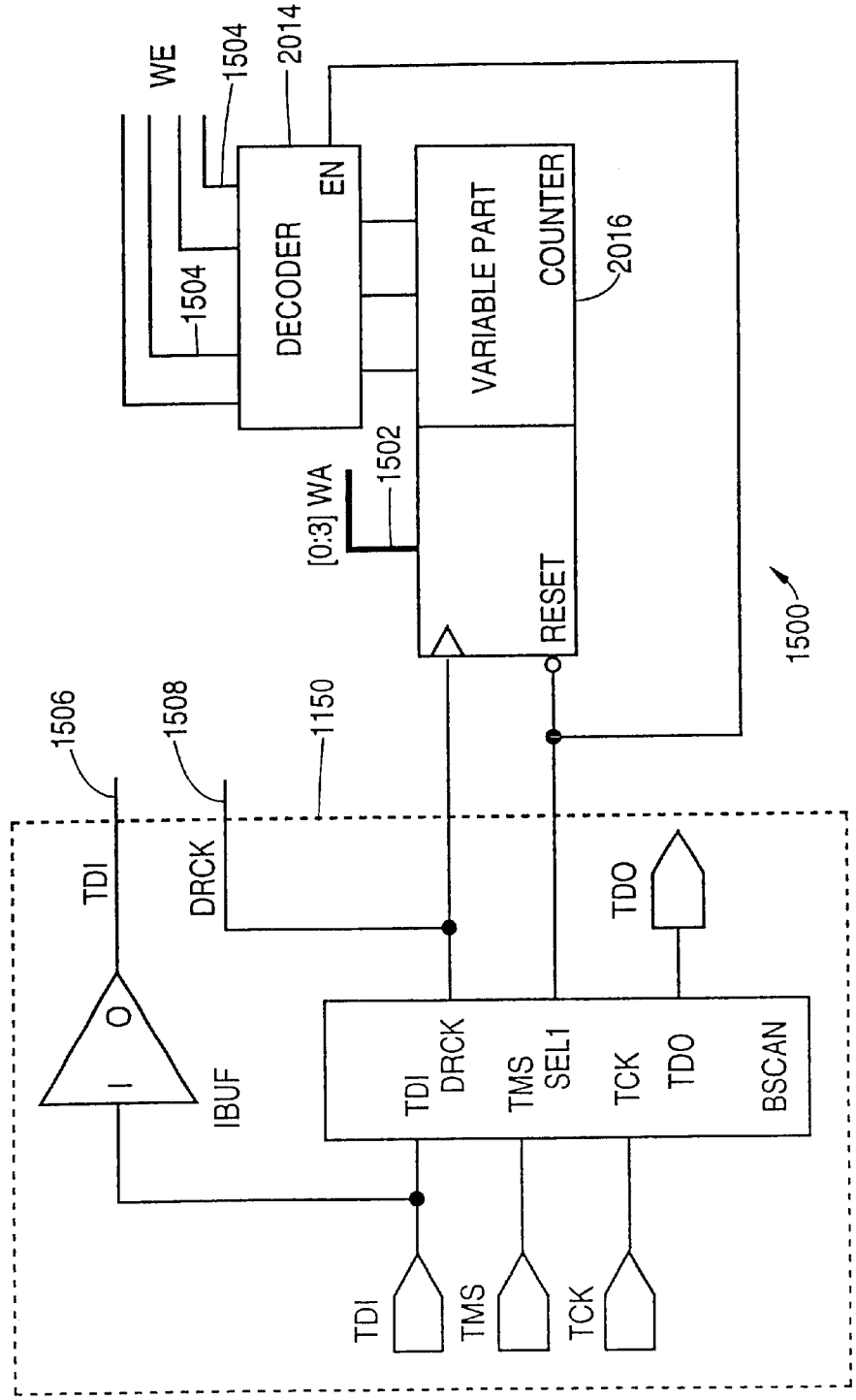
FIG. 27 is a block diagram of an event detector download circuit of a preferred embodiment of the present invention.

Generation of event detector download paths and a boundary scan controller: Event detector download circuit 1500 is shown in FIG. 27. It is comprised of a counter 2016 and shift register 2014, together with JTAG controller 1150. JTAG controller 1150 is available as a standard portion of the Xilinx logic chips 10. This circuitry is also shown together with the scan register and event detector in FIG. 20c. The event detector download circuit 1500 produces the WA 1502, WE 1504, DRCLK 1508, and TDI 1506 signals for all event detectors (also-shown in FIG. 20c). The event detector counter 2016 generates WA signals 1502 and a clock for shift register 2014, the length of which depends on the number of event decoder circuits. The circuit is shown in FIGS. 20c and 27. In a preferred embodiment, shift register 2014 is generated based on the number of event detectors. It is acceptable, however, to define a maximum number of event detectors per chip and fix the design of the shift register 2014. The PPR program 1022 will trim most of the unused logic.

Referring back to FIG. 21, board partitioning step 1024 will now be discussed. The function of board partitioning step 1024 is to find chip clusters (a cluster is a collection of interconnected components) with the largest possible number of chips not exceeding the number of logic chips 10, 204 on a single logic board 200 (thirty-seven chips) or a pair of logic boards (seventy-four chips), with the following limitations:

1. Total number of ingoing or outgoing nets should not exceed the sum of the I/O connections on two backplane connectors 220 for a pair of logic boards 200 as shown in FIG. 11 (3608 in the presently preferred embodiment) multiplied by a target backplane utilization coefficient. The target backplane utilization coefficient is determined experimentally, and depends on the success the system routing program 1032 is able, on average, to achieve. The target backplane utilization coefficient is expected to be approximately ninety percent.
2. The total number of chip outputs marked as logic analyzer channels should not exceed 864 (fifty-four Mux chips 12, multiplied by eight SGRAM 210 pins, the total of which is multiplied by two logic boards 200 in a module).
3. The full set of EBM memory instances should fit into no more than twenty-four chips (twelve for a half-size modules) (as described earlier with reference to FIG. 11, there are twelve RAMs 208 on a logic board 200 or twenty-four on a pair of logic boards) and the number of logic chips 10 required for EBM memories counts against the total of seventy-four (thirty-seven for a half-size module).
4. Total number of CPU cell instances (i.e., the number of CPU instances from the user's design) should not exceed two (one for a half-size modules) (as described with reference to FIG. 11, there is one processor 206 per logic board 200 or two on a pair of logic boards).
5. Two (one for a half-size module) of the seventy-four (thirty-seven for a half-size module) chips 204 can be used as clock generation logic chips or attached to the microprocessor cells. If microprocessor cells are present, there will be no clock generation logic chips and vice versa because the CoSim logic chip 204 can only be used for one function at a time. However, it is possible that there are neither. In such case, only seventy-two (thirty-six on a single logic board 200) full-capacity logic chips 10 can be used. The two additional CoSim logic chips 204 (one for a half-size module) can then be used to implement additional user logic if clusters with no more than one hundred sixty-two I/O pins are available (see FIG. 11).

After the appropriate clusters are identified, the full-size clusters are further subdivided into two emulation boards with no more than 1868 (the number of pins on turbo connector 202) inter-board connections. Each board must have no more than half of all critical cluster resources (1804 ingoing or outgoing nets, twelve EBM memories, one microprocessor or clock generation logic chip 204, four hundred thirty-two logic analyzer channels, thirty-seven logic chips 10, 204).

EBM compilation step 1030 creates the memory cell instances to be implemented as emulation block memories (EBM). These are created as special cells not to be included in any logic clusters during chip partitioning. An estimation subroutine evaluates how many EBM chips 208 (see FIG. 11) a given set of memory instances requires. This subroutine will be called from hierarchical partition planning program (HPP) 1014 (this connection is not shown in FIG. 21) and board partitioning program 1028 to properly designate a set of memory instances that can be implemented on one board, and the number of logic chips 10 that the memory control circuit will consume. After board partitioning process 1028 is complete, the EBM memory compiler 1030 will create a logic cluster associated with each RAM chip 208 on logic board 200. All lines leading to RAM chip 208 will be marked as being "critical" so that NGD Out program 1020 will not insert time-multiplexing logic into them. They also have properties containing their respective logic chip 10 pin numbers so that system router 1032 can generate correct I/O constraints. EBM logic clusters cannot contain probe signals and cannot generate events because they contain automatically generated logic not accessible to the user.

In a preferred embodiment, the EBM logic clusters are pre-compiled. This allows the placement and routing time to be saved for these clusters. EBM memory compiler 1030 has been for fully described in co-pending application Ser. No. 08/733,352.

System router 1032 assigns physical wires in the logic chips 10, 204, Mux chips 12, and logic boards 200 to the logic nets (or signals in an emulated design), pairs of logic nets (in two-to-one multiplexing) and the groups of four nets (in four-to-one multiplexing). Following that, it assigns the logic chip 10 pin and a time-division multiplexing (TDM) phase to each signal going in and out of each logic chip 10 and 204.

It is important when doing system routing to select the optimal route for time-multiplexed signals to minimize the signal delay. The algorithm for doing so is as follows:
1. Two-to-one time-division multiplexing (2-1 TDM):
   The optimal route switches TDM phases in each Mux chip 12 but not en route from the physical net source to the physical net destination. Examples of optimal routes are:
   alpha/output/even-beta/input/even-beta/output/odd-alpha/input/odd, or
   alpha/output/even-beta/input/even-beta/output/odd-muxbeta/input/odd-muxbeta/output/evenbeta/input/even-beta/output/odd-alpha/input/odd Alpha chips are equivalent to logic chips 10 or 204 and beta chips are equivalent to Mux chips 12 in this description. This gives a minimal one cycle delay between two logic chips 10 or 204. The delay may appear to be one-half of a cycle upon examining the logic in FIGS. 3 and 4. It is, in fact, one full cycle because a demultiplexer 34 in logic chips 10, 204 clocks signals close to the end of the half cycle so that the signal is steady in logic chips 10 or 204 on the next half cycle after it is received. If router 1032 fails to find an optimal route, meaning that an appropriate phase MUX output is not available, or an appropriate phase logic chip 10 or 204 input is not available, the signal loses an additional half cycle of delay. The router attempts not to accumulate the misses along the same net, if at all possible. Critical nets are not multiplexed in order to minimize their delay.

2. Four-to-one time-division multiplexing (4-1 TDM):
   Each physical net always includes one inout pin (IIOO sequence) and one outin pin (OOII sequence). Again, the optimal route switches one time-division multiplexing (TDM) phase in Mux chip 12 but not en route from a physical net source to a physical net destination Examples of optimal routes are:
   a alpha/OI/O1-beta/IO/I1-beta/OI/O2-alpha/IO/2alpha/OI/O2-beta/IOI2-beta/IO/O3-alpha/OI/I3alpha/OI/O1-beta/IO/I1-beta/OI/O2-muxbeta/IO/I2-muxbeta/IO/O3-beta/OI/I3-beta/IO/O4-alpha/OI/I4

This gives a minimal one-half cycle delay alpha-to-alpha. However, one-half cycle of four-to-one time-division multiplexing (4-1 TDM) has same duration as one cycle of two-to-one time-division multiplexing (2-1 TDM). Therefore, assuming all nets are optimally routed, no speed is lost in four-to-one time-division multiplexing (4-1 TDM) compared to two-to-one time-division multiplexing (2-1 TDM). However, misses (i.e., failure to find an optimal route, as discussed above) in four-to-one time-division multiplexing (4-1 TDM) routing have more severe consequences than in two-to-one time-division multiplexing (2-1 TDM) routing. For example, the path:
   alpha/OI/O1-beta/IO/I1-beta/OI/O1-alpha/IO/I1 will delay the signal by 1.25 four-to-one time-division multiplexing (4-1 TDM) cycles (or 2.5 two-to-one time-division multiplexing (2-1 TDM) cycles) which is two and one-half times worse than an optimal delay. In every hop through a Mux chip 12, router 1032 can miss by 0, 1/4, 1/2, or 3/4 of a four-to-one time-division multiplexing (TDM) cycle depending on what input-output pair the router selects. Router 1032 makes every attempt to miss as little as possible. Thus, critical nets should not be multiplexed to minimize their delay.

Some logic chips 10 or 204 have input/output nets locked to specific pins. Examples are Mux Clock signals (MUXCLK) 44, Trace Clock Signals 2002, connections between co-simulation logic chip 204 and a processor 206 (see FIG. 11), connections between memory controller logic chips 10 and RAM chips 208, event signal outputs 236, etc. These connections do not need to be routed but have to be included into logic chip 10, 204 pin constraints data.

Additional programming is also required for a clock distribution circuit (Mux chip 12) on control module 600 (shown in FIG. 19). This is a part of a clock circuit used to select no more than eight user clocks reaching each of the logic modules.

NGD update program 1034 supplies final parallel partition, place and route (PPR) software 1036 with the information about the actual pin I/O assignments produced by system router 1032. For non-time-multiplexed designs this is just an assignment of signals to I/O pads. For time-multiplexed designs, TDM logic on the periphery of logic chips 10, 204 and Mux chips 12 is also added.

Final parallel partition, place and route (PPR) program 1036 reruns the PPR program in an incremental mode to reroute the I/O pins at the periphery of the chip. As stated earlier, the PPR program is available from Xilinx Corporation. The rerouting changes logic chip 10, 204 configuration files previously produced at preliminary PPR step 1022 and fixes the Pin out as determined by system routing step 1032.

Thus, a preferred method and apparatus for emulating, verifying and analyzing an integrated circuit has been described. While embodiments and applications of this invention have been shown and described, as would be apparent to those skilled in the art, many more embodiments and applications are possible without departing from the inventive concepts disclosed herein. The invention, therefore is not to be restricted except in the spirit of the appended claims.

We claim:

1. An electrically reconfigurable logic assembly for use in an electrically reconfigurable hardware emulation system which can be configured with a circuit design in response to the input of circuit information, said electrically reconfigurable logic assembly comprising:
   a plurality of reprogrammable logic devices disposed on a printed circuit board, each of said reprogrammable logic devices having logic elements capable of implementing combinatorial logic elements and sequential logic elements, said reprogrammable logic devices also comprising an input demultiplexer and an output multiplexer implemented at at least one input/output terminal, said input demultiplexer receiving a time-multiplexed signal and dividing said time-multiplexed signal into one or more internal signals, said output multiplexer combining one or more internal signals onto a first single physical interconnection, said reprogrammable logic devices further comprising a first clock divider, said clock divider receiving a multiplexing clock signal;

a plurality of reprogrammable interconnect devices disposed on said printed circuit board, said plurality of reprogrammable interconnect devices comprising an input demultiplexer and an output multiplexer implemented at at least one input/output terminal of said plurality of reprogrammable interconnect devices, said input demultiplexer receiving a time-multiplexed input signal and dividing it into one or more component signals, said output multiplexer combining said one or more component signals or other component signals onto a second single physical interconnection, each of said plurality of reprogrammable interconnect devices comprising configurable interconnect circuitry which places said input demultiplexers in electrical communication with said output multiplexers, said reprogrammable interconnect devices further comprising a second clock divider, said clock divider receiving said multiplexing clock signal; and a set of fixed electrical conductors of said printed circuit board connecting said programmable input/output terminals on said reprogrammable logic devices to said input/output terminals on said reprogrammable interconnect devices such that each of said reprogrammable interconnect devices is connected to at least one but not all of said programmable input/output terminals on each of said reprogrammable logic devices.

2. An electrically reconfigurable logic assembly as recited in claim 1, wherein said reprogrammable logic devices comprise programmable gate arrays.

3. An electrically reconfigurable logic assembly as recited in claim 1, wherein said reprogrammable logic devices comprise field programmable gate arrays.

4. An electrically reconfigurable logic assembly as recited in claim 1 wherein said reprogrammable interconnect devices comprise field programmable gate arrays.

5. An electrically reconfigurable logic assembly as recited in claim 1, wherein said reprogrammable interconnect devices comprise an integrated circuit having an array of crosspoint switches fabricated thereon.

6. An electrically reconfigurable logic assembly as recited in claim 1 wherein said input demultiplexer of said plurality of reprogrammable logic devices comprises at least two sequential logic elements.

7. An electrically reconfigurable logic assembly as recited in claim 6 wherein said at least two sequential logic elements comprise flip-flops.

8. An electrically reconfigurable logic assembly as recited in claim 6 wherein said at least two sequential logic elements are clocked by said multiplexing clock signal.

9. An electrically reconfigurable logic assembly as recited in claim 1 wherein said output multiplexer of said plurality of reprogrammable logic devices comprises at least two sequential logic elements wherein respective outputs of each of said at least two sequential logic elements are input to a multiplexer.

10. An electrically reconfigurable logic assembly as recited in claim 9 wherein said at least two sequential logic elements comprise flip-flops, each of said flip-flops having a data input, an enable input, a clock input and an output.

11. An electrically reconfigurable logic assembly as recited in claim 10 wherein said clock input of each of said flip-flops receive said multiplexing clock signal, wherein said enable input of each of said flip-flops receive an output of said first clock divider.

12. An electrically reconfigurable logic assembly as recited in claim 1 wherein said input demultiplexer of said plurality of reprogrammable interconnect devices comprises at least two sequential logic elements.

13. An electrically reconfigurable logic assembly as recited in claim 12 wherein said at least two sequential logic elements comprise flip-flops.

14. An electrically reconfigurable logic assembly as recited in claim 13 wherein said at least two sequential logic elements are clocked by said an output of said second clock divider.

15. An electrically reconfigurable logic assembly as recited in claim 1 wherein said output multiplexer of said plurality of reprogrammable logic devices comprises a multiplexer, said multiplexer comprising at least two inputs and a select input.

16. An electrically reconfigurable logic assembly as recited in claim 15 wherein said select input of said multiplexer receives an output of said second clock divider.

17. An electrically reconfigurable logic assembly as recited in claim 1 wherein said multiplexing clock signal is asynchronous to other signals within said plurality of reprogrammable logic devices and said plurality of reprogrammable interconnect devices.

18. An electrically reconfigurable logic assembly as recited in claim 1 wherein said input demultiplexer and said output multiplexer implemented at said at least one input/output terminal is programmed into said plurality of reprogrammable logic devices.

19. An electrically reconfigurable logic assembly as recited in claim 1 wherein said input demultiplexer and said output multiplexer implemented at said at least one input/output terminal is fabricated into said plurality of reprogrammable logic devices.

20. An electrically reconfigurable logic assembly as recited in claim 1 wherein said input demultiplexer and said output multiplexer implemented at said at least one input/output terminal is programmed into said plurality of reprogrammable interconnect devices.

21. An electrically reconfigurable logic assembly as recited in claim 1 wherein said input demultiplexer and said output multiplexer implemented at said at least one input/output terminal is fabricated into said plurality of reprogrammable interconnect devices.

22. An electrically reconfigurable logic assembly for use in an electrically reconfigurable hardware emulation system having a user's circuit design implemented therein, said electrically reconfigurable logic assembly comprising:

a plurality of reprogrammable logic devices installed on a printed circuit board, each of said reprogrammable logic devices having internal circuitry which can be reprogrammably configured to provide at least combinatorial logic elements and sequential logic elements, said reprogrammable logic devices also comprising an input demultiplexer and an output multiplexer implemented at at least one input/output terminal, said input demultiplexer receiving a time-multiplexed signal and dividing said time-multiplexed signal into one or more internal signals, said output multiplexer combining one or more internal signals onto a first single physical interconnection, said reprogrammable logic devices further comprising a first clock divider, said clock divider receiving a multiplexing clock signal;

a plurality of reprogrammable interconnect devices disposed on said printed circuit board, said plurality of reprogrammable interconnect devices comprising an input demultiplexer and an output multiplexer implemented at at least one input/output terminal of said plurality of reprogrammable interconnect devices, said input demultiplexer receiving a time-multiplexed input signal and dividing it into one or more component signals, said output multiplexer combining said one or more component signals or other component signals onto a second single physical interconnection, each of said plurality of reprogrammable interconnect devices comprising configurable interconnect circuitry which places said input demultiplexers in electrical communication with said output multiplexers, said reprogrammable interconnect devices further comprising a second clock divider; said clock divider receiving said multiplexing clock signal; and a set of fixed electrical conductors of said printed circuit board, said set of fixed electrical conductors interconnecting said reprogrammable logic devices to said reprogrammable interconnect devices with a partial crossbar architecture.

23. An electrically reconfigurable logic assembly as recited in claim 22, wherein said reprogrammable logic devices comprise programmable gate arrays.

24. An electrically reconfigurable logic assembly as recited in claim 22, wherein said reprogrammable logic devices comprise field programmable gate arrays.

25. An electrically reconfigurable logic assembly as recited in claim 22 wherein said reprogrammable interconnect devices comprise programmable gate arrays.

26. An electrically reconfigurable logic assembly as recited in claim 22, wherein said reprogrammable interconnect devices comprise field programmable gate arrays.

27. An electrically reconfigurable logic assembly as recited in claim 22, wherein said reprogrammable interconnect devices comprise an integrated circuit having an array of crosspoint switches fabricated thereon.

28. An electrically reconfigurable logic assembly as recited in claim 22 wherein said input demultiplexer of said plurality of reprogrammable logic devices comprises at least two sequential logic elements.

29. An electrically reconfigurable logic assembly as recited in claim 28 wherein said at least two sequential logic elements comprise flip-flops.

30. An electrically reconfigurable logic assembly as recited in claim 28 wherein said at least two sequential logic elements are clocked by said multiplexing clock signal.

31. An electrically reconfigurable logic assembly as recited in claim 22 wherein said output multiplexer of said plurality of reprogrammable logic devices comprises at least two sequential logic elements wherein respective outputs of each of said at least two sequential logic elements are input to a multiplexer.

32. An electrically reconfigurable logic assembly as recited in claim 31 wherein said at least two sequential logic elements comprise flip-flops, each of said flip-flops having a data input, an enable input, a clock input and an output.

33. An electrically reconfigurable logic assembly as recited in claim 32 wherein said clock input of each of said flip-flops receive said multiplexing clock signal, wherein said enable input of each of said flip-flops receive an output of said first clock divider.

34. An electrically reconfigurable logic assembly as recited in claim 22 wherein said input demultiplexer of said plurality of reprogrammable interconnect devices comprises at least two sequential logic elements.

35. An electrically reconfigurable logic assembly as recited in claim 34 wherein said at least two sequential logic elements comprise flip-flops.

36. An electrically reconfigurable logic assembly as recited in claim 35 wherein said at least two sequential logic elements are clocked by said an output of said second clock divider.

37. An electrically reconfigurable logic assembly as recited in claim 22 wherein said output multiplexer of said plurality of reprogrammable logic devices comprises a multiplexer, said multiplexer comprising at least two inputs and a select input.

38. An electrically reconfigurable logic assembly as recited in claim 37 wherein said select input of said multiplexer receives an output of said second clock divider.

39. An electrically reconfigurable logic assembly as recited in claim 22 wherein said multiplexing clock signal is asynchronous to other signals within said plurality of reprogrammable interconnect devices and said plurality of reprogrammable interconnect devices.

40. An electrically reconfigurable logic assembly as recited in claim 22 wherein said input/output pins on each of said plurality of reprogrammable logic devices are divided into N subsets, were N is an integer.

41. An electrically reconfigurable logic assembly as recited in claim 40 wherein said plurality of reprogrammable interconnect devices comprises N reprogrammable interconnect devices.

42. An electrically reconfigurable logic assembly as recited in claim 22 wherein said input demultiplexer and said output multiplexer implemented at said at least one input/output terminal is programmed into said plurality of reprogrammable logic devices.

43. An electrically reconfigurable logic assembly as recited in claim 22 wherein said input demultiplexer and said output multiplexer implemented at said at least one input/output terminal is fabricated into said plurality of reprogrammable logic devices.

44. An electrically reconfigurable logic assembly as recited in claim 22 wherein said input demultiplexer and said output multiplexer implemented at said at least one input/output terminal is programmed into said plurality of reprogrammable interconnect devices.

45. An electrically reconfigurable logic assembly as recited in claim 22 wherein said input demultiplexer and said output multiplexer implemented at said at least one input/output terminal is fabricated into said plurality of reprogrammable interconnect devices.

* * * * *